United States Patent
Santarone et al.

(10) Patent No.: US 10,620,084 B2
(45) Date of Patent: Apr. 14, 2020

(54) SYSTEM FOR HIERARCHICAL ACTIONS BASED UPON MONITORED BUILDING CONDITIONS

(71) Applicant: Stellar VDC Residential, LLC, Jacksonville, FL (US)

(72) Inventors: Michael S. Santarone, Jacksonville, FL (US); Jason E. Duff, Jacksonville, FL (US); Michael Wodrich, Jacksonville, FL (US)

(73) Assignee: Middle Chart, LLC, Jacksonville, FL (US)

( * ) Notice: Subject to any disclaimer, the term of this patent is extended or adjusted under 35 U.S.C. 154(b) by 0 days.

(21) Appl. No.: 16/171,593

(22) Filed: Oct. 26, 2018

(65) Prior Publication Data
US 2019/0128771 A1 May 2, 2019

Related U.S. Application Data

(63) Continuation-in-part of application No. 15/887,637, filed on Feb. 2, 2018, which is a continuation-in-part (Continued)

(51) Int. Cl.
*G01M 5/00* (2006.01)
*G06F 17/50* (2006.01)
(Continued)

(52) U.S. Cl.
CPC ............ *G01M 5/0066* (2013.01); *G01M 5/00* (2013.01); *G02B 27/017* (2013.01);
(Continued)

(58) Field of Classification Search
CPC .............. G01M 5/0066; G06F 17/5004; G06F 17/5009; G06Q 50/163; G06Q 50/08
See application file for complete search history.

(56) References Cited

U.S. PATENT DOCUMENTS

| | | | |
|---|---|---|---|
| 5,884,202 | A | 3/1999 | Arjomand |
| 5,933,479 | A | 8/1999 | Michael et al. |

(Continued)

FOREIGN PATENT DOCUMENTS

| | | | |
|---|---|---|---|
| CN | 102147597 A | * | 8/2011 |
| EP | 2726817 B1 | | 9/2018 |

(Continued)

OTHER PUBLICATIONS

Carmelo Scuro et al., IoT for Structural Health Monitoring, Dec. 2018, IEEE Instrumentation & Measurement Magazine, pp. 4-14.*
(Continued)

*Primary Examiner* — Mischita L Henson
(74) *Attorney, Agent, or Firm* — Joseph P. Kincart; Rogers Towers, P.A.

(57) ABSTRACT

Method and apparatus for measuring conditions within a structure to generate objective data indicative of an overall status of the structure. Aggregated objective measurements may quantify as built and experiential conditions of the structure over time. Utilizing objective measurements a determination is made of, among other things, compliance with applicable building codes. A remediation table is provided to assess the risk of noncompliance with the applicable building codes and to prescribe appropriate remedial actions. Alternatively a table of scaled alphanumeric ratings may be generated and associated with measured conditions within the structure.

14 Claims, 38 Drawing Sheets

Related U.S. Application Data of application No. 15/716,133, filed on Sep. 26, 2017, now Pat. No. 10,025,887, application No. 16/171,593, which is a continuation-in-part of application No. 16/161,823, filed on Oct. 16, 2018, now Pat. No. 10,467,353, and a continuation-in-part of application No. 16/142,275, filed on Sep. 26, 2018, now Pat. No. 10,433,112, and a continuation-in-part of application No. 16/165,517, filed on Oct. 19, 2018, and a continuation-in-part of application No. 15/703,310, filed on Sep. 13, 2017.

(60) Provisional application No. 62/462,347, filed on Feb. 22, 2017, provisional application No. 62/531,955, filed on Jul. 13, 2017, provisional application No. 62/531,975, filed on Jul. 13, 2017, provisional application No. 62/712,714, filed on Jul. 31, 2018.

(51) Int. Cl.
  *G02B 27/01* (2006.01)
  *G02B 27/00* (2006.01)

(52) U.S. Cl.
  CPC ...... *G06F 17/5004* (2013.01); *G02B 27/0093* (2013.01); *G02B 2027/0141* (2013.01); *G02B 2027/0187* (2013.01)

(56) References Cited

U.S. PATENT DOCUMENTS

| | | | |
|---|---|---|---|
| 6,006,021 A | 12/1999 | Tognazzini | |
| 6,292,108 B1 | 9/2001 | Straser et al. | |
| 6,321,158 B1 | 11/2001 | DeLorme et al. | |
| 6,853,958 B1 | 2/2005 | Turin et al. | |
| 7,994,981 B1 | 8/2011 | Farrokhi et al. | |
| 8,843,350 B2 | 9/2014 | Jacobi et al. | |
| 8,996,156 B2 | 3/2015 | Melzer-Jokisch et al. | |
| 9,008,979 B2 | 4/2015 | Miura | |
| 9,064,219 B2 | 6/2015 | Hall et al. | |
| 9,342,928 B2 | 5/2016 | Rasane et al. | |
| 9,703,517 B2 | 7/2017 | Andolina | |
| 9,772,396 B2 | 9/2017 | Liao et al. | |
| 9,934,335 B2 * | 4/2018 | Pettersson | G06F 17/5004 |
| 10,042,341 B1 * | 8/2018 | Jacob | G06Q 40/08 |
| 10,054,914 B2 | 8/2018 | Vartiainen et al. | |
| 10,222,301 B2 | 3/2019 | Silva et al. | |
| 2002/0095269 A1 | 7/2002 | Natalini et al. | |
| 2002/0181405 A1 | 12/2002 | Ying | |
| 2003/0110001 A1 | 6/2003 | Chassin et al. | |
| 2003/0163440 A1 | 8/2003 | Tonack | |
| 2004/0002786 A1 | 1/2004 | Sasaki | |
| 2004/0119662 A1 | 6/2004 | Dempski | |
| 2004/0122628 A1 | 6/2004 | Laurie | |
| 2005/0165576 A1 | 7/2005 | Jesmonth | |
| 2005/0208951 A1 | 9/2005 | Annunziato et al. | |
| 2005/0275525 A1 | 12/2005 | Ahmed | |
| 2006/0028345 A1 | 2/2006 | Lee | |
| 2007/0296571 A1 | 12/2007 | Kolen | |
| 2008/0103835 A1 * | 5/2008 | Corcoran | G06Q 10/0637 705/4 |
| 2008/0319654 A1 | 12/2008 | Shintani et al. | |
| 2009/0097710 A1 | 4/2009 | Sroka et al. | |
| 2009/0189810 A1 | 7/2009 | Murray | |
| 2010/0271263 A1 | 10/2010 | Moshfeghi | |
| 2010/0296075 A1 | 11/2010 | Hinderling et al. | |
| 2011/0047516 A1 | 2/2011 | Pavan et al. | |
| 2011/0153101 A1 | 6/2011 | Thomas et al. | |
| 2012/0087212 A1 | 4/2012 | Vartanian et al. | |
| 2012/0188847 A1 | 7/2012 | Miyamoto et al. | |
| 2012/0204646 A1 * | 8/2012 | Lee | G01M 5/0066 73/594 |
| 2012/0214507 A1 | 8/2012 | Vartanian et al. | |
| 2012/0296610 A1 | 11/2012 | Hailemariam et al. | |
| 2013/0010103 A1 | 1/2013 | Ihara et al. | |
| 2013/0073059 A1 | 3/2013 | Brian et al. | |
| 2013/0197685 A1 | 8/2013 | Matsunaga et al. | |
| 2013/0201311 A1 | 8/2013 | Hirakawa | |
| 2013/0288719 A1 | 10/2013 | Alonzo | |
| 2013/0297555 A1 | 11/2013 | Fadell et al. | |
| 2014/0084909 A1 | 3/2014 | Pagani | |
| 2014/0107828 A1 | 4/2014 | Zhu et al. | |
| 2014/0156455 A1 | 6/2014 | Atwood et al. | |
| 2014/0188394 A1 | 7/2014 | Febonio et al. | |
| 2014/0244160 A1 | 8/2014 | Cragun et al. | |
| 2014/0266755 A1 | 9/2014 | Arensmeier et al. | |
| 2014/0274151 A1 | 9/2014 | Pattabiraman et al. | |
| 2014/0277594 A1 | 9/2014 | Nixon et al. | |
| 2014/0368373 A1 | 12/2014 | Crain et al. | |
| 2015/0005903 A1 | 1/2015 | Worek et al. | |
| 2015/0094865 A1 | 4/2015 | Choi et al. | |
| 2015/0116132 A1 | 4/2015 | Nohra et al. | |
| 2015/0121222 A1 | 4/2015 | Lacaze et al. | |
| 2015/0137967 A1 | 5/2015 | Wedig et al. | |
| 2015/0142179 A1 | 5/2015 | Ito et al. | |
| 2015/0177718 A1 | 6/2015 | Vartiainen et al. | |
| 2015/0207316 A1 | 7/2015 | Saussele et al. | |
| 2015/0227123 A1 | 8/2015 | Laycock et al. | |
| 2015/0294506 A1 | 10/2015 | Bare et al. | |
| 2015/0327010 A1 | 11/2015 | Gottschalk et al. | |
| 2015/0347854 A1 | 12/2015 | Bare et al. | |
| 2015/0356786 A1 | 12/2015 | Bare et al. | |
| 2015/0356789 A1 | 12/2015 | Komatsu et al. | |
| 2016/0019721 A1 | 1/2016 | Bare et al. | |
| 2016/0026253 A1 | 1/2016 | Bradski et al. | |
| 2016/0026729 A1 | 1/2016 | Gil et al. | |
| 2016/0069675 A1 | 3/2016 | Bando et al. | |
| 2016/0178383 A1 | 6/2016 | Mays et al. | |
| 2016/0216879 A1 | 7/2016 | Park et al. | |
| 2016/0238692 A1 | 8/2016 | Hill et al. | |
| 2016/0258760 A1 | 9/2016 | Beaumont et al. | |
| 2016/0284075 A1 | 9/2016 | Phan et al. | |
| 2016/0285416 A1 | 9/2016 | Tiwari et al. | |
| 2016/0323149 A1 | 11/2016 | Hu et al. | |
| 2016/0335731 A1 | 11/2016 | Hall | |
| 2016/0343093 A1 | 11/2016 | Riland et al. | |
| 2017/0055126 A1 | 2/2017 | O'Keeffe | |
| 2017/0079001 A1 | 3/2017 | Lewis | |
| 2017/0131426 A1 | 5/2017 | Sgarz et al. | |
| 2017/0200312 A1 | 7/2017 | Smith et al. | |
| 2017/0234962 A1 | 8/2017 | Yang et al. | |
| 2017/0237892 A1 | 8/2017 | Sakai | |
| 2017/0286568 A1 | 10/2017 | Dean et al. | |
| 2017/0363504 A1 | 12/2017 | Winant et al. | |
| 2018/0048693 A1 | 2/2018 | Gulbinas et al. | |
| 2018/0075168 A1 | 3/2018 | Tiwari et al. | |
| 2018/0101803 A1 | 4/2018 | Tiwari et al. | |
| 2018/0102858 A1 | 4/2018 | Tiwari et al. | |
| 2018/0130260 A1 | 5/2018 | Schmirler et al. | |
| 2018/0131907 A1 | 5/2018 | Schmirler et al. | |
| 2018/0159904 A1 | 6/2018 | Hu et al. | |
| 2018/0285482 A1 | 10/2018 | Santos et al. | |
| 2018/0374269 A1 | 12/2018 | Smith | |
| 2019/0096232 A1 | 3/2019 | Wedig et al. | |

FOREIGN PATENT DOCUMENTS

| | | |
|---|---|---|
| GB | 2498177 A | 7/2013 |
| WO | 2008124713 A2 | 10/2008 |
| WO | 2011019810 A1 | 2/2011 |
| WO | 2014204753 A1 | 12/2014 |
| WO | 2016130571 A1 | 8/2016 |
| WO | 2016192916 A1 | 12/2016 |
| WO | 2017149526 A2 | 9/2017 |
| WO | 2017223008 A1 | 12/2017 |

OTHER PUBLICATIONS

Khemapech et al., Bridge Structural Monitoring and Warning System Aplication in Thailand—Experiences Learned, 2017, TRON Forum ISBN 978-4-89362-330-0, pp. 1-8.*

(56) References Cited

OTHER PUBLICATIONS

Hu. Wi-Fi Based Indoor Positioning System Using Smartphones. Nov. 2013. [retrieved on Apr. 23, 2018]. Retrieved [from the Internet: (91 pages total).
International Search Report and Written Opinion dated May 14, 2018 issued in connection with corresponding International Application No. PCT/US2018/019154 (10 pages total).
International Search Report and Written Opinion dated May 7, 2018 issued in connection with corresponding [International Application No. PCT/US2018/019185 (7 pages total).
Kyle, "Property Management" Dearborn Real Estate, 2000—Business & Economics, pp. 40-41.
Wang et al. Performance Evaluation of Automatically Generated BIM from Laser Scanner Data for Sustainability Analyses. 2015. [retrieved on Apr. 23, 2018]. Retrieved from the Internet: . (8 pages total).
"Wireless Indoor Localization Systems and Techniques: Survey and Comparative Study" Indonesian Journal of Electrical Engineering and Computer Science, vol. 3, No. 2, Aug. 2016, pp. 392-409 (Year: 2016).
Dong et ai, "Evaluation of the Reliability of RSSI for Indoor localization", 2012, pp. 6. downloaded from the internet https://ieeexplore.ieee.org/documentl6402492 (Year: 2012).

\* cited by examiner

SPECIFY DEPLOYMENT ASPECTS FOR A COMMERCIAL STRUCTURE IN A VIRTUAL MODEL
401

DESIGN A COMMERCIAL STRUCTURE FOR DEPLOYMENT ON A REAL ESTATE PARCEL WITH PHYSICAL GEOLOCATION
402

MODEL PERFORMANCE ASPECTS OF ONE OR MORE MACHINES CAPABLE OF PREFORMING A PROCESS WITHIN THE COMMERCIAL STRUCTURE
403

MODEL THROUGHPUT OF ONE OR MORE PROCESSING STEPS TO BE COMPLETED WITHIN THE COMMERCIAL STRUCTURE
404

RECORD AS BUILT ASPECTS OF THE STRUCTURE AS DIGITAL RECORDS
405

IDENTIFY THE COMMERCIAL STRUCTURE VIA A PHYSICAL LOCATION
406

POSITION WITHIN THE COMMERCIAL STRUCTURE VIA POSITIONING IDENTIFIERS INCORPORATED INTO THE COMMERCIAL STRUCTURE
407

ACCESS THE VIRTUAL MODEL OF AN ASPECT OF THE AS BUILT COMMERCIAL STRUCTURE BASED UPON THE POSITION WITHIN THE STRUCTURE AND A DIRECTION, HEIGHT AND ANGLE OF VIEW
408

PERFORM AN UPDATE TO THE AS BUILT COMMERCIAL STRUCTURE
409

RECORD AND REPRESENT THE UPDATE IN THE VIRTUAL COMMERCIAL MODEL
410

FIG. 4A

```
┌─────────────────────────────────────────────────────────────────────┐
│ POSITIONING MACHINE CAPABLE OF PERFORMING A PROCESS IN A COMMERCIAL │
│                        STRUCTURE                              421   │
└─────────────────────────────────────────────────────────────────────┘
                                  │
┌─────────────────────────────────────────────────────────────────────┐
│        ASSOCIATING A UNIQUE IDENTIFIER WITH THE MACHINE       422   │
└─────────────────────────────────────────────────────────────────────┘
                                  │
┌─────────────────────────────────────────────────────────────────────┐
│ INTERFACING WITH A MODEL SYSTEM TO ADD THE UNIQUE ID FOR THE MACHINE│
│                       TO THE MODEL                            423   │
└─────────────────────────────────────────────────────────────────────┘
                                  │
┌─────────────────────────────────────────────────────────────────────┐
│          REGISTERING THE MACHINE AS INSTALLED INTO THE MODEL        │
│                                                               424   │
└─────────────────────────────────────────────────────────────────────┘
                                  │
┌─────────────────────────────────────────────────────────────────────┐
│  ACTIVATE AN OPERATIONAL MONITOR TO RECORD ONE OR MORE CONDITIONS OF│
│              THE MACHINE WHILE OPERATIONAL                    425   │
└─────────────────────────────────────────────────────────────────────┘
                                  │
┌─────────────────────────────────────────────────────────────────────┐
│     TRANSFERRING OPERATIONAL DATA FROM THE MONITOR TO THE AVM MODEL │
│                                                               426   │
└─────────────────────────────────────────────────────────────────────┘
                                  │
┌─────────────────────────────────────────────────────────────────────┐
│   GENERATING AN IMPROVEMENT POTENTIAL BASED ON RECORDATION OF THE   │
│                       OPERATIONAL DATA                              │
│                                                               427   │
└─────────────────────────────────────────────────────────────────────┘
                                  │
┌─────────────────────────────────────────────────────────────────────┐
│   QUERYING THE OPERATIONAL DATA FOR WARRANTY INFORMATION ON THE MACHINE │
│                                                               428   │
└─────────────────────────────────────────────────────────────────────┘
                                  │
┌─────────────────────────────────────────────────────────────────────┐
│   ORDERING A SERVICE PART AND SCHEDULING A SERVICING VISIT BY THE   │
│         COMMERCIAL STRUCTURE MODELLING CONTROLLER                   │
│                                                               429   │
└─────────────────────────────────────────────────────────────────────┘
```

FIG. 4C

```
┌─────────────────────────────────────────────────────────────────────────┐
│ GENERATE AN AVM MODEL OF A PROCESSING FACILITY WITH MACHINERY, EQUIPMENT│
│                            AND LAYOUT                                   │
│                                                                    801  │
└─────────────────────────────────────────────────────────────────────────┘
                                    │
┌─────────────────────────────────────────────────────────────────────────┐
│ RECEIVE INTO THE AVM ONE OR BOTH OF SENSOR DATA AND USER INPUT DATA     │
│ INDICATIVE OF ONE OR MORE OF PRODUCTION, YIELDS, CONSUMMABLES, UTILITY  │
│            COSTS, MAINTENANCE AND REPLACEMENT COSTS                     │
│                                                                    802  │
└─────────────────────────────────────────────────────────────────────────┘
                                    │
┌─────────────────────────────────────────────────────────────────────────┐
│    AUTOMATE DATA CONNECTION BETWEEN DEPLOYED FACILITY AND THE AVM MODEL │
│                                                                    803  │
└─────────────────────────────────────────────────────────────────────────┘
                                    │
┌─────────────────────────────────────────────────────────────────────────┐
│           ACCESS HISTORICAL OF SAME AND/OR OTHER AVM MODELS             │
│                                                                    804  │
└─────────────────────────────────────────────────────────────────────────┘
                                    │
┌─────────────────────────────────────────────────────────────────────────┐
│ INTEGRATE RELEVANT INDICES, INCLUDING ONE OR MORE OF: GEOGRAPHIC        │
│ LOCATION, LABOR ORGANIZATION, MARKET CONDITIONS, LABOR COSTS, PHYSICAL  │
│              CONDITIONS, PROPERTY STATUS, ETC                           │
│                                                                    805  │
└─────────────────────────────────────────────────────────────────────────┘
                                    │
┌─────────────────────────────────────────────────────────────────────────┐
│                       BUILD AND DEPLOY COST                             │
│                                                                    806  │
└─────────────────────────────────────────────────────────────────────────┘
                                    │
┌─────────────────────────────────────────────────────────────────────────┐
│                    UTILITY AND CONSUMABLES COST                         │
│                                                                    807  │
└─────────────────────────────────────────────────────────────────────────┘
                                    │
┌─────────────────────────────────────────────────────────────────────────┐
│ PREDICTED AND ACTUAL QUANTIFICATIONS: ENERGY CONSUMPTION, PROCESS       │
│       THROUGHPUT, YIELD, QUALITY, RESOURCE REQUIREMENTS                 │
│                                                                    808  │
└─────────────────────────────────────────────────────────────────────────┘
```

FIG. 8

FIG. 10A
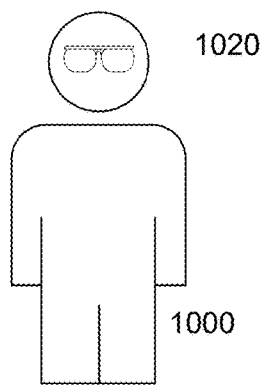
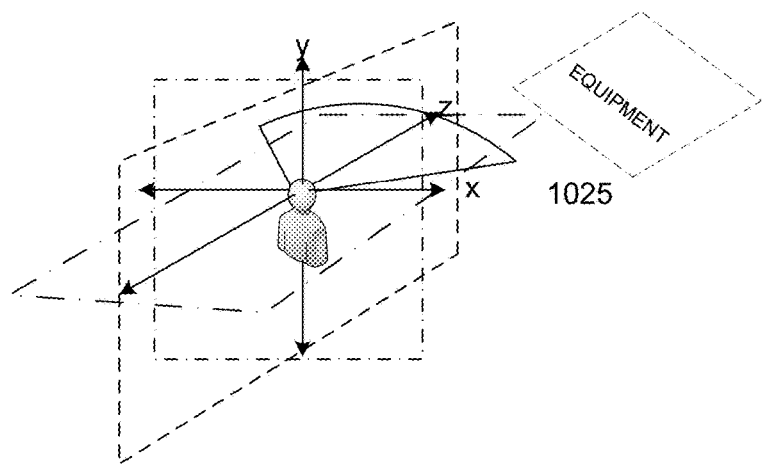
FIG. 10B
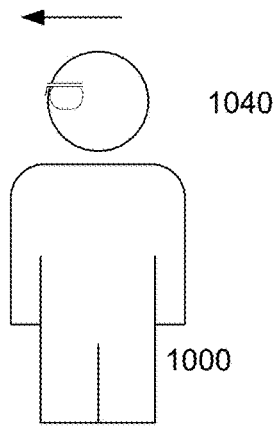
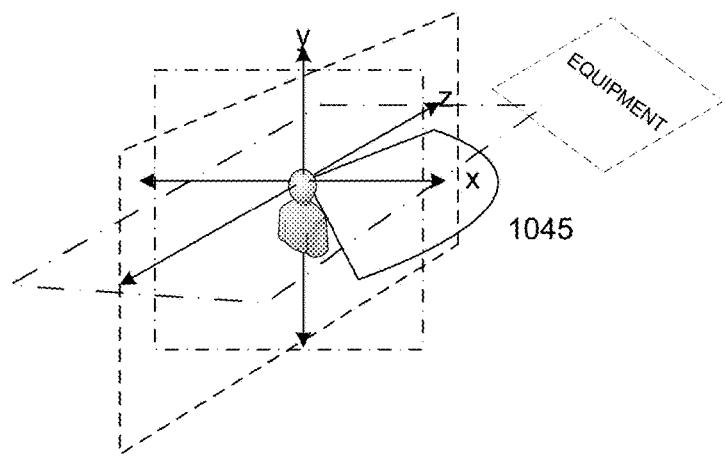
FIG. 10C
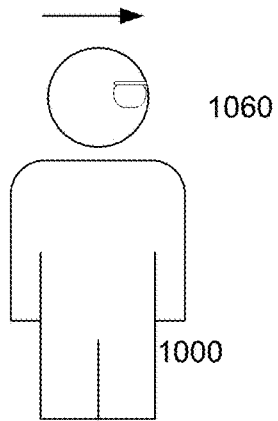
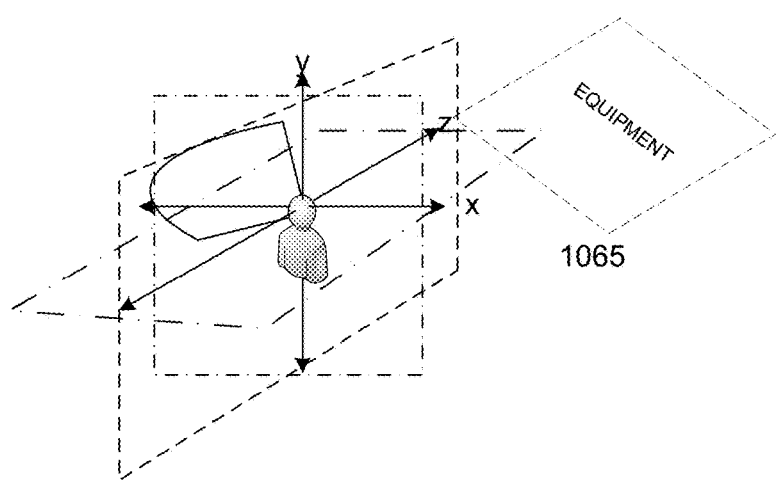

FIG. 11A
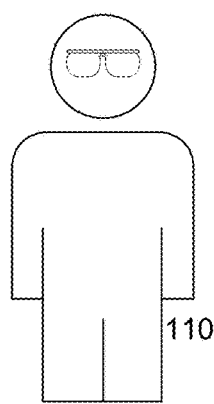
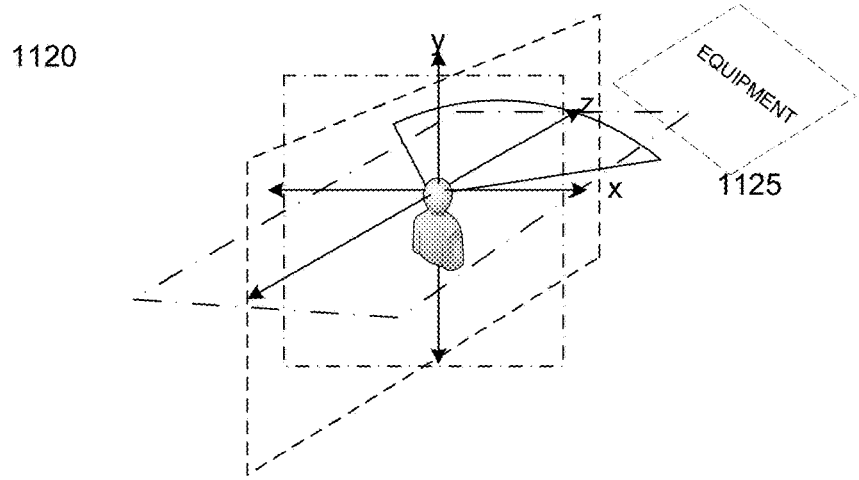
FIG. 11B
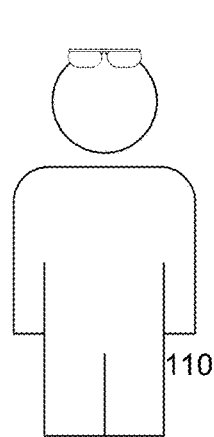
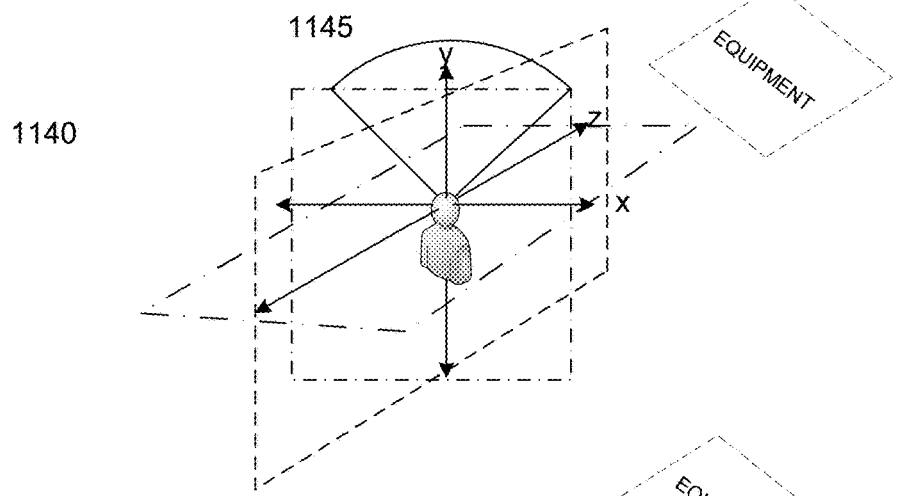
FIG. 11C
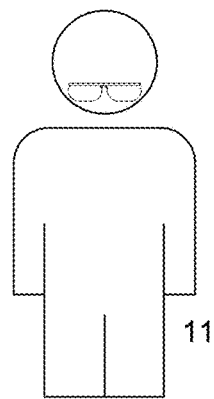
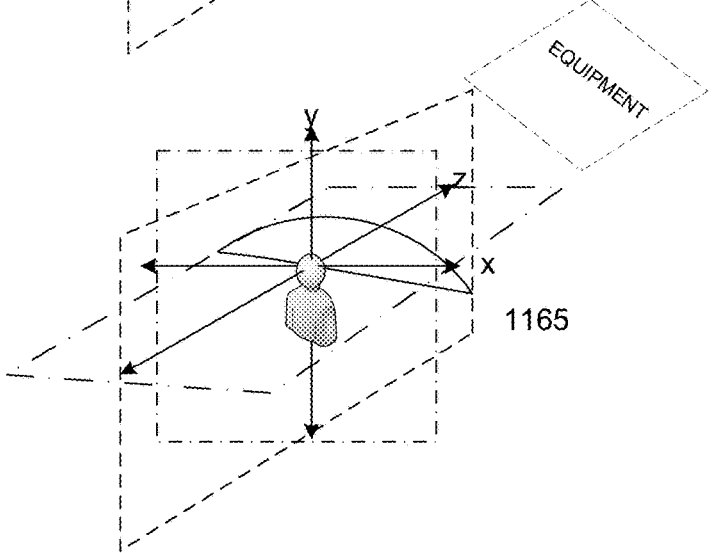

| |
|---|
| AFFIX WIRELESS TRANSCEIVERS TO REFERENCE POSITIONS WITHIN A STRUCTURE<br>1601 |
| DEPLOY MULTIPLE SENSORS TO RESPECTIVE POSITIONS WITHIN THE STRUCTURE<br>1602 |
| 1603      GENERATE POSITIONAL COORDINATES FOR EACH SENSOR |
| 1604      ACTIVATE THE SENSOR |
| GENERATE A FIRST TABLE COMPRISING CONDITIONS PRESENT IN THE STRUCTURE PRECEDENT TO DEPLOYMENT OF THE STRUCTURE<br>1605 |
| MEASURE VALUES OF MULTIPLE CONDITIONS WITHIN THE STRUCTURE<br>1606 |
| 1607      RECORD A TIME REGISTRATION |
| 1608      DETERMINE A PHYSICAL POSITION OF THE SENSOR |
| TRANSMIT THE DIGITAL SIGNAL DESCRIPTIVE OF THE CONDITION OF THE STRUCTURE<br>1609 |
| CORRELATE THE SIGNAL DESCRIPTIVE OF THE CONDITION PRESENT IN THE STRUCTURE WITH A PHYSICAL STATE OF THE STRUCTURE<br>1610 |
| ASSOCIATE RESPECTIVE SENSOR LOCATIONS WITH RESPECTIVE COORDINATES<br>1611 |
| COMPARE THE MEASURED VALUES OF CONDITIONS WITHIN THE STRUCTURE WITH THE CONDITIONS PRECEDENT TO DEPLOYMENT OF THE STRUCTURE<br>1612 |
| DETERMINE WHETHER CONDITIONS PRECEDENT TO DEPLOYMENT OF THE STRUCTURE ARE PRESENT WITHIN THE STRUCTURE AT A GIVEN TIME<br>1613 |
| TRANSMIT A POSSIBLE REASON THE CONDITION WITHIN THE STRUCTURE HAS NOT MET A CONDITION PRECEDENT TO DEPLOYMENT INCLUDED IN THE TABLE<br>1614 |

FIG. 16

```
┌─────────────────────────────────────────────────────────────────────────┐
│ GENERATE A FIRST TABLE COMPRISING AT LEAST ONE POSSIBLE ALPHANUMERIC    │
│ SCALED RATING TO ASSIGN TO THE STRUCTURE BASED UPON VALUES PERTAINING  │
│                    CONDITIONS WITHIN THE STRUCTURE                      │
│  1615                                                                   │
└─────────────────────────────────────────────────────────────────────────┘
                                    │
┌─────────────────────────────────────────────────────────────────────────┐
│   GENERATE A SECOND TABLE COMPRISING ACTUAL MEASURED VALUES OF THE      │
│         CONDITIONS WITHIN THE STRUCTURE AT A SPECIFIED TIME             │
│  1616                                                                   │
└─────────────────────────────────────────────────────────────────────────┘
                                    │
┌─────────────────────────────────────────────────────────────────────────┐
│    ASSOCIATE AN ALPHANUMERIC SCALED RATING FROM THE FIRST TABLE WITH    │
│           THE ACTUAL MEASURED VALUES FROM THE SECOND TABLE              │
│  1617                                                                   │
└─────────────────────────────────────────────────────────────────────────┘
                                    │
┌─────────────────────────────────────────────────────────────────────────┐
│ GENERATE AN AGGREGATE ALPHANUMERIC SCALED RATING FOR THE STRUCTURE      │
│    BASED UPON A WEIGHTED COMBINATION OF ALPHANUMERIC SCALED RATINGS     │
│  1618                                                                   │
└─────────────────────────────────────────────────────────────────────────┘
                                    │
┌─────────────────────────────────────────────────────────────────────────┐
│ GENERATE A COLLATERAL VALUE BASED UPON THE AGGREGATE ALPHANUMERIC       │
│                              SCALED RATING                              │
│  1619                                                                   │
└─────────────────────────────────────────────────────────────────────────┘
                                    │
┌─────────────────────────────────────────────────────────────────────────┐
│    GENERATE A VALUE OF AN INSURANCE AMOUNT BASED UPON THE AGGREGATE     │
│                       ALPHANUMERIC SCALED RATING                        │
│  1620                                                                   │
└─────────────────────────────────────────────────────────────────────────┘
                                    │
┌─────────────────────────────────────────────────────────────────────────┐
│   INCLUDE THE STRUCTURE IN A SECURITIZED POOL BASED UPON THE AGGREGATE  │
│                       ALPHANUMERIC SCALED RATING                        │
│  1621                                                                   │
└─────────────────────────────────────────────────────────────────────────┘
```

FIG. 16A

```
┌─────────────────────────────────────────────────────────────────────────┐
│  MEASURE INITIAL STATUS OF CONDITION OF A STRUCTURE WITH SENSORS AT     │
│              LOCATIONS SPECIFIED VIA X, Y, & Z COORDINATES              │
│  1622                                                                    │
└─────────────────────────────────────────────────────────────────────────┘
                                    │
┌─────────────────────────────────────────────────────────────────────────┐
│  SET BASE CONDITION FOR PROPERTY INCLUDING STRUCTURE BASED UPON SENSOR  │
│  MEASUREMENTS; RATE PROPERTY WITH ALPHANUMERIC RATING; WEIGHTED VALUES  │
│         AND DISQUALIFYING CONDITION BASED UPON MEASUREMENTS             │
│  1623                                                                    │
└─────────────────────────────────────────────────────────────────────────┘
                                    │
┌─────────────────────────────────────────────────────────────────────────┐
│         GENERATE VALUE OF PROPERTY BASED UPON SENSOR MEASUREMENTS       │
│  1624                                                                    │
└─────────────────────────────────────────────────────────────────────────┘
                                    │
┌─────────────────────────────────────────────────────────────────────────┐
│  GENERATE A COLLATERAL OBLIGATION CONTINGENT UPON VALUE OF PROPERTY     │
│                     BASED UPON SENSOR MEASUREMENTS                      │
│  1625                                                                    │
└─────────────────────────────────────────────────────────────────────────┘
                                    │
┌─────────────────────────────────────────────────────────────────────────┐
│  ENTER INTO CONTRACTUAL OBLIGATION BASED UPON VALUE OF PROPERTY BASED   │
│                UPON LOCATION-SPECIFIC SENSOR MEASUREMENTS               │
│  1626                                                                    │
└─────────────────────────────────────────────────────────────────────────┘
                                    │
┌─────────────────────────────────────────────────────────────────────────┐
│  1627     MONITOR ONGOING CONDITIONS VIA PERIODIC SENSOR MEASUREMENTS   │
└─────────────────────────────────────────────────────────────────────────┘
                                    │
┌─────────────────────────────────────────────────────────────────────────┐
│  1628             SET THRESHOLD STRUCTURE STATUS CONDITIONS             │
└─────────────────────────────────────────────────────────────────────────┘
                                    │
┌─────────────────────────────────────────────────────────────────────────┐
│   GENERATE ALERT BASED UPON CONDITION DETERMINED FROM PERIODIC          │
│                              MEASUREMENTS                                │
│  1629                                                                    │
└─────────────────────────────────────────────────────────────────────────┘
                                    │
┌─────────────────────────────────────────────────────────────────────────┐
│  1630            TRANSMITE ALERT VIA COMMUNICATIONS NETWORK             │
└─────────────────────────────────────────────────────────────────────────┘
                                    │
┌─────────────────────────────────────────────────────────────────────────┐
│  CHANGE COLLATERAL OBLIGATION BASED UPON CONDITION DETERMINED FROM      │
│                          PERIODIC MEASUREMENTS                          │
│  1631                                                                    │
└─────────────────────────────────────────────────────────────────────────┘
```

FIG. 16B

```
┌─────────────────────────────────────────────────────────────────────────┐
│   MEASURE INITIAL STATUS OF CONDITION OF A STRUCTURE WITH SENSORS AT LOCATIONS │
│                    SPECIFIED VIA X, Y, & Z COORDINATES                  │
│   1632                                                                  │
└─────────────────────────────────────────────────────────────────────────┘
                                      │
┌─────────────────────────────────────────────────────────────────────────┐
│  SET BASE CONDITION FOR PROPERTY INCLUDING STRUCTURE BASED UPON SENSOR  │
│  MEASUREMENTS; RATE PROPERTY WITH ALPHANUMERIC RATING; WEIGHTED VALUES AND │
│           DISQUALIFYING CONDITION BASED UPON MEASUREMENTS               │
│  1633                                                                   │
└─────────────────────────────────────────────────────────────────────────┘
                                      │
┌─────────────────────────────────────────────────────────────────────────┐
│        GENERATE VALUE OF PROPERTY BASED UPON SENSOR MEASUREMENTS        │
│  1634                                                                   │
└─────────────────────────────────────────────────────────────────────────┘
                                      │
┌─────────────────────────────────────────────────────────────────────────┐
│  GENERATE A COLLATERAL OBLIGATION CONTINGENT UPON VALUE OF PROPERTY BASED UPON │
│                          SENSOR MEASUREMENTS                            │
│  1635                                                                   │
└─────────────────────────────────────────────────────────────────────────┘
                                      │
┌─────────────────────────────────────────────────────────────────────────┐
│    GENERATE INSURANCE OBLIGATION BASED UPON VALUE OF PROPERTY BASED UPON SENSOR │
│                              MEASUREMENTS                               │
│  1636                                                                   │
└─────────────────────────────────────────────────────────────────────────┘
                                      │
┌─────────────────────────────────────────────────────────────────────────┐
│  1637    MONITOR ONGOING CONDITIONS VIA PERIODIC SENSOR MEASUREMENTS    │
└─────────────────────────────────────────────────────────────────────────┘
                                      │
┌─────────────────────────────────────────────────────────────────────────┐
│  1638           SET THRESHOLD STRUCTURE STATUS CONDITIONS               │
└─────────────────────────────────────────────────────────────────────────┘
                                      │
┌─────────────────────────────────────────────────────────────────────────┐
│   GENERATE ALERT BASED UPON CONDITION DETERMINED FROM PERIODIC MEASUREMENTS │
│  1639                                                                   │
└─────────────────────────────────────────────────────────────────────────┘
                                      │
┌─────────────────────────────────────────────────────────────────────────┐
│  1640             TRANSMIT ALERT VIA COMMUNICATIONS NETWORK             │
└─────────────────────────────────────────────────────────────────────────┘
                                      │
┌─────────────────────────────────────────────────────────────────────────┐
│   CHANGE INSURANCE OBLIGATION BASED UPON CONDITION DETERMINED FROM PERIODIC │
│                              MEASUREMENTS                               │
│  1641                                                                   │
└─────────────────────────────────────────────────────────────────────────┘
```

FIG. 16C

SYSTEM FOR HIERARCHICAL ACTIONS BASED UPON MONITORED BUILDING CONDITIONS

The present application claims priority to Non Provisional patent application Ser. No. 16/142,275, filed Sep. 26, 2018 and entitled METHODS AND APPARATUS FOR ORIENTEERING as a Continuation in Part Application; and to Non Provisional patent application Ser. No. 16/161,823, filed Oct. 16, 2018 and entitled BUILDING MODEL WITH CAPTURE OF AS BUILT FEATURES AND EXPERIENTIAL DATA as a Continuation in Part Application; and to Non Provisional patent application Ser. No. 15/887,637, filed Feb. 2, 2018 and entitled BUILDING MODEL WITH CAPTURE OF AS BUILT FEATURES AND EXPERIENTIAL DATA as a Continuation in Part Application; and to Non Provisional patent application Ser. No. 15/703,310, filed Sep. 13, 2017 and entitled BUILDING MODEL WITH VIRTUAL CAPTURE OF AS BUILT FEATURES AND OBJECTIVE PERFORMANCE TRACKING as a Continuation in Part Application; and to Non Provisional patent application Ser. No. 15/716,133, filed Sep. 26, 2017 and entitled BUILDING MODEL WITH VIRTUAL CAPTURE OF AS BUILT FEATURES AND OBJECTIVE PERFORMANCE TRACKING as a Continuation in Part Application; which claims priority to Provisional Patent Application Ser. No. 62/712,714, filed Jul. 31, 2018 and entitled BUILDING MODEL WITH AUTOMATED WOOD DESTROYING ORGANISM DETECTION AND MODELING; which claims priority to Provisional Patent Application Ser. No. 62/462,347, filed Feb. 22, 2017 and entitled VIRTUAL DESIGN, MODELING AND OPERATIONAL MONITORING SYSTEM; which claims priority to Provisional Patent Application Ser. No. 62/531,955, filed Jul. 13, 2017 and entitled BUILDING MODELING WITH VIRTUAL CAPTURE OF AS BUILT FEATURES; which claims priority to Provisional Patent Application Ser. No. 62/531,975 filed Jul. 13, 2017 and entitled BUILDING MAINTENANCE AND UPDATES WITH VIRTUAL CAPTURE OF AS BUILT FEATURES as a continuation in part application; the contents of each of which are relied upon and incorporated herein by reference.

FIELD OF THE INVENTION

Field of the Invention

The present invention involves the quantification of physical conditions of a Structure designated as risk indicia. Sensors provide ongoing monitoring of physical conditions present within a Structure which collected as Structure Vital Condition Monitoring (SVCM). An Augmented Virtual Model (AVM) generates a virtual representation of As Built and Experiential Data. Appropriate remedial actions are generated to change the physical conditions associated with risk indicia. Computer Aided Design (CAD) type modeling is combined with As Built Data and Experiential Data to quantify physical conditions and potential remedial actions responsive to risk indicia specific to conditions measured within a Structure.

Background of the Invention

Traditional methods of assessment of structures involve the physical inspection of a Structure and the preparation of an inspector's report. These reports are traditionally limited to those aspects of an inspected structure's physical components visible to the naked eye at a single instance in time. In some more advanced iterations, inspections may include historical, zoning, environmental, use, title, and installed component data; however, in all iterations, traditional inspection reports are limited to a once-in-time snapshot of the condition of the inspected structure.

The limitations of the previously known inspection techniques create systemic inefficiencies in the assessment and mitigation of risk. Because the inspection is inherently limited to a snapshot data collection, a disconnect exists between assessed risk and actual or real risk. This gap creates structural inefficiencies in the risk-assessment and mitigation industry which leads to inefficient exploitation and leveraging of collateral, and forces investors to engage in further inefficient hedging behaviors when considering collateralized assets and asset backed securities.

Additionally, it may be desirable to allow stakeholders, such as investors, to take appropriate remedial actions to ameliorate conditions adding additional risk to an investment.

SUMMARY OF THE INVENTION

Accordingly, the present invention provides apparatus and methods for physically measuring physical conditions within a Structure at multiple instances in time and aggregating data generated by the physical measurements over time. Quantified measurements of physical conditions may be memorialized as SVCM. Physical conditions of a Structure may thereby be filtered, categorized, and hierarchically arranged enabling a logical system to readily ascertain real time or near-real time events and respond accordingly. Data collected in the SVCM may be categorized according to a hierarchy of physical conditions capable of affecting a related Structure's ability to demonstrate physical conditions necessary and/or desirable for deployment. For example, measured conditions may provide indicators that a Structure complies with applicable building codes, American National Standards Institute (ANSI) standards, Costar Ratings or other deployment rating schema.

Deployment factors may also include whether a Structure will require repairs or upgrades to comply with a particular rating schema or interrupt or disrupt deployment of the Structure. In another aspect, physical conditions may be monitored and provide objective indicia of risk associated with a Structure used as collateral for an obligation or preservation of a Structure as an asset to be conveyed as a result of a future occurrence.

SVCM of Structures and the incorporation of the data collected via SVCM into the AVM of those Structures solves for the problem of limited inspection by providing first for more accurate initial inspection by including obfuscated as built features, and BIM of the Structures themselves by which greater detail accuracy is provided to the model than human visual inspection. SVCM of Structures and the incorporation of the data collected into AVM of the Structures further solves for the time-limited scope of traditional inspection techniques by providing for continuous monitoring of the Structures throughout their lifetime.

SVCM of Structures and the incorporation of the data thereby collected into AVM of the Structures in raw form creates additional inefficiencies; the sheer volume of data prevents its efficient use. Mere incorporation of raw SVCM data into an AVM creates vast amounts of relatively unusable data which, without categorization and hierarchical arrangement, is in some ways no better than traditional inspection techniques. Unfortunately, the volume of data created defies traditional manual means of categorization and hierarchical arrangement, and more advanced techniques are needed to render the data useful.

Generally speaking, data collected by SVCM and associated with an AVM of a given Structure will be categorized and arranged by class of data type and asset type. In some embodiments, data may be arranged into historical data, structural data, environmental data, and usage data categories. In other embodiments, data may be so arranged categorically as well as chronologically within a given class and made available to users according on demand. In still other embodiments, the data collected may be further subdivided into ever increasingly defined and determinative categories by means of logical functions commonly understood by one knowledgeable in the art whereby predictive analytics may be applied to a given collateral asset.

Once data categories are established for a given asset or asset class, the defined classes or categories are assigned logical numerical identifiers understood by ordinary logical processes.

Data collected by SVCM must be filtered and categorized to correspond to established classes per each asset or asset class. Data collected by SVCM is unique in that it has a point of origin, and in some instances a direction. SVCM data, therefore, lends itself to logical categorization much more readily than data collected by other means. The data collected by the SVCM may be assigned and matched to corresponding data based on pre-set parameters and logical analysis. In some iterations of the present invention, smart contracts and Blockchain technology may be employed to effectuate the categorization, collection, and relay of data collected by SVCM.

Once collected and categorized, SVCM data may be arranged within a category according to hierarchical risk indexes; in one iteration, known risk indicia such as, by means of non-limiting example, sudden heat spikes, wind exposure, seismic activity, sudden drops in local barometric pressure, and the like, may be assigned numerical values and arranged in a spectrum as they relate to a given asset. In some iterations of the present invention, pre-set logical processes may be employed to trigger mechanical responses within a given asset or relating to a given asset to mitigate a given risk.

Categorized and collected data gathered by SVCM of an asset may then be added to an AVM of a given asset and thereby a risk profile for the asset may be established. Data points known to indicate greater risk to the viability of an asset may be internally flagged by means of logical process and displayed in the system graphically or otherwise. In some iterations of the present invention, automated processed may be initiated pursuant to the achievement of certain risk indexes which operate to mitigate, reduce, or otherwise address the risk.

The known position of Sensors gathering data in the SVCM process may be coupled with the known direction and added to the AVM of a given asset and thereby may be accessed by users engaged in risk assessment and mitigation. Certain data points recorded by SVCM may correspond to known risk factors or may otherwise be assigned costs whereby more accurate and up to date loan to value ratios may be monitored and actions taken to correct imbalances in LTV ratio. In some embodiments of the present invention, Smart Contracts and Blockchain technology may be used to effectuate automatic or near automatic corrective action when LTV ratio exceeds certain prescribed parameters.

The present invention provides for automated apparatus for improved modeling of construction, Deployment and updating of a Structure. The improved modeling is based upon generation of As Built and Experiential Data captured with one or both of Smart Devices and Sensors located in or proximate to the Structure. The automated apparatus is also operative to model compliance with one or more performance levels for the Structure related to processing of a Product.

In another aspect of the present invention, a virtual model of a Structure extends beyond a design stage of the Structure into an "As Built" stage of the Structure and additionally includes generation and analysis of Experiential Data capturing conditions realized by the Structure during a Deployment stage of the Structure.

In general, As Built and Experiential Data generated according to the present invention include one or more of: image data; measurements; component specifications of placement; solid state; electrical; and electromechanical devices (or combination thereof); generate data capturing conditions experienced by a Structure. In addition, a user may enter data, such as for example, data descriptive of an action taken by a service technician into an Augmented Virtual Mode (AVM). As Built and Experiential Data may be aggregated for a single Structure or multiple Structures. Likewise, a Structure may comprise a single Structure or multiple Structures.

As Built Data is collected that quantifies details of how a specific physical Structure was actually constructed. According to the present invention, a Structure is designed and modeled in a 3D virtual setting. As Built Data is combined with a design model in a virtual setting to generate an AVM. As Built Data may reflect one or more of: fabrication of the Structure; repair; maintenance; upgrades; improvements; and work order execution associated with the Structure.

In addition, Experiential Data may be generated and entered into the AVM virtual model of the Structure. Experiential Data may include data indicative of a factor that may be tracked and/or measured in relation to the Structure. Experiential Data is typically generated by Sensors in or proximate to the Structure and may include, by way of non-limiting example, one or more of: vibration Sensors (such as piezo-electro devices); accelerometers; force transducers; temperature sensing devices; amp meters, ohmmeters, switches, motion detectors; light wavelength capture (such as infrared temperature profile devices), water flow meters; air flow meters; and the like. Some examples of Experiential Data may include: details of operation of equipment or machinery in the Structure; vibration measurements; electrical current draws; machine run times, machine run rates, machine run parameters; interior and/or exterior temperatures; opening and closings of doors and windows; weight loads; preventive maintenance; cleaning cycles; air circulation; mold contents; thermal profiles and the like. Automated apparatus captures empirical data during construction of the Structure and during Deployment of the Structure.

By way of additional example, it may be determined that water consumption in a particular Structure, or a particular class of processing plants, will be analyzed to determine if it is prudent to make modifications to the particular Structure or class of Structures. The automated apparatus of the present invention will include As Built Data for features of a Structure that is accessed while modeling proposed modifications and upgrades. Relevant As Built Features may include features for which relevancy may seem obvious, such as, for example, one or more of: utility requirements, electrical, chemical supply, chemical waste disposal, air handling equipment, hoods, exhaust and filtering; plumbing; machinery models and efficiency. In addition, other As Built Features, for which relevancy may not seem obvious, but which unstructured queries draw a correlation may also be included.

Location of appliances, equipment, machines and utilities relative to other appliances, equipment, machines and utilities may also be deemed relevant by unstructured query analysis. An unstructured query of captured data quantifying actual chemical, atmosphere and water usage may determine that certain configurations better meet an objective than others. For example, it may later be determined that the single-story Structure is more likely to have a consistent internal temperature, lighting, ambient particulate or other trends than a multi-story Structure.

As discussed more fully below, captured data may include empirical quantifications of a number of times a piece of machinery cycles on and off, vibrations within a Structure, temperature within a Structure, doors opening and closing, quantity of products processed, hours of occupancy of the Structure and other variable values. Captured data may also be used to generate a determination of how a Structure is being used, such as production cycles, quality, yield, rates, volumes, etc. As discussed more fully below, empirical Sensor data associated with how particular personnel behave within a Structure may also be correlated with Structure Performance based upon who occupies a particular Structure, when they occupy and for how long.

The automated apparatus combines a model of a Structure that has been designed and provides precise additions to the model based upon data capture of features actually built into the Structure. This allows for service calls that may include one or more of: repairs, upgrades, modifications and additions (hereinafter generally referred to as "service call"), to access data indicating an AVM combined with precise features included in a building represented by As Built Data, as well as Experiential Data and technical support for the features, maintenance logs and schedules, "how to" documentation and video support, virtual connection to specialists and experts, and a time line of original As Built details and subsequent modifications. Modifications may include repairs, updates and/or additions to a Structure.

The improved methods taught herein provide for the performance of repairs, maintenance and upgrades via access to a system that incorporates "As Built" data into the AVM. Geolocation and direction will be used to access virtual reality representations of a Structure including actual "As Built Imagery" incorporated into the AVM that accurately indicates locations and types of features and also provides images or other captured data. Exemplary data may include As Built locations of structural components (beams, headers, doorways, windows, rafters etc.); HVAC, electrical, plumbing, machinery, equipment, etc. Virtual repair may include "how to" instructions and video, technical publications, visual models comprised of aggregated data of similar repair orders and the like. An onsite technician may verify correct location of an equipment unit based upon GPS, triangulation, or direction determinations.

An AVM may additionally include virtual operation of equipment and use of modeled Structure based upon aggregated data from one or more As Built Structures. Upon conclusion of a repair, maintenance, upgrade or addition, additional information quantifying time, place, nature of procedure, parts installed, equipment, new component locations, etc. may be captured and incorporated into a virtual model.

Some embodiments of the present invention include capturing data of procedures conducted during preventive maintenance and/or a service call and inclusion of relevant data into a virtual model. Precise data capture during a service call or during construction may include actual locations of building features such as, electrical wiring and components, plumbing, joists, headers, beams and other structural components, as well as other Sensor measurements. Data capture may be ongoing over time as the building is used and modified, or updated during the life of a Structure (sometimes referred to herein as the "Operational" or "Deployed" stage of the Structure).

An Operational Stage may include, for example: occupation and use of a Property, as well as subsequent modifications, repairs and Structure improvements. The Property may include one or more modeled Structures, such as: a factory, processing plant, fabrication facility, server farm, power generator facility, an outbuilding and facilities included in a Property. Smart Devices with unique methods of determining a location and direction of data capture are utilized to gather data during construction of modeled buildings or other Structures and during Deployment of the Structures during the Operational Stage.

In general, Smart Devices provide ongoing collection of "As Built" and "Deployed" data that is captured during construction and Deployment of a building. The collected data is further correlated with design data and used to track Performance of features included in a design of process plants and/or features included within the confines of a Property parcel ("Property").

In another aspect, collected data may be used to predict Performance of a Property based upon features built into the Structure and conditions experienced by the Property. As Built Data may include modifications to a Property that are made during a construction phase, and/or during a Deployment phase, of a Property life cycle. Similarly, as Deployed data may include details quantifying one or more of: machine operators, production quantity, yield, quality level, usage, maintenance, repairs and improvements performed on the Property.

In still another aspect of the present invention, predictive analytics may be performed to predict a life of various components included in the Property. Maintenance procedures and replacement of consumables or other parts may also be budgeted and scheduled based upon a correlation of a) design data; b) As Built Data; and c) as used data. In addition, contemplated improvements may be modeled according to an expected return on investment ("ROI"). An expected ROI may be calculated according to one or more of: an objective level of measurements, an amount of a fungible item, such as kilowatt, gallon, currency, volume, or other quantity expended during the life of Deployment; and satisfaction of users and Performance.

Predictive analytics may include monitoring use of equipment and machinery. The monitoring may include data collection that is stored in a controller and analyzed, such as, via artificial intelligence routines. In some embodiments, data gathered during monitoring may be transmitted to a centralized location and aggregated with other similar type buildings, building support equipment (e.g., HVAC, plumbing, electric) and appliances. Analytic profiles may be generated. Predicted Performance and failures may be generated and used to schedule service calls before a physical failure occurs. Profiles may include degrees of usage, consumables, electric current draws, vibration, noise, image capture and the like.

Still another aspect includes generation of virtual reality user interfaces accessing the AVM based upon a) design data; b) As Built Data; c) as used data; and d) improvement data. A virtual reality user interface may be accessed as part of one or more of: a maintenance routine; to support a change order for the Property; and to contemplate improvements in a Property. As Built and As Deployed Data may include data quantifying repairs and updates to the Property.

In some embodiments, a) design data; b) As Built Data; c) Experiential Data; and d) Lead Actions and Lag Benefit measurements, as they relate to multiple Properties may be aggregated and accessed to support one or more Properties. Access to aggregated data may include execution of artificial intelligence (AI) routines. AI routines may include, by way of non-limiting example; structured algorithms and unstructured queries operative to predict Performance metrics and maintenance needs. AI routines may access both initial designs and data aggregated during build and Deployment stages of the Property.

The details of one or more examples of the invention are set forth in the accompanying drawings and the description below. The accompanying drawings that are incorporated in and constitute a part of this specification illustrate several examples of the invention and, together with the description, serve to explain the principles of the invention: other features, objects, and advantages of the invention will be apparent from the description, drawings, and claims herein.

DESCRIPTION OF THE DRAWINGS

The accompanying drawings, that are incorporated in and constitute a part of this specification, illustrate several embodiments of the invention and, together with the description, serve to explain the principles of the invention:

FIGS. 4A, 4B, and 4C illustrate an exemplary method flow diagrams with steps relating to processes.

FIG. 8 illustrates method steps that may be implemented according to some aspects of the present invention.

FIGS. 10A-C illustrates viewing areas of an AVM according to some aspects of the present invention.

FIGS. 11A-C illustrates vertical changes in an AVM viewable area according to some aspects of the present invention.

FIGS. 16-16C illustrate method steps that may be executed in practicing some embodiments of the present invention.

DETAILED DESCRIPTION

Figure 1A:
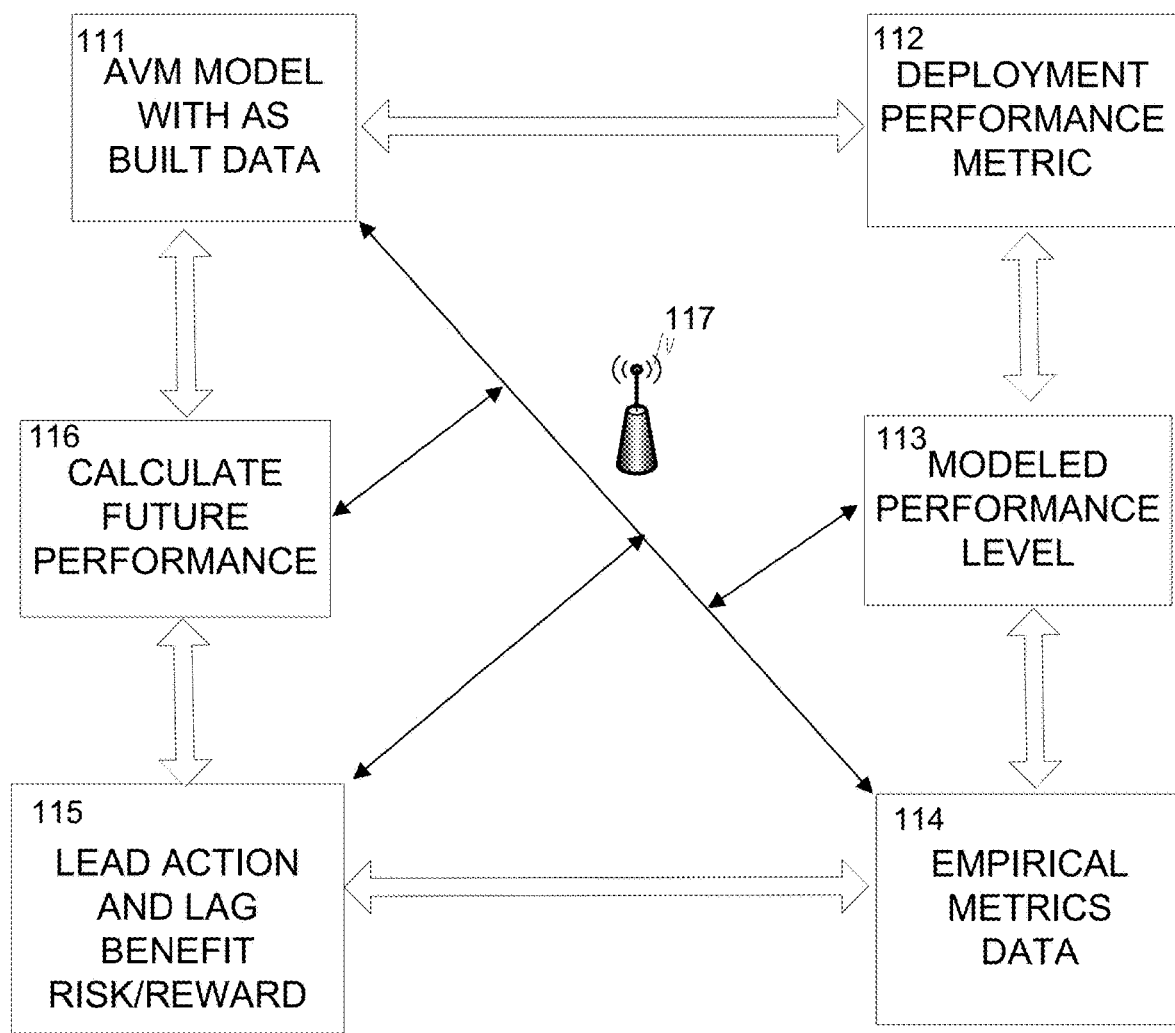
FIG. 1A illustrates a block diagram of inter-relating functions included in automated systems according to the present invention.

The present invention relates to methods and apparatus for improved modeling, Deployment and updating of a Structure based upon As Built and Experiential Data, and to using such modeling to provide improved compliance with stated contractual obligations, such as maintaining habitable living conditions in the Structure. As Built and Experiential Data may quantify an allocation of resources required for a level of Processing Facility Performance during Deployment of the facility. Design, repair, maintenance and upgrades to a Processing Facility are modeled with an automated system that incorporates "As Built" data and "Experiential" data into a virtual model of the Structure to determine a level of performance of the Processing Facility.

The present invention provides automated apparatus and methods for generating improved Augmented Virtual Models (sometimes referred to herein as an "AVM") of a Structure; the improved AVMs are capable of calculating a likelihood of achieving stated Performance Level specified by a user. In addition, the improved model may be operative to generate target Performance Metrics based upon As Built and Experiential Data.

In the following sections, detailed descriptions of examples and methods of the invention will be given. The description of both preferred and alternative examples though through are exemplary only, and it is understood that to those skilled in the art that variations, modifications and alterations may be apparent. It is therefore to be understood that the examples do not limit the broadness of the aspects of the underlying invention as defined by the claims.

The AVM of the Property may include a conceptual model and progress through one or more of: a) a design stage; b) a build stage; c) a Deployment stage; d) a service stage; e) a modification stage; and f) a dispensing stage. As discussed more fully herein, an AVM according to the present invention may include original design data matched to As Built Data, which is captured via highly accurate geolocation, direction and elevation determination. As Built Data is matched with a time and date of data acquisition and presented in two-dimensional (2D) and three-dimensional (3D) visual representations of the Property. The augmented models additionally include data relating to features specified in a Property design and data collected during building, Deployment, maintenance and modifications to the Property. In some embodiments, a fourth dimension of time may also be included.

An AVM includes a three- or four-dimensional model in a virtual environment that exists parallel to physical embodiments modeled in the AVM. Details of one or more physical Structures and other features within a real estate parcel are generated and quantified and represented in the AVM. The AVM exists in parallel to a physical Structure: the AVM includes virtual representations of physical Structures and additionally receives and aggregates data relevant to the Structures over time. The aggregation of data may be one or more of: a) according to an episode (e.g., onsite inspection, repair, improvement etc.); b) periodic; and c) in real time (without built-in delay).

The experience of the physical Structure is duplicated in the virtual AVM. The AVM may commence via an electronic model generated using traditional CAD software or other design-type software. In addition, the AVM may be based upon values for variables, including one or more of: usage of a Structure; usage of components within the Structure; environmental factors encountered during a build stage or Deployment stage; and metrics related to Performance of the Structure. The metrics may be determined, for example, via measurements taken by Sensors located in and proximate to Structures located on the Property or other Structures.

In another aspect, an AVM may be accessed in relation to modeling achievement of a stated Performance Level. Accurate capture of As Built Features and aggregated data of similar buildings, equipment types, machinery and usage profiles assist in one or more of: predicting Performance Level, Yield, Quality, Volume of Production, selecting appropriate technicians to deploy to a service call; providing correct consumables and replacement parts, scheduling a preventative maintenance; scheduling building, equipment and/or machinery upgrades; matching a building, equipment and machinery combination of a particular type of Deployment; providing on site guidance during the service call; providing documentation relevant to the building, equipment and machinery; providing access to remote experts that guide onsite technicians.

In some embodiments, a technical library specific to a particular property and location within the Property may be maintained for each Property and made accessible to an onsite technician and/or remote expert. The library may include, but is not limited to: Structure, equipment/machinery manuals; repair bulletins, and repair/maintenance. Appropriate how-to videos may also be made available based upon an AVM with As Built and Experiential Data.

In another aspect, a parts-ordering function may be included in the AVM. Augmented parts ordering may allow a technician to view an ordered part and view a virtual demonstration of the part in use and procedures for replacing the part.

Aspects of the AVM may be presented via a user interface that may display on a tablet or other flat screen, or in some embodiments be presented in a virtual reality environment, such as via a virtual reality headset.

The present invention additionally provides for an AVM to forecast Future Performance of a Property based upon the values of variables included in data aggregated during the design, build and Deployment of the Property sometimes referred to herein as: a) Design features; b) As Built Data; and c) As Deployed Data.

The improved modeling system incorporates "As Built" data into the improved design model. The As Built Data is generated and/or captured via highly accurate geolocation, direction and elevation determination. Based upon the geolocation, direction and elevation determination, As Built Data is incorporated into a design model at a precise location within the AVM. In some embodiments, a time and date of data acquisition may be associated with updates to aspects of the improved AVM such that a chronology of changes exists within the AVM.

Original design aspects and updated design aspects may be presented in 2D and 3D visual representations of the Property. The present invention provides for systematic updates to As Built Data during a Deployment of the Property. Updated data may verify and/or correct previously included data and also be used to memorialize modifications made during a service call or modification to a Property.

Some exemplary embodiments may include updates to an AVM that include, one or more of: quantifying a make and model of equipment and machinery on site; time and date notation of change in location specific data; Model accessed and/or updated according to X, Y, and Z coordinates and distance data; X-axis, Y-axis data may include high level location designation within the street address via triangulation (e.g., a street address) and highly specific position designation (e.g., particular room and wall); combination of two types of position data; GPS, Differential GPS; references used during triangulation; aggregate data across multiple Structures for reference; designs that perform well; designs that fail; popularity of various aspects; access to and/or generation of, multiple AVMs; original and modified model versions; index according to date/time stamp; index according to feature; index according to popularity; index according to cost; index according to User specific query; plumbing; electrical; HVAC; chemical, raw material, structural; access areas (i.e. crawl spaces, attics); periodic data and position capture with camera/Sensor attached to a fixed position; and during one or more of: repair/maintenance/updates.

Accordingly, actual "As Built" imagery and location data is incorporated into the design model to accurately indicate a location and type of feature included in a Structure, and provides "pictures" or other captured data. Exemplary data may include As Built locations of structural components (beams, headers, doorways, windows, rafters etc.); HVAC, electrical, plumbing, machinery, equipment, etc. A virtual reality model may additionally include virtual operation of machinery and equipment and use of a Structure based upon aggregated data from the Structure, as well as annotations and technical specifications relating to features included in the As Built Model of a Structure identified by time, date, geolocation and direction.

In some embodiments, an initial digital model may be generated according to known practices in the industry. However, unlike previously known practices, the present invention associates an initial digital model with a unique identifier that is logically linked to a geolocation and one or both of date and time designation, and provides updates to the original model based upon data captured at the geolocation during a recorded timeframe. In this manner, an AVM is generated that logically links a digital model to a specific geographic location and actual As Built Data at the specific geographic location. The updated model may be virtually accessed from multiple locations such as a field office, onsite, a technical expert, a financial institution, or other interested party.

In some preferred embodiments, the geographic location will be provided with accurately placed location reference points. The location reference points may be accessed during activities involved in a service call on the Property, such as a repair or upgrade to a Structure or other Structures included within a property parcel surrounding the Structure. Accuracy of the reference points may or may not be associated with location relevance beyond the Property, however they do maintain accuracy within the Property.

Preferred embodiments may also include reference points accurately placed within a Structure located on the Property. As further discussed below, the reference points may include, by way of non-limiting example, a wireless transmission data transmitter operative to transmit an identifier and location data; a visual identifier, such as a hash code, bar code, color code or the like; an infrared transmitter; a reflective surface, such as a mirror; or other means capable of providing a reference point to be utilized in a triangulation process that calculates a precise location within the Structure or other Structure.

Highly accurate location position may be determined via automated apparatus and multiple levels of increasingly accurate location determination. A first level may include use of a GPS device providing a reading to first identify a Property. A second level may use position transmitters located within, or proximate to, the Property to execute triangulation processes in view of on-site location references. A GPS location may additionally be associated with a high level general description of a property, such as, one or more of: an address, a unit number, a lot number, a taxmap number, a county designation, Platte number or other designator. On-site location references may include one or more of: near field radio communication beacons at known X-Y position reference points; line of sight with physical reference markers; coded via ID such as bar code, hash code, and alphanumeric or other identifier. In some embodiments, triangulation may calculate a position within a boundary created by the reference points, which position is accurate on the order of millimeters. In some embodiments, Differential GPS may be used to accurately determine a location of a Smart Device with a sub-centimeter accuracy.

In addition to a position determination, such as latitude and longitude, or other Cartesian Coordinate (which may sometimes be indicated as an "X and Y" coordinate) or GPS coordinate, the present invention provides for a direction (sometimes referred to herein as a "Z" direction and elevation) of a feature for which As Built Data is captured and imported into the AVM.

According to the present invention, a direction dimension may be based upon a movement of a device. For example, a device with a controller and an accelerometer, such as mobile Smart Device, may include a user display that allows a direction to be indicated by movement of the device from a determined location acting as a base position towards an As Built feature in an extended position. In some implementations, the Smart Device may first determine a first position based upon triangulation with the reference points and a second position (extended position) also based upon triangulation with the reference points. The process of determination of a position based upon triangulation with the reference points may be accomplished, for example via executable software interacting with the controller in the Smart Device, such as, for example via running an app on the Smart Devices.

In combination with, or in place of directional movement of a device utilized to quantify a direction of interest to a user, some embodiments may include an electronic and/or magnetic directional indicator that may be aligned by a user in a direction of interest. Alignment may include, for example, pointing a specified side of a device, or pointing an arrow or other symbol displayed upon a user interface on the device towards a direction of interest.

In a similar fashion, triangulation may be utilized to determine a relative elevation of the Smart Device as compared to a reference elevation of the reference points.

It should be noted that although a Smart Device is generally operated by a human user, some embodiments of the present invention include a controller, accelerometer, data storage medium, Image Capture Device, such as a Charge Coupled Device ("CCD") capture device and/or an infrared capture device being available in a handheld or unmanned vehicle.

An unmanned vehicle may include for example, an unmanned aerial vehicle ("UAV") or ground level unit ("UGV"), such as a unit with wheels or tracks for mobility and a radio control unit for communication.

In another aspect, captured data may be compared to a library of stored data using image recognition software to ascertain and/or affirm a specific location, elevation and direction of an image capture location and proper alignment with the virtual model. Still other aspects may include the use of a compass incorporated into a Smart Device.

In still other implementations, a line of sight from a Smart Device, whether user-operated or deployed in an unmanned vehicle, may be used to align the Smart Device with physical reference markers and thereby determine an X-Y position as well as a Z position. Electronic altitude measurement may also be used in place of, or to supplement, a known altitude of a nearby reference point. This may be particularly useful in the case of availability of only a single reference point.

Reference points may be coded via identifiers, such as a UUID (Universally Unique Identifier), or other identification vehicle. Visual identifiers may include a bar code, hash code, alphanumeric or other symbol. Three dimensional markers may also be utilized.

By way of non-limiting example, on site data capture may include designation of an XYZ reference position and one or more of: image capture; infrared radiation capture; temperature; humidity; airflow; pressure/tension; electromagnetic reading; radiation reading; sound readings (i.e. level of noise, sound pattern to ascertain equipment running and/or state of disrepair), and other vibration or Sensor readings (such as an accelerometer or transducer).

In some embodiments, vibration data may be used to profile use of the building and/or equipment and machinery associated with the building. For example, vibration detection may be used to determine a machine operation, including automated determination between proper operation of a piece of equipment and/or machinery and faulty operation of the equipment and/or machinery. Accelerometers may first quantify facility operations and production speed and/or capacity during operations. Accelerometers may also detect less than optimal performance of equipment and/or machinery. In some embodiments. AI may be used to analyze and predict proper operation and/or equipment/machinery failure based upon input factors, including vibration patterns captured. Vibrations may include a "signature" based upon machine type and location within a Structure human-related activity, such as, by way of non-limiting example: machine and foot traffic, physical activities, appliance operations, appliance failures, raised voices, alarms and alerts, loud music, running, dancing and the like, as well as a number of machines and/or people in the building and a calculated weight and mobility of the people.

Vibration readings may also be used to quantify operation of appliances and equipment associated with the building, such as HVAC, circulators, water pumps, washers, dryers, refrigerators, dishwashers and the like. Vibration data may be analyzed to generate profiles for properly running equipment and equipment that may be faulty and/or failing. The improved virtual model of the present invention embodied as an AVM may be updated, either periodically or on one-off occasions, such as during a service call or update call.

In some embodiments, a fourth dimension in addition to the three spatial dimensions will include date and time and allow for an historical view of a life of a Structure to be presented in the virtual model. Accordingly, in some embodiments, onsite cameras and/or Sensors may be deployed and data may be gathered from the on-site cameras and Sensors either periodically or upon command. Data gathered may be incorporated into the improved virtual model.

In still another aspect, the AVM may aggregate data across multiple Properties and buildings. The aggregated data may include conditions experienced by various buildings and mined or otherwise analyzed, such as via artificial intelligence and unstructured queries. Accordingly, the AVM may quantify reasons relating to one or more of: how to reposition machines, route workflow or otherwise improve, designs that work well; designs that fail; popular aspects; generate multiple Virtual Models with various quantified features; original and modified model versions and almost any combination thereof.

Although data may be gathered in various disparate and/or related ways, an aggregate of data may be quickly and readily accessed via the creation of indexes. Accordingly, indexes may be according to one or more of: date/time stamp; feature; popularity; cost; User-specific query; plumbing; electrical; HVAC; Structural aspects; access areas; periodic data and position capture with camera/Sensor attached to a fixed position; indexed according to events, such as during construction, during modification, or during Deployment; airflow; machinery; traffic flows during use of Structure; audible measurements for noise levels; and almost any other aspect of captured data.

In another aspect, an AVM may receive data descriptive of generally static information, such as, one or more of: product specifications, building material specifications, product manuals, and maintenance documentation.

Generally static information may be utilized within the AVM to calculate Performance of various aspects of a Property. Dynamic data that is captured during one of: a) design phase; b) build phase; and c) Deployed Phase, may be used to analyze actual Performance of a Property and also used to update an AVM and increase the accuracy of additional predictions generated by the AVM. Maintenance records and supporting documentation may also be archived and accessed via the AVM. A variety of Sensors may monitor conditions associated with one or both of the Structure and the parcel. The Sensors and generated data may be used to extrapolate Performance expectations of various components included in the AVM. Sensor data may also be aggregated with Sensor data from multiple AVMs from multiple Structures and/or Properties and analyzed in order to track and/or predict Performance of a Structure or model going forward.

Glossary

"Agent" as used herein refers to a person or automaton capable of supporting a Smart Device at a geospatial location relative to a Ground Plane.

"Ambient Data" as used herein refers to data and data streams captured in an environment proximate to a Vantage Point and/or an equipment item that are not audio data or video data. Examples of Ambient Data include, but are not limited to Sensor perception of one or more of: temperature, humidity, particulate, chemical presence, gas presence, light, electromagnetic radiation, electrical power, moisture and mineral presence.

"Analog Sensor" as used herein includes a Sensor operative to quantify a state in the physical world in an analog representation.

"As Built" as used herein refers to details of a physical Structure associated with a specific location within the physical Structure or parcel and empirical data captured in relation to the specific location.

"As Built Features" as used herein refers to a feature in a virtual model or AVM that is based at least in part upon empirical data captured at or proximate to a correlating physical location of the feature. Examples of As Built Features include placement of structural components such as a wall, doorway, window, plumbing, electrical utility, machinery and/or improvements to a parcel, such as a well, septic, electric or water utility line, easement, berm, pond, wet land, retaining wall, driveway, right of way and the like.

"As Built Imagery" (sometimes referred to herein as "Image Data") as used herein shall mean image data generated based upon a physical aspect.

"Augmented Virtual Model" (sometimes referred to herein as "AVM") as used herein is a digital representation of a real property parcel including one or more three dimensional representations of physical Structures suitable for use and As Built Data captured descriptive of the real property parcel. An AVM includes As Built Features of the Structure and may include improvements and features contained within a Structure and is capable of being updated by Experiential Data.

"Deployment" as used herein shall mean the placement of one or more of: a facility machinery and an equipment item into operation.

"Deployment Performance" as used herein shall mean one or both of: objective and subjective quantification of one or more of: facility, machinery, an equipment item operated, or habitation-related Vital Statistics, which may be depicted in an AVM.

"Design Feature" as used herein, shall mean a value for a variable descriptive of a specific portion of a Property. A Design Feature may include, for example, a size and shape of a structural element or other aspect, such as a doorway, window or beam; a material to be used, an electrical service, a plumbing aspect, a data service, placement of electrical and data outlets; a distance, a length, a number of steps; an incline; or other discernable value for a variable associated with a Structure or Property feature.

"Digital Sensor" as used herein includes a Sensor operative to quantify a state in the physical world in a digital representation.

"Directional Audio" as used herein refers to audio data captured from a Vantage Point within or proximate to a Property and from a direction.

"Directional Image Data" as used herein refers to image data captured from a Vantage Point with reference to a direction. Image data may include video data.

"Directional Indicator" as used herein shall mean a quantification of a direction generated via one or both of: analog and digital indications.

"Experiential Data" as used herein shall mean data captured on or proximate to a subject Structure descriptive of a condition realized by the Structure. Experiential Data is generated by one or more of: Digital and/or Analog Sensors, transducers, image capture devices, microphones, accelerometers, compasses and the like.

"Experiential Sensor Reading" as used herein shall mean a value of a Sensor output generated within or proximate to a subject Structure descriptive of a condition realized by the Structure. An Experiential Sensor Reading may be generated by one or more of: Digital and/or Analog Sensors, transducers, Image Capture Devices, microphones, accelerometers, compasses and the like.

"Facility" includes, without limitation, a manufacturing plant, a processing plant, or a residential Structure.

"Ground Plane" as used herein refers to horizontal plane from which a direction of interest may be projected.

"Image Capture Device" or "Scanner" as used herein refers to apparatus for capturing digital or analog image data, an Image capture device may be one or both of: a two-dimensional camera (sometimes referred to as "2D") or a three-dimensional camera (sometimes referred to as "3D"). In some examples an Image Capture Device includes a CCD camera. An Image Capture Device may also be capable of taking a series of images in a short time interval and associating the images together to create videos for use in four-dimensional model embodiments.

"Lag Benefit" as used herein shall mean a benefit derived from, or in relation to a Lead Action.

"Lead Actions" as used herein shall mean an action performed on, in, or in relation to a Property to facilitate attachment of a Performance Level.

"Performance" as used herein may include a metric of an action or quantity. Examples of Performance may include metrics of: number of processes completed, energy efficiency; length of service; cost of operation; quantity of goods processed or manufacture; quality of goods processed or manufacture; yield; and human resources required.

"Performance Level" as used herein shall mean one or both of a quantity of actions executed and a quality of actions.

"Property" as used herein shall mean one or more real estate parcels suitable for a deployed Structure that may be modeled in an AVM.

"Ray" as used herein refers to a straight line including a starting point and extending indefinitely in a direction.

"Sensor" as used herein refers to one or more of a solid state, electromechanical, and mechanical device capable of transducing a physical condition or property into an analog or digital representation and/or metric.

"Smart Device" as used herein includes an electronic device including, or in logical communication with, a processor and digital storage and capable of executing logical commands. By way of non-limiting example, a Smart Device may include a smartphone, a tablet, a virtual reality viewer, and an augmented reality viewer.

"Structure" as used herein shall mean a structure capable of receiving in a processing material and/or a consumable and outputting a product, or a structure capable of habitation.

"Total Resources" as used herein shall mean an aggregate of one or more types of resources expended over a time period.

"Transceiver" as used herein refers to an electronic device capable of one or both of wirelessly transmitting and receiving data.

"Vantage Point" as used herein refers to a specified location which may be an actual location within a physical facility or residential Structure, or a virtual representation of the actual location within a physical facility or residential Structure.

"Vector" as used herein refers to a magnitude and a direction as may be represented and/or modeled by a directed line segment with a length that represents the magnitude and an orientation in space that represents the direction.

"Virtual Structure" as used herein shall mean a digital representation of a physical Structure suitable for deployment for a specified use. The Virtual Structure may include Design Features and As Built Features. The Virtual Structure may be included as part of an AVM.

"Vital Condition" as used herein refers to a condition measurable via a device located in or proximate to a Structure, wherein a value of the measured condition is useful to determine the Structure's ability to meet set of predetermined conditions.

"WiFi" as used herein shall mean a communications protocol with the industrial, scientific and medical ("ISM") radio bands within the frequency range of 6.7 MHz (megahertz) and 250 GHz (Gigahertz).

Referring now to FIG. 1A, a block diagram is shown that illustrates various aspects of the present invention and interactions between the respective aspects. The present invention includes an AVM 111 of a Structure that includes As Built Features. The generation and inclusion of As Built Features, based upon location and direction-specific data capture, is discussed more fully below. Data may be transmitted and received via one or both of digital and analog communications, such as via a wireless communication medium 117.

According to the present invention, one or more Deployment Performance Metrics 112 are entered into automated apparatus in logical communication with the AVM 111. The Deployment Performance Metric 112 may include a purpose to be achieved during Deployment of a modeled Structure. By way of non-limiting example, a Deployment Performance Level may include one or more of: a production or quantity; quality; yield; scalability; a level of energy efficiency; a level of water consumption; mean time between failure for equipment included in the Structure; mean time between failure for machinery installed in the Structure; a threshold period of time between repairs on the Structure; a threshold period of time between upgrades of the Structure; a target market value for a Property; a target lease or rental value for a Property; a cost of financing for a Property; Total Cost of Ownership of a Property; TCD of a Property or other quantifiable aspect.

In some embodiments, Deployment Performance Metrics may be related to a fungible item, such as a measurement of energy (kWh of electricity, gallon of fuel oil, cubic foot of gas, etc.); man hours of work; trade medium (i.e., currency, bitcoin, stock, security, option etc.); parts of manufactures volume of material processed or other quantity. Relating multiple disparate Deployment Performance Metrics to a fungible item allows disparate Performance Metrics to be compared for relative value.

Modeled Performance Levels 113 may also be entered into the automated apparatus in logical communication with the AVM 111. The Modeled Performance Levels 113 may include an appropriate level of Performance of an aspect of the Structure in the AVM affected by the Deployment Performance Metric 112. For example, a Modeled Performance Level 113 for energy efficiency for a Structure modeled may include a threshold of kilowatt hours of electricity consumed by the Structure on a monthly basis. Similarly, a target market value or lease value may be a threshold pecuniary amount. In some embodiments, the threshold pecuniary amount may be measured according to a period of time, such as monthly or yearly.

Empirical Metrics Data 114 may be generated and entered into the automated apparatus on an ongoing basis. The Empirical Metrics Data 114 will relate to one or more of the Deployment Performance Metrics and may be used to determine compliance with a Deployment Performance Level and/or a Performance Levels. Empirical Metrics Data 114 may include, by way of non-limiting example, one or more of: a unit of energy; a unit of water; a number of service calls; a cost of maintenance; a cost of upgrades; equipment details, design details, machinery details, identification of human resources deployed; identification of organizations deployed; number of human resources; demographics of human resources (e.g., age, gender, occupations, employment status, economic status, requiring assistance with basic living necessities; and the like); percentage of time Structure is occupied; purpose of occupancy (e.g., primary residence, secondary residence, short term rental, long term lease, etc.); Sensor readings (as discussed more fully below); man hours required for Structure repair/maintenance/upgrades; total currency (or other fungible pecuniary amount) expended on behalf of a Structure or property.

In addition to Empirical Metrics Data 114, Lead Actions and expected Lag Benefits 115 that may cause an effect on one or both of a Deployment Performance Metric 112 and a Modeled Performance Level 113, may be entered into the automated apparatus. A Lead Action may include an action expected to raise, maintain or lower an Empirical Metrics Data 114. For example, an action to install water efficient plumbing fixtures may be scheduled in order to improve water consumption metrics. Similar actions may relate to electrically efficient devices, or automatic electric switches being installed; preventive maintenance being performed; Structure automation devices being installed and the like. Other Lead Actions may include limiting a demographic of occupants of a Structure to a certain demographic, such as senior citizens. An expected benefit may be measured in Lag Benefit measurements, such as those described as Empirical Metrics Data 114, or less tangible benefits, such as occupant satisfaction.

The automated apparatus may also be operative to calculate Future Performance 116 based upon one or more of: an AVM comprising As Built Data 111; Deployment Performance Metric 112; Modeled Performance Level 113; and Empirical Metrics Data 114. Future Performance may be calculated in terms of an appropriate unit of measure for the aspect for which Performance is calculated, such as, for example: an energy unit; man hours; mean time between failures and dollar or other currency amount.

Calculation of Future Performance 116 may be particularly useful to calculate Total Resources calculated to be required to support a particular Structure, group of Structures, properties and/or group of properties over a term of years ("Total Resources Calculated"). Total Resources Calculated may therefore be related to calculations of Future Performance 116 and include, for example, one or more of: energy units; water units; man hours; equipment; machinery and dollars (or other currency or fungible item). In some embodiments, calculations of Future Performance may include a Total Cost of Ownership for a term of years. For example, a Total Cost of Ownership for a Property may include a purchase amount and amounts required for maintenance, repair and upgrades from day one of Deployment through twenty years of Deployment (a shorter or longer term of years may also be calculated).

Accordingly, some embodiments may include a calculation of Total Resources required that includes a purchase price of a property with a Structure, that incorporates a total cost associated with the property over a specified term of years. The total cost will be based upon the AVM 111, which comprises As Built Data; Deployment Performance Metric 112; Modeled Performance Level 113 and Empirical Metrics Data 114.

Moreover, Total Resources required may be aggregated across multiple properties and. Structures. Aggregation of properties may be organized into property pools to mitigate risk of anomalies in the Calculation of Future Performance. Of course the benefits of property ownership and/or management may also be pooled and compared to the Total Resources required. In various embodiments, different aspects of calculated Future Performance 116 may be aggregated and allocated to disparate parties. For example, first aggregation may relate to man hours of technician time for Structure repair and maintenance and the fulfillment of obligations related to the aggregation may be allocated to a first party. A second aggregation may relate to machinery Performance and obligations allocated to a second party. A third aggregation may relate to equipment Performance and obligations allocated to a third party. Other aggregations may similarly be allocated to various parties. In some embodiments, financial obligations incorporating one or both of acquisition cost and ongoing Deployment costs may be allocated and financed as a single loan. Other embodiments include a calculated Future Performance cost being incorporated into a purchase price.

An important aspect of the present invention includes definition and execution of Lead Actions based upon one or more of: the AVM Model 111, which comprises As Built Data; Deployment Performance Metric 112; Modeled Performance Level 113; Empirical Metrics Data 114 and Calculations of Future Performance 116.

Figure 1B:
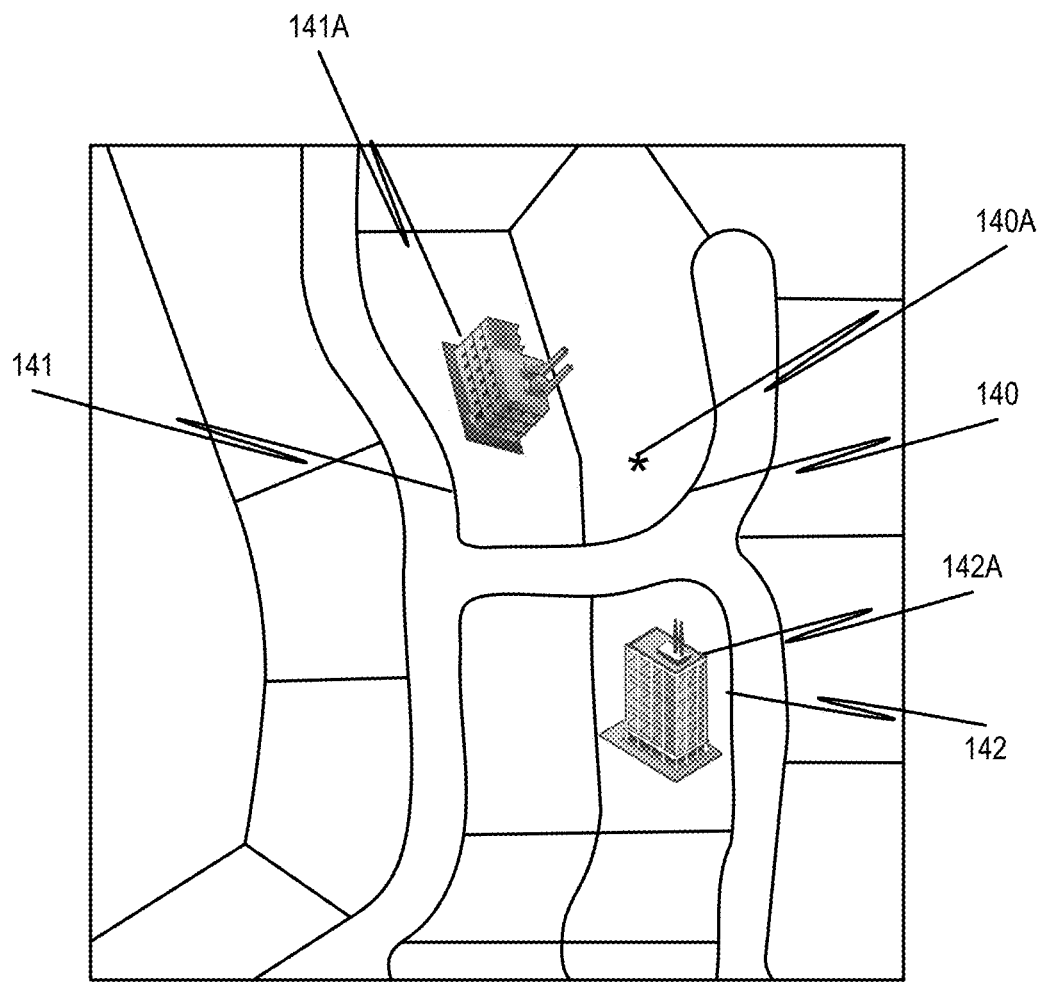
FIG. 1B illustrates geolocation aspects that may be used to identify a Property and corresponding data and predictions.

Referring now to FIG. 1B, an AVM is generally associated with a Property that includes a real estate parcel 140-142. According to some embodiments, one or more of an improvement, a repair, maintenance and an upgrade are performed on the Property. The Property is identified according to an automated determination of a location and a particular position, elevation and direction are further determined automatically within the Property. Smart Devices may be used to access data records stored in an AVM according to a unique identifier of a physical location of the real estate parcel 140-142.

As illustrated, a map of real estate parcels 140-142 is shown with icons 141A-142A indicating parcels that have virtual Structures included in a virtual model associated with the parcels. Other parcels 140 have an indicator 140A indicating that a virtual model is in process of completion.

In some methods utilized by the present invention, data in an AVM may be accessed via increasingly more accurate determinations. A first level of geospatial location determinations may be based upon a real estate parcel 140-142 and a second geospatial determination may be made according to position locators (discussed more fully below) included within the boundaries of the real estate parcel 140-142. Still more accurate location position may be calculated according to one or both of a direction determination and an accelerometer. The position may be calculated using an accelerometer by assuming a known initial position, and using known methods of numerical integration to calculate displacement from said initial position. Accordingly, it is within the scope of the present invention to access a record of a design model for a specific wall portion within a Structure based upon identification of a real estate parcel 140-142 and a location within a Structure situated within the real estate parcel 140-142 and height and direction. Likewise the present invention provides for accessing As Built Data and the ability to submit As Built Data for a specific portion of a Structure based upon an accurate position and direction determination.

In some implementations of the present invention, a Property unique identifier may be assigned by the AVM and adhere to a standard for universally unique identifiers (UUID); other unique identifiers may be adopted from, or be based upon, an acknowledged standard or value. For example, in some embodiments, a unique identifier may be based upon Cartesian Coordinates, such as GPS coordinates. Other embodiments may identify a Property according to one or both of: a street address and a tax map number assigned by a county government of other authority.

In some embodiments, an AVM may also be associated with a larger group of properties, such as a manufacturing plant, research and development, assembly, a complex, or other defined arrangement.

As illustrated, in some preferred embodiments, an electronic record correlating with a specific Property may be identified and then accessed based upon coordinates generated by a GPS device, or other electronic location device. The GPS device may determine a location and correlate the determined location with an AVM record listing model data, As Built Data, improvement data, Performance data, maintenance data, cost of operation data, return on investment data and the like.

Figure 1C:
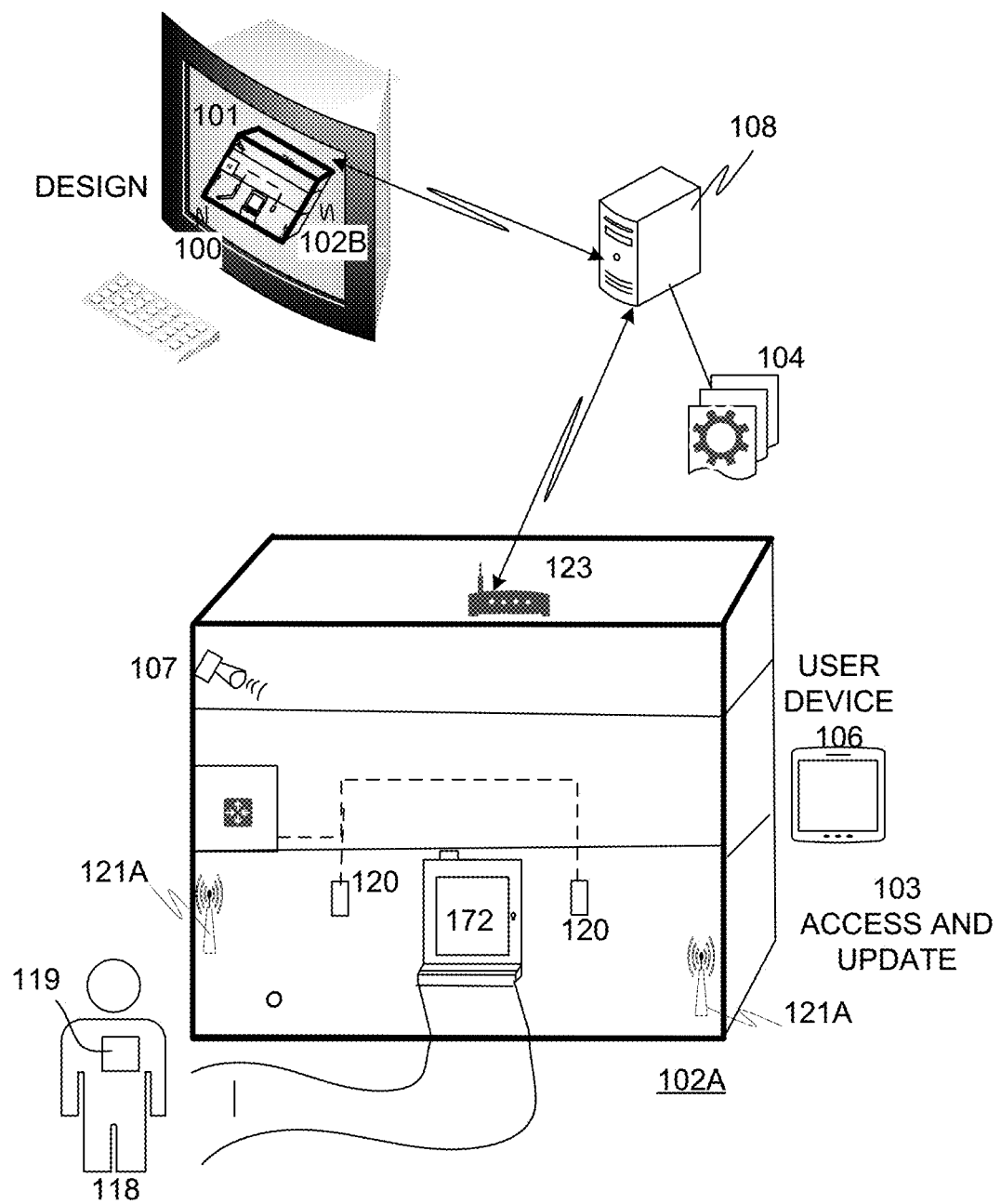
FIG. 1C illustrates a block diagram of ongoing data capture via Smart Devices and Sensors and support for predictive modeling based upon the smart data capture.

Referring now to FIG. 1C, a relational view of an AVM 100 with a Virtual Structure 102B is illustrated, as well as a Physical Structure 102A. The AVM 100 includes a virtual model stored in digital form with a design aspect that allows for a Physical Structure 102A suitable for use to be designed and modeled in a virtual environment. The design aspect may reference Performance data of features to be included in a Virtual Structure 102B and also reference variables quantifying an intended use of the Virtual Structure 102B. The Virtual Structure 102B and the AVM 100 may reside in a virtual setting via appropriate automated apparatus 108. The automated apparatus 108 will typically include one or more computer servers and automated processors as described more fully below and may be accessible via known networking protocols.

The Physical Structure 102A may include Sensor 120, such as a transceiver, that monitors an area of ingress and egress 172, such as a doorway, elevator and/or loading dock. In some embodiments, location identifiers 121A may comprise reference point transceivers, which may be used as wireless references of a geospatial position. A wireless communication device 123 may also link logical infrastructure within the Physical Structure 102A with a digital communications network.

In correlation with the design aspect, the present invention includes an As Built Model 101 that generates a Virtual Structure 102B in the context of the AVM 100. The As Built Model 101 includes virtual details based upon As Built Data captured on or proximate to a physical site of a related Physical Structure 102A. The As Built Data may be captured, for example, during construction or modification of a Physical Structure 102A.

The As Built Model 101 may include detailed data including image captures via one or more image capture devices 107 and physical measurements of features included in the Physical Structure 102A. The physical measurements may be during a build phase of the physical Structure; or subsequent to the build phase of the physical Structure. In some embodiments, original As Built measurements may be supplemented with additional data Structure data associated with repairs or improvements are made to the physical Structure. Details of recordable build aspects are placed as digital data on a recordable medium 104 included in the automated apparatus 108.

The digital data included on a recordable medium 104 may therefore include, for example, one or more of: physical measurements capturing Experiential Data; image data (e.g., digital photos captured with a CCD device or an Image Capture Device); laser scans; infrared scans and other measurement mediums. One or more records on the recordable medium 104 of an As Built Structure may be incorporated into the AVM 100 thereby maintaining the parallel nature of the AVM 100 with the Physical Structure 102A.

In some embodiments, As Built Data on a recordable medium 104 may be generated and/or captured via an image capture device 107.

As the physical Structure is deployed for use, subsequent measurements that generate and/or capture Experiential Data may be made and incorporated into the AVM 100. In addition, a user may access and update 103 the AVM 100 to ascertain features of the Physical Structure 102A that have been virtually incorporated into the AVM 100. In some examples, a tablet, handheld network access device (such as, for example a mobile phone) or other device with automated location service may be used to determine a general location of a Physical Structure 102A. For example, a smart phone with GPS capabilities may be used to determine a physical address of a physical Structure, such as "123 Main Street." Stored records containing data relating to "123 Main Street" may be accessed via the Internet or other distributed network.

In addition to the use of GPS to determine a location of a User Device, the present invention provides for a real estate parcel with a Physical Structure 102A that includes more radio frequency (or other mechanism) location identifiers 121A. Location identifiers 121A may include, for example, radio transmitters at a defined location that may be used to accurately identify via triangulation, a position of a user device 106, such as a: tablet, smart phone or virtual reality device. The position may be determined via triangulation, single strength, time delay determination or other process. In some embodiments, triangulation may determine a location of a user device within millimeters of accuracy.

Other location identifiers may include, by way of non-limiting example, RFID chips, a visual markings (i.e. a hash code or barcode), pins or other accurately placed indicators. Placement of the location identifiers may be included in the AVM and referenced as the location of the physical user device is determined. As described above, specific location identifiers may be referenced in the context of GPS coordinates or other more general location identifiers.

Based upon the calculated location of the user device 106, details of the Physical Structure 102A may be incorporated into the Virtual Structure 102B and presented to a user via a graphical user interface (GUI) on the user device 106.

For example, a user may approach a physical Structure and activate an app on a mobile user device 106. The app may cause the user device 106 to activate a GPS circuit included in the user device and determine a general location of the user device 106, such as a street address designation. The general location will allow a correct AVM to be accessed via a distributed network, such as the Internet. Once accessed, the app may additionally search for one or more location identifiers 121A of a type and in a location recorded in the AVM. An AVM may indicate that one or more RFID chips are accessible in a kitchen, a living room and each bedroom of a Structure. The user may activate appropriate Sensors to read the RFID chips and determine their location. In another aspect, an AVM 100 may indicate that location identifiers 121A are placed at two or more corners (or other placement) of a Physical Structure 102A and each of the location identifiers 121A may include a transmitter with a defined location and at a defined height. The user device 106, or other type of controller, may then triangulate with the location identifiers 121A to calculate a precise location and height within the physical Structure.

Similarly, a direction may be calculated via a prescribed movement of the user device 106 during execution of code that will record a change in position relative to the location identifiers 121A. For example, a user Smart Device, such as a smart phone or user device 106 may be directed towards a wall or other Structure portion and upon execution of executable code, the Smart Device may be moved in a generally tangential direction towards the wall. The change in direction of the user device 106 relative to the location identifiers 121A may be used to calculate a direction. Based upon a recorded position within the Physical Structure 102A and the calculated direction, a data record may be accessed in the AVM 100 and a specific portion of the AVM 100 and/or the Virtual Structure 102B may be presented on the user device 106. In other embodiments, a direction may be made, or verified via a mechanism internal to the Smart Device, such as a compass or accelerometer.

In still another aspect of the present invention, in some embodiments, transmissions from one or more location identifiers 121A may be controlled via one or more of: encryption; encoding; password protection; private/public key synchronization or other signal access restriction. Control of access to location identifiers 121A may be useful in multiple respects, for example, a location identifier may additionally function to provide access to data, a distributed network and/or the Internet.

The Virtual Structure 102B may include one or both of: historical data and most current data relating to aspects viewable or proximate to the user device 106 while the user device is at the calculated location in the Physical Structure 102A. In this way, the parallel virtual world of the AVM 100 and the Virtual Structure 102B may present data from the virtual world that emulates aspects in the physical world, and may be useful to the user accessing the user device 106, while the user device is at a particular physical location. As discussed within this document, data presented via the AVM 100 may include one or more of: design data, As Built Data, Experiential Data, Performance data relating to machinery and/or features of the AVM 100 or physical Structure; maintenance data, and annotations.

Annotations may include, for example, a user's or designer's note recorded at a previous time (such as a service technician's notation), a service bulletin, maintenance log, operation instructions or a personal note to a subsequent user, such as a virtual "John Smith was here" such guest log indicating who had frequented the location. Annotations may include one or both of text and image data. For example, an annotation may include an image of the location captured at a given time and date. The image may be of a personal nature, i.e. the living room while the Smith's owned the Structure, or a professional nature, i.e. the living room after being painted by XYZ Contractor on a recorded date. In some embodiments, annotations may be used to indicate completion of a work order. Recordation of completion of a work order may in turn trigger a payment mechanism for paying an entity contracted to complete the work order. In another aspect, annotations may relate to an AVM or a Virtual Structure as a whole, or to a particular aspect that is proximate to a location of the user device within the Virtual Structure.

In some embodiments, details of a proposed use of a structure and parcel may be input into a design module and used to specify or recommend features to be included in an AVM 100.

According to the present invention, features of a Structure and parcel are generated within a digital design model and then tracked as the features are implemented in a build process and further tracked in Performance of the Structure as it is placed into use. To the extent available, Performance is tracked in the context of variables relating to use. Variables may include, for example: a use of the Structure, such as manufacturing, processing, or habitation; a number of resources accessing in a Structure; demographics of the human resources; number of months per year the Structure is deployed for use; which months of the year a Structure is deployed for use; which hours of the day the Structure is occupied and other relevant information.

As Experiential Sensor Readings are generated they may be memorialized to generate Experiential Data associated with a Physical Structure 102A. The Experiential Data is collected and analyzed via structured queries and may also be analyzed with Artificial Intelligence processes such as unstructured queries to derive value. In some embodiments, Experiential Data may also be associated with a human and/or an animal interacting with the Physical Structure 102A. Former processing plants were generally designed and built to mitigate against variability in a human 118 and between disparate humans 118. The present invention allows for human variability to be monitored via Sensors 119 and the Structure to be modified to optimally inter-relate with the values for variables attributable to a human 118 that will inhabit or otherwise interact with the Structure 102A. Human (and/or animal) may be quantified with Sensors 119 installed on or proximate to the human 118. Alternatively, Sensors 120 located in, or proximate to, a Structure 102A may be used to monitor human variability. Biosensors may be used to provide empirical data of humans 118 interacting with a Structure may be analyzed using structured or unstructured queries to device relationships between Structure performance and human biometrics. Accordingly, Sensors may be used to quantify interaction between a human 118 and the Physical Structure 102A according to physiological and behavioral data, social interactions, and environmental factors within the Structure, actions undertaken, movements, and almost any quantifiable aspect.

As Built Features and biometrics may be further utilized to control various Structure automation devices. Structure automation devices may include, by way of non-limiting example one or more of: automated locks or other security devices; thermostats, lighting, heating, chemical processing, cutting, molding, laser shaping, 3D printing, assembly, cleaning, packaging and the like. Accordingly, a Structure with recorded As Built design features and vibration Sensors may track activities in a Structure and determine that a first occupant associated with a first vibration pattern of walking is in the Structure. Recorded vibration patterns may indicate that person one is walking down a hallway and automatically turn on appropriated lighting and adjust one or more of: temperature, sound and security. Security may include locking doors for which person one is not programmed to access. For example, a first pattern of vibration may be used to automatically ascertain that a person is traversing an area of a Structure for which a high level of security is required or an area that is designated for limited access due to safety concerns. As Built Data has been collected. Other Structure automation may be similarly deployed according to As Built Data, occupant profiles, biometric data, time of day, or other combination of available Sensor readings.

Figure 1D:
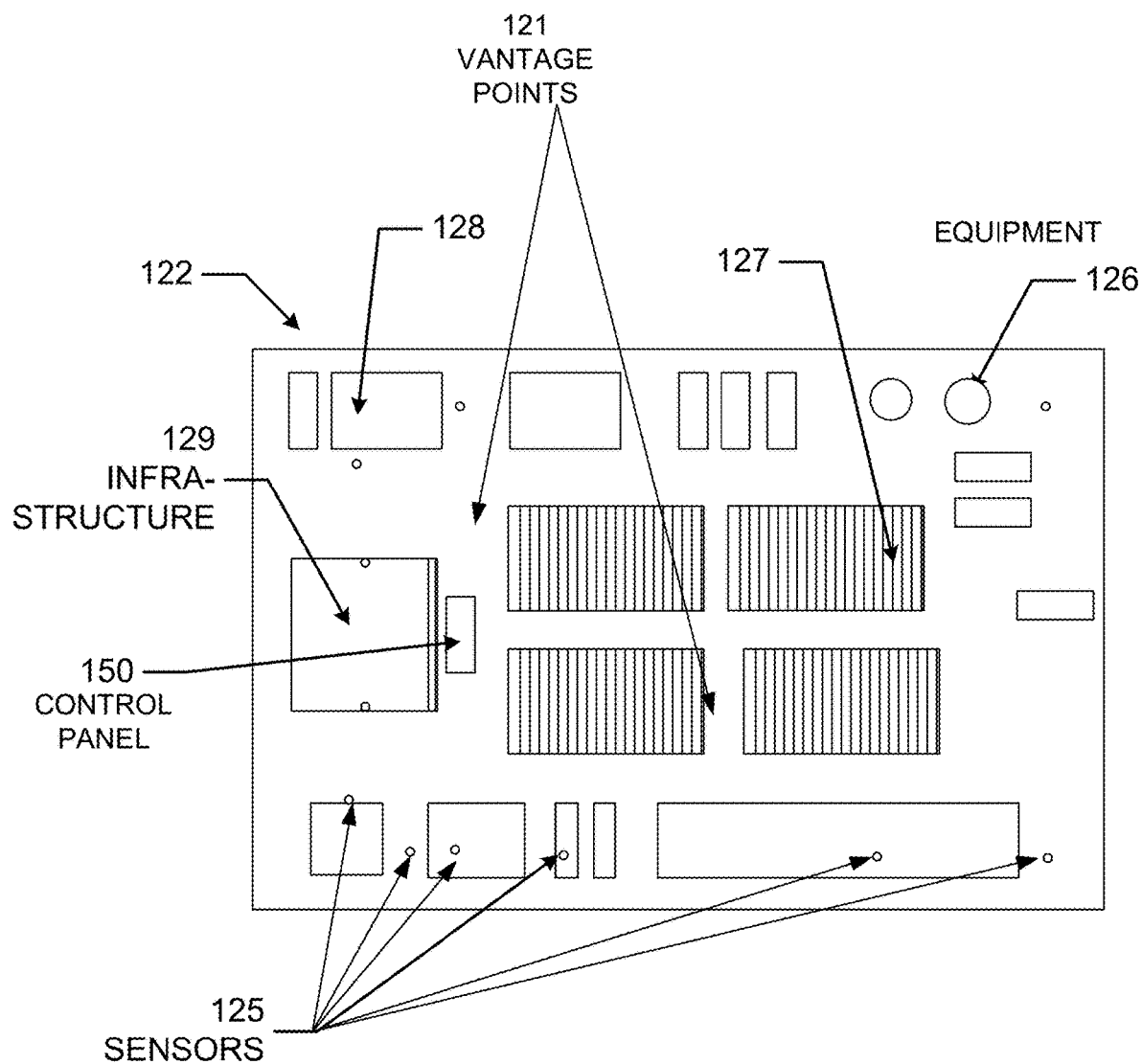
FIG. 1D illustrates an exemplary Processing Facility layout with various equipment delineated in a top-down representation according to some embodiments of the present invention.

Referring now to FIG. 1D, an exemplary layout of a Physical Structure 102A is shown. The AVM 111 may include virtual representations of one or more of: Sensors 125; equipment 126-128; control panel 150; infrastructure 129, such as HVAC, utilities, such as electric and water, gas lines, data lines, etc. and vantage points 121.

In some implementations, a virtual reality headset may be worn by a user to provide an immersive experience from a vantage point 121 such that the user will experience a virtual representation of what it would be like to be located at the vantage point 121 within the facility 122 at a specified point in time. The virtual representation may include a combination of Design Features, As Built Data and Experiential Data. A virtual representation may therefore include a virtual representation of image data via the visual light spectrum, image data via infrared light spectrum, noise and vibration reenactment. Although some specific types of exemplary Sensor data have been described, the descriptions are not meant to be limiting unless specifically claimed as a limitation and it is within the scope of this invention to include a virtual representation based upon other types of captured Sensor data may also be included in the AVM 111 virtual reality representation.

Figure 1E:
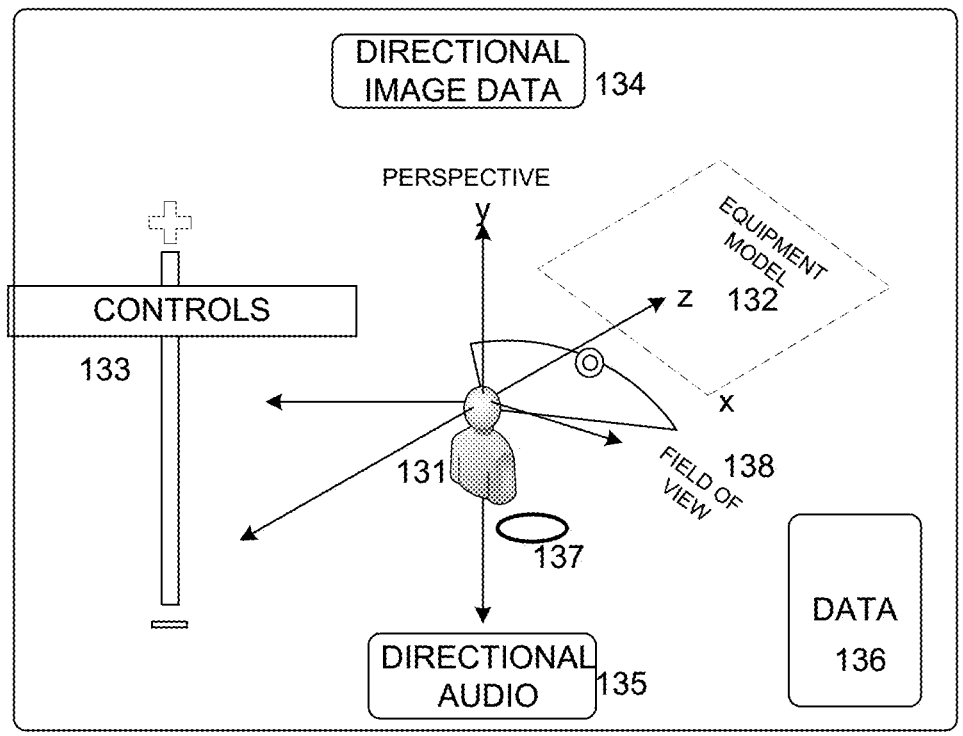
FIG. 1E illustrates a diagram of a user and directional image data.

Referring now to FIG. 1E, a user 131 is illustrated situated within an AVM 111. The user 131 will be virtually located at a Vantage Point 137 and may receive data, including, but not limited to one or more of: image data 134, audio data 135 and Ambient Data 136. The user 131 may also be provided with controls 133. Controls 133 may include, for example, zoom, volume, scroll of data fields and selection of data fields. Controls may be operated based upon an item of Equipment 132 within a Field of View 138 of the user 131 located at a vantage point 137 and viewing a selected direction. The user is presented with Image Data from within the AVM 111 that includes As Built Data and virtual design data.

Additional examples may include Sensor arrays, audio capture arrays and camera arrays with multiple data collection angles that may be complete 360 degree camera arrays or directional arrays, for example, in some examples, a Sensor array (including image capture Sensors) may include at least 120 degrees of data capture, additional examples include a Sensor array with at least 180 degrees of image capture; and still other examples include a Sensor array with at least 270 degrees of image capture. In various examples, data capture may include Sensors arranged to capture image data in directions that are planar or oblique in relation to one another.

Figure 2:
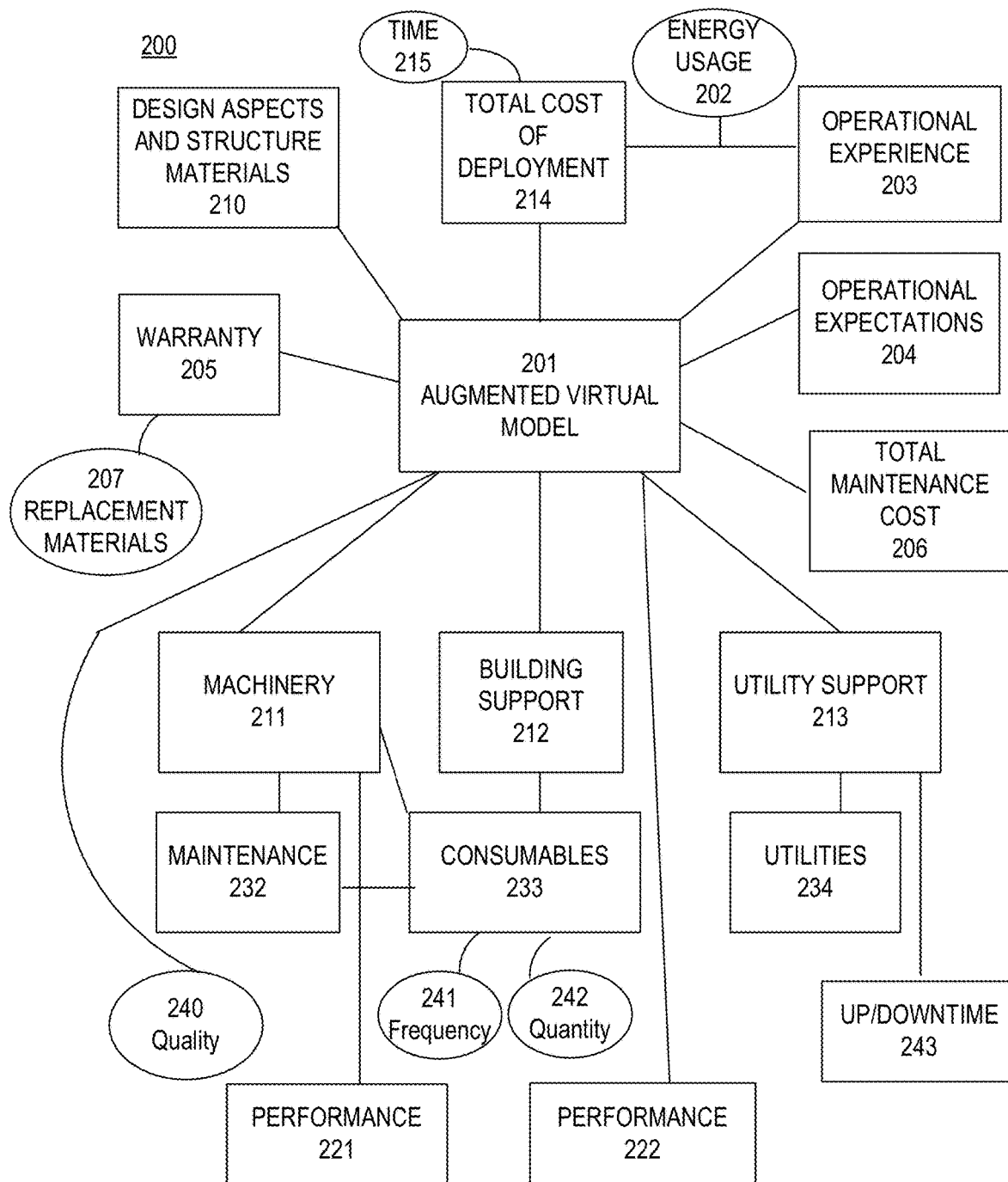
FIG. 2 illustrates a block diagram of a system suitable for facilitating an AVM.

Referring now to FIG. 2, a functional block illustrates various components of some implementations of the present invention. According to the present invention automated apparatus included in the AVM 201 are used to generate a model of a Virtual Structure and may also incorporate a model and associated real estate parcel. One or more pieces of equipment that will be deployed in the Property may be included into the AVM 201, equipment may include, for example: machinery 211; building support items 212, and utilities support item 213. The AVM 201 may model operational expectations 204 during deployment of a facility and associated machinery, equipment, furniture, or other fixtures included in the AVM 201. Machinery 211 may include, for example, manufacturing tools, robots or other automation, transport tools, chemical processing machine, physical processing machine, assembly machine, heat processing machine, cooling machine, deposition device, etching device, welding apparatus, cutting apparatus, forming tool, drilling tool, shaping tool, transport machine, Structure automation, air purification or filter systems, noise containment device and the like. Utility support equipment may include cabling, dish antennas, Wi-Fi, water softener, water filter, power, chemical supply, gas supply, compressed air supply and the like, as well as uptime and downtime associated with a facility utility and uptime and down time 243 of one or more aspects of the facility.

The AVM 201 calculates a predicted Performance of the AVM and generates quantified operational experience 203 based upon the Performance 222, wherein "Performance" may include any of: total cost of deployment 214; objective empirical measurements and satisfaction of operator's use an As Built physical model based upon the AVM; operational expectations 204, total maintenance cost 206, and residual value of an As Built following a term of years of occupation and use of an As Built Facility based upon the AVM. Performance 221 may also be associated with a specific item of machinery 211.

In another aspect, actual operational experience 203 may be monitored, quantified and recorded by the AVM 201. Data quantifying the operational experience 203 may be collected, by way of non-limiting example, from one or more of: Sensors incorporated into an As Built Structure; maintenance records; utility records indicating an amount of energy 202 (electricity, gas, heating oil) consumed; water usage; periodic measurements of an As Built Structure, such as an infrared scan of climate containment, air flow through air handlers, water flow, water quality and the like; user surveys and maintenance and replacement records.

In still another aspect, a warranty 205 covering one or both of parts and labor associated with an As Built Structure may be tracked, including replacement materials 207. The warranty 205 may apply to an actual Structure, or one or more of machinery 211; building support item 212; and utility support item 213.

The AVM 201 may take into account a proposed usage of a Deployment of a Structure based upon values for Deployment variables, and specify aspects of one or more of: machinery 211; building support item 212; and utility support item 213 based upon one or both of a proposed usage and values for Deployment variables. Proposed usage may include, for example, how many human resources will occupy a Structure, demographics of the resources that will occupy the Structure; percentage of time that the Structure will be occupied, whether the Structure is a primary residence, whether the Structure is a leased property and typical duration of leases entered into, environmental conditions experienced by the Structure, such as exposure to ocean salt, winter conditions, desert conditions, high winds, heavy rain, high humidity, or other weather conditions.

In another aspect, Deployment may relate to biometrics or other data associated with specific occupants of a Structure.

Accordingly, in some embodiments, Sensors may monitor biologically related variables of occupants and/or proposed occupants. The biometric measurements may be used to determine one or both of Lead Actions and Lag Metrics. Lead actions may include one or more of: use of specific building materials, selection of design aspects; Deployment of Structure equipment; Deployment of machinery; terms of a lease; length of a lease: terms of a maintenance contract; and Structure automation controls.

According to the present invention, design aspects and Structure materials 210 may also be based upon the proposed usage and values for Deployment variables. For example, a thicker exterior wall with higher insulation value may be based upon a structures location in an adverse environment. Accordingly, various demographic considerations and proposed usage of a Structure may be used as input in specifying almost any aspect of a Structure.

Total Cost of Deployment

In still another consideration, a monetary value for one or more of: a Total Cost of Deployment ("TCD"). Total Maintenance Cost ("TMC") and a desired return on investment ("ROI") for a Property may be used as input for one or more design aspects included in an AVM System 200. Total Cost of Ownership ("TCO"), TMC, and ROI may be used to determine optimal values of variables, including the quantities 202-205, 210-213 specified in an AVM System 200 and incorporated into an As Built Structure, and other improvements to a real estate parcel.

A TCD 214 may change based upon a time period 215 used to assess the TCD 214. A ROI may include one or more of: a rental value that may produce a revenue stream, a resale value, a cost of operation, real estate taxes based upon Structure specifications and almost any other factor that relates to one or both of a cost and value.

Desirable efficiency and Performance may be calculated according to one or more of: established metrics, measurement protocols and past experience. The AVM 201 and associated technology and software may be used to support a determination of a TCD. In another aspect, a TCD may be based upon an assembly of multiple individual metrics, procedures to assess metrics, procedures to adjust and optimize metrics and procedures to apply best results from benchmark operations. In the course of managing TCO, in some examples, initial steps may include design aspects that model an optimal design based upon TCO metrics and also model designed algorithms used to assess TCO metrics.

In the following examples, various aspects of TCD 214, Total Maintenance Costs, and associated metrics, are considered in the context of calculating a target TCD 214. Accordingly, the AVM may be used to perform TCD optimization.

A designed Structure is ultimately built at a site on a real estate parcel. A build process may be specified and provide metrics that may be used in a process designed by AVM 201 and also used as a physical build proceeds. In some examples, time factors associated with a physical build may be important, and in some examples time factors associated with a physical build may be estimated, measured and acted upon as they are generated in a physical build process. Examples of time factors may include, one or more of: a time to develop and approve site plans; a time to prepare the site and locate community provided utilities or site provided utilities; a time to lay foundations; a time to build Structure; a time to finish Structure; a time to install internal utilities and facilities related aspects; a time to install, debug, qualify and release equipment; times to start production runs and to certify compliance of production are all examples of times that can be measured by various techniques and sensing equipment on a Structure's site. Various time factors for a build are valuable and may become increasingly valuable as a physical build proceeds since the monetary investment in the project builds before revenue flows and monetary investments have clearly defined cost of capital aspects that scale with the time value of money.

Various build steps may include material flows of various types. Material flow aspects may be tracked and controlled for cost and efficiency. Various materials may lower a build materials cost, but raise time factors to complete the build. Logical variations may be calculated and assessed in an AVM 201 and optimal build steps may be generated and/or selected based upon a significance placed upon various benefits and consequences of a given variable value. Physical build measurements and/or sensing on physical build projects may also be used as input in an assessment of economic trade-offs.

The equipment deployed may incur a majority of a build cost depending upon user defined target values. The AVM may model and present alternatives including one or more of: cost versus efficiency, quality 240, time to build, life expectancy, market valuation over time. A cost to build may be correlated with cost to deploy and eventual resale. An overall model of a TCD 214 may include any or all such aspects and may also include external. In some examples, the nature of equipment trade-offs may be static and estimations may be made from previous results. In some other examples, changes in technology, strategic changes in sourcing, times of acquisition and the like may play into models of TCD 214.

In some examples, an initial efficiency of design which incurs large costs at early stages of a project may have a dominant impact on TCD 214 when time factors are weighted to real costs. In other examples, the ability of a Structure to be flexible over time and to be changed in such flexible manners, where such changes are efficiently designed may dominate even if the initial cost aspects may be less efficient due to the need to design in flexibility. As a Structure is built, and as it is operated the nature of changing customer needs may create dynamic aspects to estimations of TCD 214. Therefore, in some examples, estimates on the expected dynamic nature of demands on a Structure may be modeled against the cost aspects of flexibility to model expectations of TCD 214 given a level of change.

In some examples, factors that may be less dependent on extrinsic factors, such as product demand and the like may still be important metrics in TCD 214. Included in the As Built factors may be calculations such as HVAC temperature load, in which personnel and seasonal weather implications may be important. AVM models may include a user interface to receive value useful in the AVM models. In addition, electronic monitoring, via Sensors that may determine energy consumption, includes for example: electricity, fuel oil, natural gas, propane and the like may be useful for estimation and measurement.

Temperatures may be monitored by thermocouples, semiconductor junction based devices or other such direct measurement techniques. In other examples, temperature and heat flows may be estimated based on photon based measurement, such as surveying the Structure with infrared imaging or the like.

Utility load may be monitored on a Structure wide basis and/or at point of use monitoring equipment located at hubs or individual pieces of equipment itself. Flow meters may be inline, or external to pipes wires or conduits. Gases and liquid flows may be measured with physical flow measurements or sound based measurement. In other examples, electricity may be monitored as direct current measurements or inferred inductive current measurement.

In some examples, the nature and design of standard usage patterns of a Structure and an associated environment may have relevance to TCO. For example, usage that includes a larger number of ingress and egress will expose an HVAC system to increased load and usage that includes a significant number of waking hours with inhabitants in the building may incur increased usage of one or more of: machinery 211; building support items 212; and utilities 234.

The nature and measurement aspects of vibration in the Structure may also be modeled and designed as the Structure is built. There may be numerous means to measure vibrations from capacitive and resistive based measurements to optical based measurements that measure a subtle change in distance scale as a means of detecting vibration. Vibration may result from a Structure being located proximate to a roadway, train, subway, airport, tidal flow or other significant source of relatively consistent vibration. Vibration may also be more periodic, such as earthquake activity. In still another aspect, vibration may result from human traffic within the Property. The use of vibration monitoring Sensors may indicate various activities that take place within the Structure and facilitate more accurate modeling of a life expectancy of various aspects of the Structure as well as machines located within the Structure.

Noise levels are another type of vibrational measurement which is focused on transmission through the atmosphere of the Structure. In some cases, noise may emanate from one location after moving through solid Structure from its true source at another location. Thus, measurement of ambient sound with directional microphones or other microphonic sensing types may be used to elucidate the nature and location of noise emanations. In some cases, other study of the noise emanations may lead to establishment of vibrational measurement of different sources of noise. Floors, ceilings, doorways, countertops, windows and other aspects of a Structure may be monitored in order to quantify and extrapolate noise levels. Noise and vibrational measurement devices may be global and monitor a region of a Structure, or they may be inherently incorporated into or upon individual equipment of the Structure.

In some examples, models of a Structure (including original models and As Built Models) may include routings of pipes, wires, conduits and other features of a Structure and the installed equipment within the Structure. Together with models of the building structure and the equipment placed in the building the various routed structures may be married in a detailed AVM 201.

In another aspect, an AVM 201 may include conflicts between the physical structures may be detected and avoided in the design stage at far improved cost aspects. In some examples, a designer may virtually ascertain a nature of the conflict and alter a design in virtual space to optimize operational aspects. Additionally, in some embodiments, an As Built Model may be generated during and after a Structure is built for various purposes. In some examples, a technician may inspect a Structure for conformance of the build to the designed model. In other examples, as an As Built Structure is altered to deal with needed changes, changes will be captured and included in the As Built AVM 201.

In another aspect of the present invention, the AVM 201 may be used to generate a virtual reality model of a Property, including one or more structures that may be displayed via user interface that includes an immersion of the user into a virtual setting. Immersion may be accomplished, for example, via use of a virtual reality headset with visual input other than a display screen is limited. In some embodiments, a virtual setting may be generated based upon a location of the user. For example, GPS coordinates may indicate a Property and a user may wear a headset that immerses the user in a virtual reality setting. The virtual reality setting may display one or more virtual models of structures that may be potentially constructed on the Property.

Embodiments may include models generated, standard modeling software such as BIM 360™ field which may support the display of a Structure design in a very complete level of detail. Modeling of a Structure in its location or proposed location, or in multiple proposed locations, may be useful from a TCO perspective, especially from an evaluation of the nature of a site layout including real estate property parcel options and the like.

In some examples, a virtual display observed in the field at the site of an As Built or proposed build may allow for design changes and design evaluations to be viewed in a space before build is completed. For example, a Structure may be completed to the extent that walls, floors and ceilings are in place. A user may utilize a virtual display to understand the layout difference for different designs and the designs may be iterated from designs with the least flexibility to more flexible yet more complex designs.

In some examples, the design systems may include various types of features such as building structure, walls, ducts, utilities, pipes, lighting, and electrical equipment. The design systems are augmented with As Built Data and Experiential Data.

The design and modeling systems may be utilized to simulate and project cost spending profiles and budgeting aspects. The modeling systems may therefore be useful during the course of an audit, particularly when comparing actual versus projected spending profiles. The comparison of various spend sequencing may be used to optimize financing costs, maintenance, refurbishing and sequencing. The AVM 201 may be useful to provide early estimates, and for cost tracking versus projections which may be visualized as displays across a virtual display of the building, facilities and equipment.

Energy/Utilities Cost

There may be numerous examples of tradeoffs in sources of electric energy to a Structure. For example, a site may be designed with various utility supplies for power, with tailored power management systems to balance the capacitance and impedance of the effective load to minimize electricity cost. In addition, various alternative forms of electric energy may be assessed and designed. Solar, geothermal and wind-generated electric power may make economic sense under certain conditions and may have time of day and seasonal relevance. The design of flexible support facilities for the installation of initial energy generation capacity with provision for the addition of additional capacity may be assessed. In some instances, backup power generation may be designed to ensure that a Structure may run at some level for a certain period of time. In some cases, this may allow for continued production, in other examples, backup power may give a Structure the time to idle and shut down capacity in a safer and less damaging manner.

In some examples, an energy source for heating, cooling, humidification and dehumidification equipment may be modeled and managed. In some examples, a source of energy used may be one or more of electric, natural gas, propane, fuel oil or natural gas. Emergency backup may also be modeled and managed. Various choices between electric sources. Solar and fuel based energy consumption may be modeled and controlled based on upon market forecasts. Estimates may be periodically adjusted according to world and/or market events.

Enhanced inspection, and guidance capabilities enabled via ongoing electronic Sensor measurements may facilitate one or more of: maintenance, expansion and optimization of Structure features, Property equipment and maintenance models. Ongoing monitoring via Sensor data collection also increases knowledge of machines and operations, or other useful capacities towards knowing the state of the Structure.

Decisions related to maintenance of equipment and facilities may be important decisions that modeling and operational management systems support. The various cost elements that may go into modeling may include, for example, one or more variables related to consumables, such as: a cost of consumables; frequency of replacement 241, quantity of consumables 242, life of replaced parts, nature of failures of different part types; manpower associated with planned and unplanned maintenance and expected and actual life of equipment Inside of a functional Structure, augmented reality functions viewable in an AVM 201 including an AVM may be used to guide operators, surveyors, repair workers, or other individuals, through the Structure. As one non-limiting example, a tablet, mobile device, or other small device with a screen, imaging, and other sensing capabilities may be used in an augmented reality fashion towards this function.

As described above, facing a mobile device towards an area in a Structure and movement of the mobile device in a particular pattern may be used to ascertain a specific area of the Structure for which AVM 201 data should be accessed. A combination of one or more of: image, location, orientation, and other Sensors may also be used to identify to the mobile device, which wall segment, building aspect, machinery or equipment the device is identifying. A location of mobile device, a height and an angle of view may also be utilized to determine aspects of the Structure for which a virtual model is being requested.

In some embodiments, a user may be presented with various layers of data, including, for example, one or more of: structural aspects of the Structure, plumbing, electrical, data runs, material specifications or other documentation, including but not limited to: basic identifying information, installation information, service records, safety manuals, process records, expected service schedule, among many other possibilities.

A plurality of information may be thus easily accessible inside the Structure, and may be used for a variety of functions, including finding a specific machine to then diagnose and service a problem, regular inspection of equipment, guided tours of the Structure, or many other functions. This information may be conveyed to the individual in a plurality of possible formats, such as lists that show up on the screen, clickable icons that show up next to the equipment in a Virtual Reality ("VR") camera feed, or many other possibilities. These functions may also be accessible in a hands-free VR format with a VR headset, or other such device.

As the user is inside a Structure, the user may receive a plurality of information, instructions, etc. while the user is proximate to the various aspects of the structures. For example, the viewing machines themselves, seeing them work, hearing the sounds they make, etc. to better inspect or service, among other possible functions, the Structure's equipment. With VR systems, similar travel, guidance, or inspection capabilities for a functional Structure may be achieved completely remotely from the Structure itself. Additionally, with VR systems, these capabilities may occur prior, during, or after the construction and deployment of a Structure.

A VR system may constitute a headset or lens system with stereoscopic viewing capabilities, a sound conveying means, such as headphones, and various forms of user input, such as a handheld controller or foot pedals as non-limiting examples. Various forms of imaging, surveying, or modeling technology may be used to generate virtual models of a functional Structure. As a non-limiting example, exploring such a model with a VR system may be used to examine layout, functioning, or other parameters of a Structure before its construction. As an alternative non-limiting example, exploring a model possibly generated by sensing technology in real time, or over a period of time prior to viewing with a VR system, may allow for inspection or demonstration capabilities in a location entirely remotely from the actual Structure itself. This may include both imagery and sounds captured within the Structure.

Collection of data may additionally include actual service life experienced and performance of equipment used in an AVM which thereby enables enhanced modeling of a life expectancy of equipment included in an AVM 100 and an As Built Structure. Various Sensors may gather relevant data related to one or more of: use of machinery and equipment, performance of machinery items of equipment and an ambient environment inside or proximate to machinery and equipment. In addition, an unstructured query relating to the functioning or life expectancy of equipment may be generated by a processor to access and interpret data, thereby deriving relevant input to a decision maker based upon analysis of the data.

Various examples of data to be acquired, relating to life expectancy of equipment, may include, but is not limited to, hours of operation, conditions of operation (whether and how long the equipment may be running under capacity, at rated capacity, or over capacity), or many environmental conditions for operation; environmental conditions may include the ambient temperature (or the difference in ambient temperature from an ideal or other measured value), ambient humidity (or the difference in ambient humidity from an ideal or other measured value), ambient air particulate content (or a comparison of the current air particulate level to a filter change schedule), presence or concentration of ambient gasses (if relevant) such as carbon dioxide, or other gas, a number of times of ingress or egress into the Structure which may change ambient conditions or other trackable data.

Identification of Equipment

Identification capabilities may be facilitated or improved for one or more of: structural aspects, machinery, equipment and utility support within the Structure. This identification may take many forms through various means of query and communication, and may be facilitated through various hardware and/or software means.

Non-limiting examples may include image based identification; a device with some imaging means, including but not limited to a mobile device camera, tablet device camera, computer camera, security camera, or AR headset camera may image the equipment to be identified. Image recognition software may be used to identify the visualized equipment by its identifying features. Machine learning may be used to train systems using this software to identify specific features of the equipment in question. Other types of visual identifiers including but not limited to QR codes, may be used to visually identify equipment.

An additional non-limiting example may include location-based identification; a device with some location means, including but not limited to GPS, internal dead-reckoning, or other means, may be used to determine a location within a Structure. Identifying information for equipment at or near the measured location may be accessed for assessment, based on its proximity to the location based signal.

An additional non-limiting example may also include direction-based identification; with a fixed location, or in tandem with a location means, a device may have capabilities to deduce orientation based information of the device, as discussed herein. This orientation information may be used to deduce a direction that the device is pointing in. This direction based information may be used to indicate that the device is pointing to a specific piece of equipment that may be identified.

An additional non-limiting example may also include As Built Sensor and Sensor-generated Experiential Data-based identification; identifying information for various equipment may be stored and accessed within a database storing this information. This information may be accessed by various means by a user with certain qualification to that information.

An additional non-limiting example may include tag based identification; identifying information for various equipment may be accessed through proximity to many non-limiting examples of tagging capabilities, such as magnetic tags, bar code tags, or others. These tags may contain the information in question, or may reference the location of pertinent information to the owner, in order to convey this information to the owner.

In an additional non-limiting example, data aggregation may include Sensors generating data that is associated with an IoT (Internet of Things) based identification. Various IoT devices (or Sensors) may include a digital storage, processor and transmitter for storing and conveying identifying information. Upon request, an IoT device may relay identifying information of itself to a human with a communicating device, or to its neighbors. It may also possibly convey information received from and/or sent to other internet connected devices as well.

Data is aggregated and stored for reference in calculation of Cost of Upkeep considered in a TOC and may include data related to some or all of:
Documented items covered;
Long term warranty for Structure/building ownership;
Items included in purchase price;
Financed amounts;
Tax implications;
Capital value;
Ability to expand Structure and/or structural features such as baths or kitchens;
Lateral dimensions;
Vertical dimensions;
Building support systems;
Utilities;
Electric;
Water;
Discharge;
Aggregate Data;
Multiple similar Structures;
Disparate Structure types;
Same geographic area;
Disparate geographic areas;
Locations of Machines and Equipment;
GPS (may be used in combination with other location technologies;
Near-field communication with reference point emitter in Structure;
WiFi;
RFID;
Reflector tags;
"Visual" recognition identifiers, i.e. hash code and barcode; and
Directional information, such as from accelerometers in combination with visual recognition identifiers.

As per the above listing, functionality may therefore include modeled and tracked Performance of a Structure and equipment contained within the Structure, including consumables 233 used and timing of receipt and processing of consumables; modeled and actual maintenance 232, including quality of maintenance performed; equipment Performance including yields; Consumables 233 tracking may include a frequency of replacement and quantity of replaced consumables; Utilities 234 tracking may include projected and actually units of energy consumed.

3D Scanning & Model Development

In one aspect of the present invention data related to the position and identity of substantial elements of a Structure are first designed and then recorded in their actual placement and installation. This may include locations of building features, such as beams, walls, electrical junctions, plumbing and etc. as the Structure is designed and constructed. As part of the Structure model, laser scanning may be performed on site at various disparate times during construction. An initial scan may provide general information relating to the location of the Structure in relationship to elements on the Property such as roadways, such as electricity, water, gas and sewer to identify non-limiting examples.

Additional events for scanning may occur during the construction process in order to capture accurate, 3D As Built point cloud information. Point cloud may include an array of points determined from image capture and/or laser scanning or other data collection technique of As Built features. In some examples, captured data may be converted into a 3D model, and saved within a cloud-based data platform.

In some examples other methods of capturing spatially accurate information may include the use of drones and optical scanning techniques which may include high resolution imagery obtained from multiple viewpoints. Scanning may be performed with light based methods such as a CCD camera. Other methods may include infrared, ultraviolet, acoustic, and magnetic and electric field mapping techniques may be utilized.

Structure-related information may include physical features generally associated with an exterior of a Structure such as geo-location, elevation, surrounding trees and large landscaping features, underground utility locations (such as power, water, sewer, sprinkler system, and many other possible underground utility features), paving, and pool or patio areas. Structure related information may also include features generally related to a Structure such as underground plumbing locations, stud locations, electrical conduit and wiring layouts, vertical plumbing piping, and HVAC systems or other duct work. The acquisition of the data may allow the model system to accurately locate these interior and exterior features. Acquisition of As Built Data during different points of the construction completion allows measurements to be taken prior to aspects involved in a measurement process being concealed by concrete, drywall or other various building materials.

Data is acquired that is descriptive of actual physical features as the features are built and converted into a 3D model which may be referred to as the "As Built" model. The As Built model will include "key components" of the Structure and be provided with a level of artificial intelligence that fully describes the key component. In some embodiments, the As Built model may be compared to a design model. In some implementations "intelligent parameters" are associated with key components within the 3D model. For example, key components and associated information may further be associated with intelligent parameters. Intelligent parameters for the key components may include the manufacturer, model number, features, options, operational parameters, whether or not an option is installed (and if so, its features and dimensions), any hardware associated with the key component (and its manufacturer and serial number), an owner's manual and service contract information, as non-limiting examples. Intelligent parameters associated with a functional key component such as, HVAC Equipment, may include the manufacturer, model number, capacity, efficiency rating, serial number, warranty start date, motor size, SEER rating, an owner's manual associated with the equipment, and service contract information.

Key components of the Structure may have an identification device such as a two or three dimensional graphical code (such as a QR code label) or an RFID chip attached that is accessible to a user, such as a Structure owner, Structure builder or service technician. When scanned with an apparatus capable of reading the code, a user interface on a display of various types, such as a tablet, may use the associated identification, such as a QR code, to provide direct access to related information. In some examples, the display may show textual or tabular representations of related data.

In other examples, graphical data such as images, drawings, and the like may be displayed. In still further examples, both graphical and textual displays may be associated with the code. Although a QR code may provide an example, other identification technologies such as RFID or IoT communication protocols with associated stored information, and other devices that can receive a signal and respond with stored information may be used. As well, numerous other types of graphical codes in addition to QR code may be read by a device and provide a connection between a key component, machinery, location and other identified aspect and associated data. In some examples, an image based code may be displayed using paints or pigments which are not visible to the human eye, such as in a non-limiting example ultraviolet pigments. In some other examples, a paint or pigment may not be visible until it is made to emit visible light by irradiating it with a particular band of electromagnetic radiation, such as, for example, ultraviolet light.

In some examples, key components may include doors, windows, masonry, roofing materials, insulation, HVAC equipment and machinery.

An automated design and monitoring (sometimes known in the art as "RDM") system may support dynamic updating of tracked aspects. For example, as a Structure owner acquires new or additional key components, such as machinery, HVAC, plumbing additions, key components may be added into the As Built model and the key components may be tracked as a part of the model. Other aspects may be dynamically updated such as when additions are made to the building Structure or when internal components of the Structure are rebuilt, as non-limiting examples.

Since the As Built model includes information in a database and dynamic model functionality exists that commences as a building Structure is being constructed, the model may assume new support aspects to the construction process itself. For example, a benefit from the definition and utilization of many components within a Structure utilizing the system herein includes the ability to pre-cut and/or pre-fabricate studs and framing, roofing cuts, masonry, under-slab plumbing, HVAC ductwork, electrical, and other such components. The dimensions of these various components may be dynamically updated based on an original model that may be compared to the actual fabricated Structure as realized on a building site. In some examples a Structure builder may use a display interface associated with the system and model to display a comparison of an original set of building plans to a current Structure at a point in time which may allow the builder to authorize any structural changes or variances to design and thereafter allow the description of following components to be dynamically adjusted as appropriate. The system may be of further utility to support various inspections that may occur during a building project which may associate detected variances with design expert review and approval. An inspector may be able to utilize the system as allowed on site or remotely.

As the system is utilized during construction, orders for customized components may be placed. These customized components may be labeled and delivered to site, in an appropriate sequence, for assembly by carpenters. This may contribute to a minimization of waste at the worksite, as well as provide a work product that is entirely consistent with a pre-determined model which may have approved changes that are tracked. The result may improve the quality of the work product, and make it easier to generate the measured point-cloud 3D model.

Performance Tracking

In another aspect, the AVM system can autonomously and/or interactively obtain, store and process data that is provided to it by components of the Structure as the Structure is built, installed or additions are made to the Structure. The generation, modeling, capture, use, and retention of data relating to Performances in specific equipment or in some cases aspects relating to the design of a facility, may be monitored by the system.

In some examples, Operational Performance may be assessed by processing sampled data with algorithms of various kinds. Feedback of the status of operation and of the Structure as a whole or in part, as assessed by algorithmic analysis may be made to a Structure owner or a Structure builder. In addition, a variety of data points gathered via appropriate Sensors, visual and sound data may be recorded and stored and correlated to 3D models of the facility. Experiential Sensor readings may include, by way of non-limiting example: temperature, power usage, utilities used, consumables, product throughput, equipment settings, equipment Performance measurement, and visual and audible data. Techniques to record data points may involve the use of one or more of: electronic Sensors, electromechanical Sensors, CCD capture devices, automated inspection equipment, video camera arrays and audio microphones and arrays of audio microphones for the capture and processing of data that may be used to generate visualizations of actual conditions, either on site or at a remote location. In addition, data may be collected, retained, analyzed, and referenced to project facility Performance.

In some examples, data may also be combined with manufacturer equipment specifications and historical data to model expectations related to actual operation of the Structure and property aspects.

Virtual Maintenance Support

A 3D model of a Structure, which may be integrated with information related to the key components and laser scanned location information, may be made available to the Structure owner/Structure builder through a computer, an iPad or tablet, or other Smart Device. The resulting system may be useful to support virtual maintenance support.

The 3D model may support enhancement to the two dimensional views that are typical of paper based drawings. Although 3D renderings are within the scope of information delivered in paper format, a 3D electronic model may render dynamic views from a 3D perspective. In some examples, the viewing may performed with viewing apparatus that allows for a virtual reality viewing.

In some examples, a viewing apparatus, such as a tablet or a virtual reality headset, may include orienting features that allow a user such as a Structure owner, Structure builder, inspector, engineer, designer or the like to view aspects of a model based upon a location, a direction, a height and an angle of view. A current view may be supplemented with various other information relating to features presented in the view. In some examples, the interface may be accessible through a virtual reality headset, computer, or mobile device (such as an iPad, tablet, or phone), as non-limiting examples. Utilizing a device equipped with an accelerometer, such as a virtual reality headset or mobile device, as non-limiting examples, a viewable section of the model may be displayed through the viewing medium (whether on a screen, or through a viewing lens), where the viewer's perspective changes as the accelerometer equipped device moves, allowing them to change their view of the model. The viewer's Vantage Point may also be adjusted, through a certain user input method, or by physical movement of the user, as non-limiting examples.

The presented view may be supplemented with "hidden information", which may include for example, depictions of features that were scanned before walls were installed including pipes, conduits, ductwork and the like. Locations of beams, headers, studs and building Structure may be depicted. In some examples, depiction in a view may include a superposition of an engineering drawing with a designed location, in other examples images of an actual Structure may be superimposed upon the image based upon As Built scans or other recordations.

In a dynamic sense, display may be used to support viewing of hypothetical conditions such as rerouted utilities, and rebuild walls and other such Structure. In some examples, graphical or text based data may be superimposed over an image and be used to indicate specifications, Performance aspects, or other information not related to location, shape and size of features in the image.

As presented above, an image may allow for a user to "see through walls" as the augmented reality viewing device simulates a section of a model associated with a space displayed via the VR viewing device. The viewer's perspective may change as an accelerometer in the VR viewing device moves. A user may also change a view of the AVM, to include different layers of data available in the AVM. The viewer's Vantage Point may also be adjusted by moving about a physical space that is represented by the model. To achieve this, it may be possible to incorporate positioning hardware directly into a building represented by the virtual model. The positioning hardware may interface with an augmented reality device for positioning data to accurately determine the viewing device's orientation and location with millimeter precision. The positioning hardware may include, for example a radio transmitter associated with a reference position and height. Altitude is differentiated from height unless specifically referenced since the relative height is typically more important to AVM viewing.

Accordingly, a user may access the AVM on site and hold up a Smart Device, such as an iPad or other tablet, and use the Smart Device to generate a view inside a wall in front of which the Smart Device is positioned, based upon the AVM and the location, height and direction of the Smart Device position.

In some examples, through the use of an augmented reality device, it may also be possible to view data, such as user manuals, etc. of associated devices in the view of a user, simply by looking at them in the viewing interface. In other examples, there may be interactive means to select what information is presented on the view.

Various electronic based devices implementing of the present invention may also be viewed in a virtual reality environment without accelerometer such as a laptop or personal computer. A viewable section of a model may be displayed on a Graphical User Interface (GUI) and the viewer's Vantage Point may be adjusted, through a user input device.

The ability to track machinery and other components of a system and store the components associated information, such as, for example user manuals and product specifications and part numbers, may allow for much more efficient use and maintenance of the components included within a Structure. As well, the system model may also maintain Structure owner manuals and warranties and eliminate the need for storage and tracking of hard copy manuals.

In a non-limiting example, if a structure owner/structure builder desires information related to an machinery, it may be found by positioning a device with a location determining the device within it in proximity to the machinery and accessing the parallel model in the Virtual Structure such as by clicking on the machinery in the Virtual Structure model or by scanning the Code label attached to machinery. In some examples, an internet of things equipped machine may have the ability to pair with a user's viewing screen and allow the system model to look up and display various information. Thus, the user may have access to various intelligent parameters associated with that machinery such as service records, a manual, service contract information, warranty information, consumables recommended for use such as detergents, installation related information, power hooked up and the like.

In some examples, an AVM system may include interfaces of various kinds to components of the system. Sensors and other operational parameter detection apparatus may provide a routine feedback of information to the model system. Therefore, by processing the data-stream with various algorithms autonomous characterization of operating condition may be made. Therefore, the AVM system may provide a user with alerts when anomalies in system Performance are recognized. In some examples, standard Structure maintenance requirements may be sensed or tracked based on usage and/or time and either notification or in some cases scheduling of a service call may be made. In some examples, the alert may be sent via text, email, or both. The Structure user may, accordingly, log back into the Virtual Structure to indicate completion of a maintenance task; or as appropriate a vendor of such service or maintenance may indicate a nature and completion of work performed.

By detecting operational status, a Virtual Structure may take additional autonomous steps to support optimal operation of a system. A Virtual Structure may take steps to order and facilitate shipping of anticipated parts needed for a scheduled maintenance ahead of a scheduled date for a maintenance event (for example, shipping a filter ahead of time so the filter arrives prior to the date it is scheduled to be changed). In another example, a Virtual Structure may recall notes from an Original Equipment Manufacturer (OEM) that could be communicated to a user through the Virtual Structure. In still further examples, a Virtual Structure may support a user involved in a real estate transaction by quantifying service records and Performance of a real property.

In still another aspect the AVM may establish a standard maintenance and warranty program based on manufacturers published data and the ability to advise Structure owners of upcoming needs and/or requirements. In other examples, the model system may facilitate allowing for Structure builders, rental companies, or maintenance companies to consolidate information for volume discounts on parts or maintenance items. The model system may also facilitate minimizing unnecessary time expenditure for Structure builders hoping to minimize needless service calls for warranty issues, and allowing Structure builders and rental companies attempting to sell or rent a Structure to demonstrate that care has been taken to maintain a Structure.

Benefits derived from monitoring and tracking maintenance with a Virtual Structure may include positively reassuring and educating lenders and/or lien holders that their investment is being properly cared for. In addition, insurance companies may use access to a Virtual Structure to provide factual support that their risk is properly managed. In some examples, a data record in a Virtual Structure model system and how an owner has cared for its facility may be used by insurance companies or lenders to assess risk. Maintenance records demonstrating defined criteria may allow insurance companies to offer a Structure owner policy discount, such as, for example, installation of an alarm system. Additionally, access to a Virtual Structure may allow municipalities and utilities to use the information for accurate metering of utility usage without having to manually check; and peaks in utility demand may be more accurately anticipated.

In some examples, a Virtual Structure may also be used to assist with Structure improvement projects of various types. In some examples, the Structure improvement projects may include support for building larger additions and modifications, implementing landscaping projects. Smaller projects may also be assisted, including in a non-limiting example such a project as hanging a picture, which may be made safer and easier with the 3D "as-built" point cloud information. Hidden water piping, electrical conduits, wiring, and the like may be located, or virtually "uncovered", based on the model database.

Optimization of Structures

During construction of a Structure corresponding to a Virtual Structure, discrete features of the As Built Structure may be identified via an identification device such as an IoT device or a QR code label. The ID device may be integrated to the feature or added during the build scope. Performance monitors may also be simultaneously installed to allow monitoring of Key Performance Indicators ("KPIs") for selected features. In an example, an HVAC system may be added to a Structure during construction and a simultaneously a Performance monitor may be added to the HVAC system. The Performance monitor may be used to monitor various KPIs for an HVAC system. These KPI may include outdoor air temperature, discharge air temperature, discharge air volume, electrical current, and the like. Similar monitoring capabilities may be installed to all machinery and utilities systems in a facility. The combination of these numerous system monitors may allow for a fuller picture of the efficiency of operations of various systems.

Use of the Virtual Structure, which may include data values contributed from communication of data from the various monitoring systems, may allow owners to receive periodic reports, such as in a non-limiting sense monthly emails which may show their current total energy consumption as well as a breakdown of what key components are contributing to the current total energy consumption.

The systems presented herein may be used by owners and facility managers to make decisions that may improve the cost effectiveness of the system. An additional service for Owners may allow the Structure owner to tap into energy saving options as their Structure ages. As an example, if a more efficient HVAC system comes on the market, which may include perhaps a new technology node, the user may receive a "Savings Alert". Such an alert may provide an estimated energy savings of the recommended modification along with an estimate of the cost of the new system. These estimates may be used to generate a report to the owner of an estimated associated ROI or estimated payback period should the Structure owner elect to replace their HVAC system.

In some examples, an AVM of a Virtual Structure may set a threshold value for the required ROI above which a stakeholder may be interested in receiving such an alert with that ROI is achieved. This information will be based on data derived from actual operating conditions and actual historical usage as well as current industry information. Predictive maintenance and energy savings to key systems via Smart Structure-branded Sensors.

Aggregating Data from Multiple Residences

With the ability to collect and utilize relevant Structure information with the model system, the aggregation of data and efficiency experience from numerous systems may allow for analysis of optimization schemes for various devices, machinery and other Structure components that includes real installed location experience. Analysis of the aggregated data may be used to provide feedback to equipment manufacturers, building materials fabricators and such suppliers.

In some examples, business models may include providing anonymous and aggregated data to original equipment manufacturers as a service model to give the OEMS an ability to utilize more data to monitor and improve their products. In some examples, OEM advertising may be afforded access through the model system. Manufacturers may have an additional side benefit motivating the use of this data related to improving their equipment cost effectives and reliability in order to minimize warranty cost. Such optimized Performance may also provide benefits to both Structure owners and builders to support their ability to track actual warranty information, power cost, and overall Performance of a Structure.

Methods and Apparatus

Figure 3A:
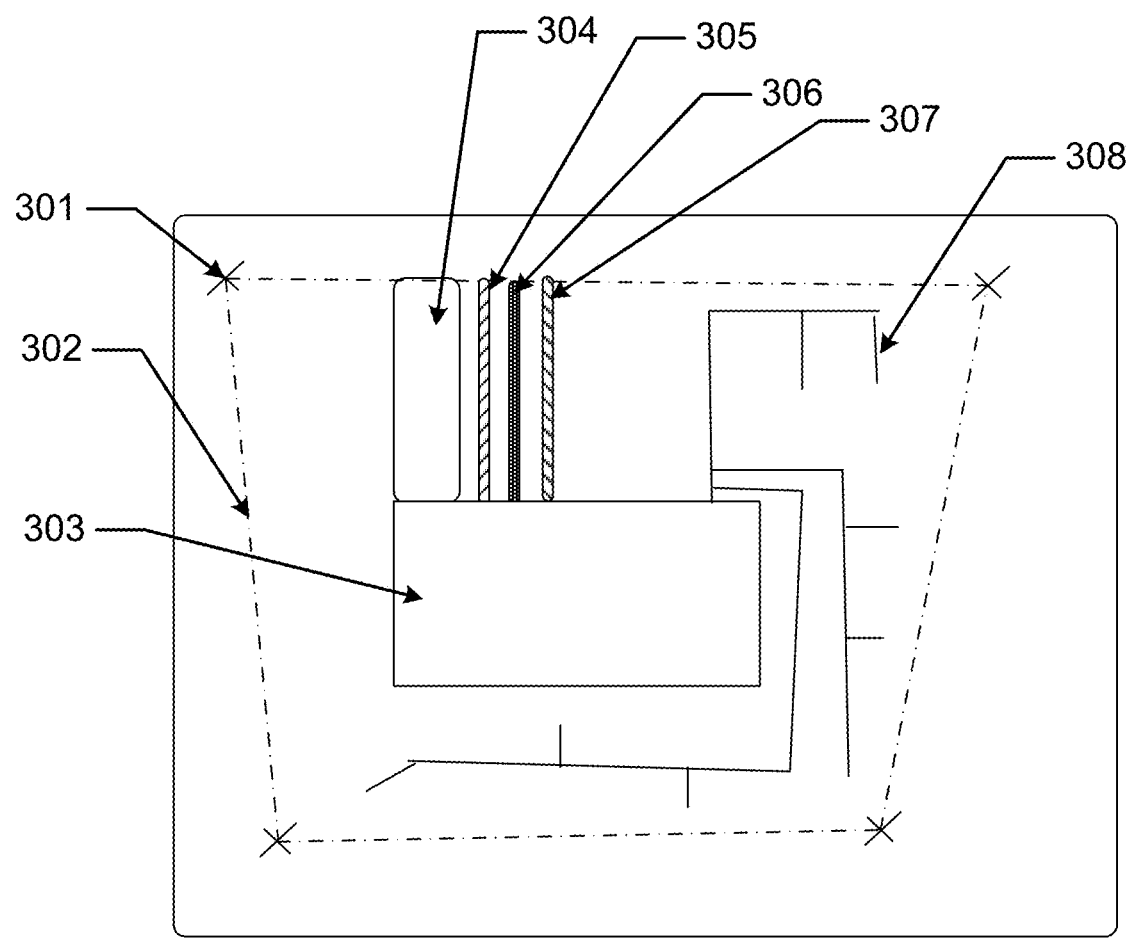
FIGS. 3A-3F illustrate exemplary aspects of collecting and displaying data of a Structure generated during construction of the Structure.

Referring to FIGS. 3A-3F, an illustration of the collection of data by scanning a facility during its construction is provided. In FIG. 3A, a depiction of a site for building a facility Structure is illustrated. The depiction may represent an image that may be seen from above the site. Indications of property boundaries such as corners 301 and property borders 302 are represented and may be determined based on site scanning with property markings from site surveys or may be entered based on global coordinates for the property lines. An excavated location 303 may be marked out. Roadways, parking and/or loading areas 304 may be located. Buried utilities such as buried telephone 305, buried electric 306, buried water and sewer 307 are located in the model as illustrated. In some examples, such other site service as a buried sprinkler system 308 may also be located.

Figure 3B:
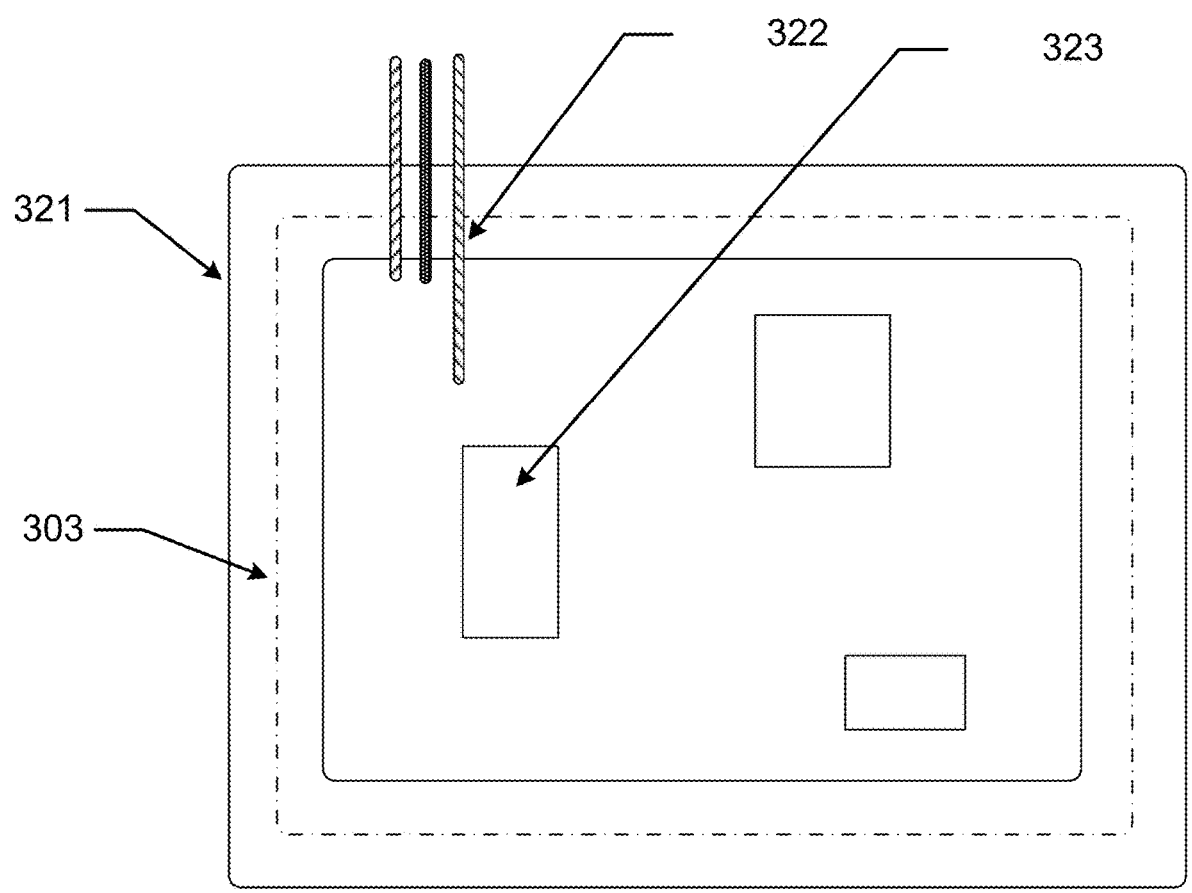

Referring to FIG. 3B the excavated location 303 may be scanned or imaged to determine the location of foundation elements. In some non-limiting examples, a foundational footing 321 along with buried utilities 322 is illustrated. The buried utilities may include such utilities as electric lines, water supply whether from a utility or a well on location, sewer or septic system lines, telecommunications lines such as telephone, cable and internet. Other footing elements 323 may be located at structural requiring locations as they are built. In some examples a scanning system may provide the locational orientation relative to site orientation markings. In other examples, aerial imagery such as may be obtained with a drone may be used to convert features to accurate location imagery.

Figure 3C:
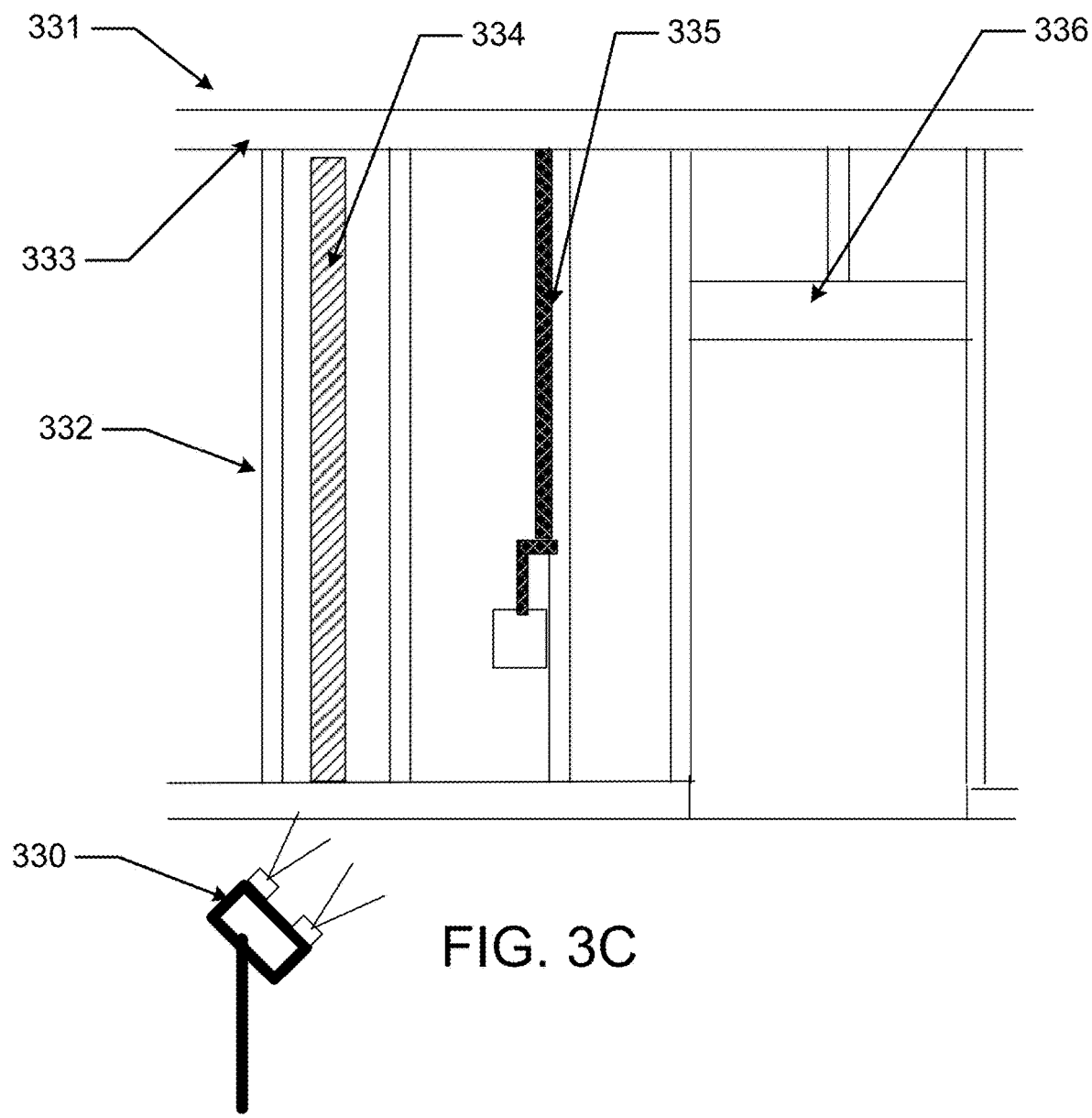

Referring to FIG. 3C, a wall 331 of the Structure in the process of build is illustrated. The Structure may be scanned by a scanning element 330. In some examples, a laser 3D scanner may be used. The wall may have supporting features like top plates 333, headers 336, studs 332, as well as internal items such as pipes 334, electrical conduits and wires 335. There may be numerous other types of features within walls that may be scanned as they occur or become present, such as air ducts, data cables, video cables, telephone cables, and the like.

Figure 3D:
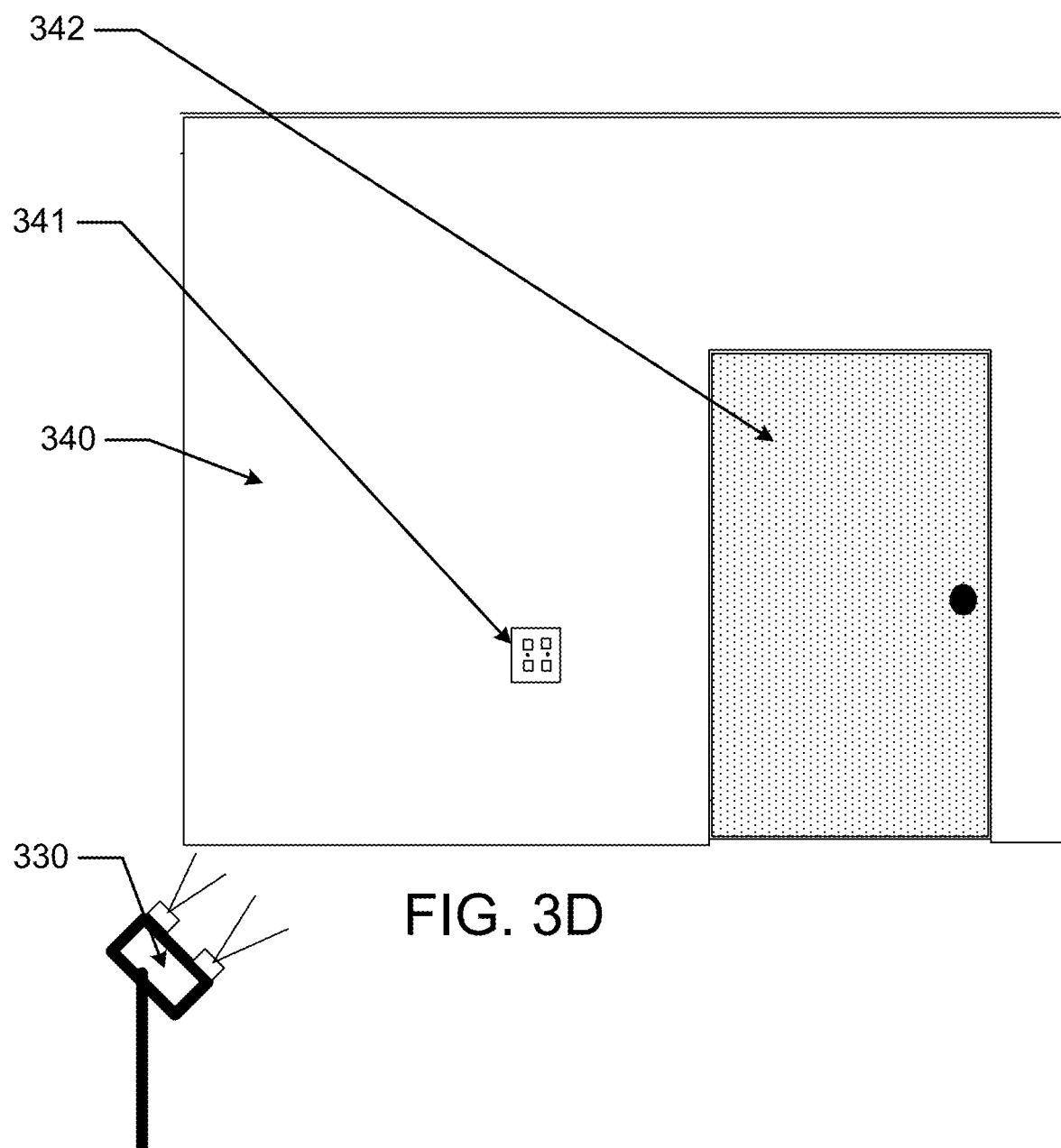

Referring to FIG. 3D, the wall may include Structure components behind wall facing 340, which may cease to be visible. Electrical outlets 341 and door Structures 342 may be scanned by a scanning element 330.

Figure 3E:
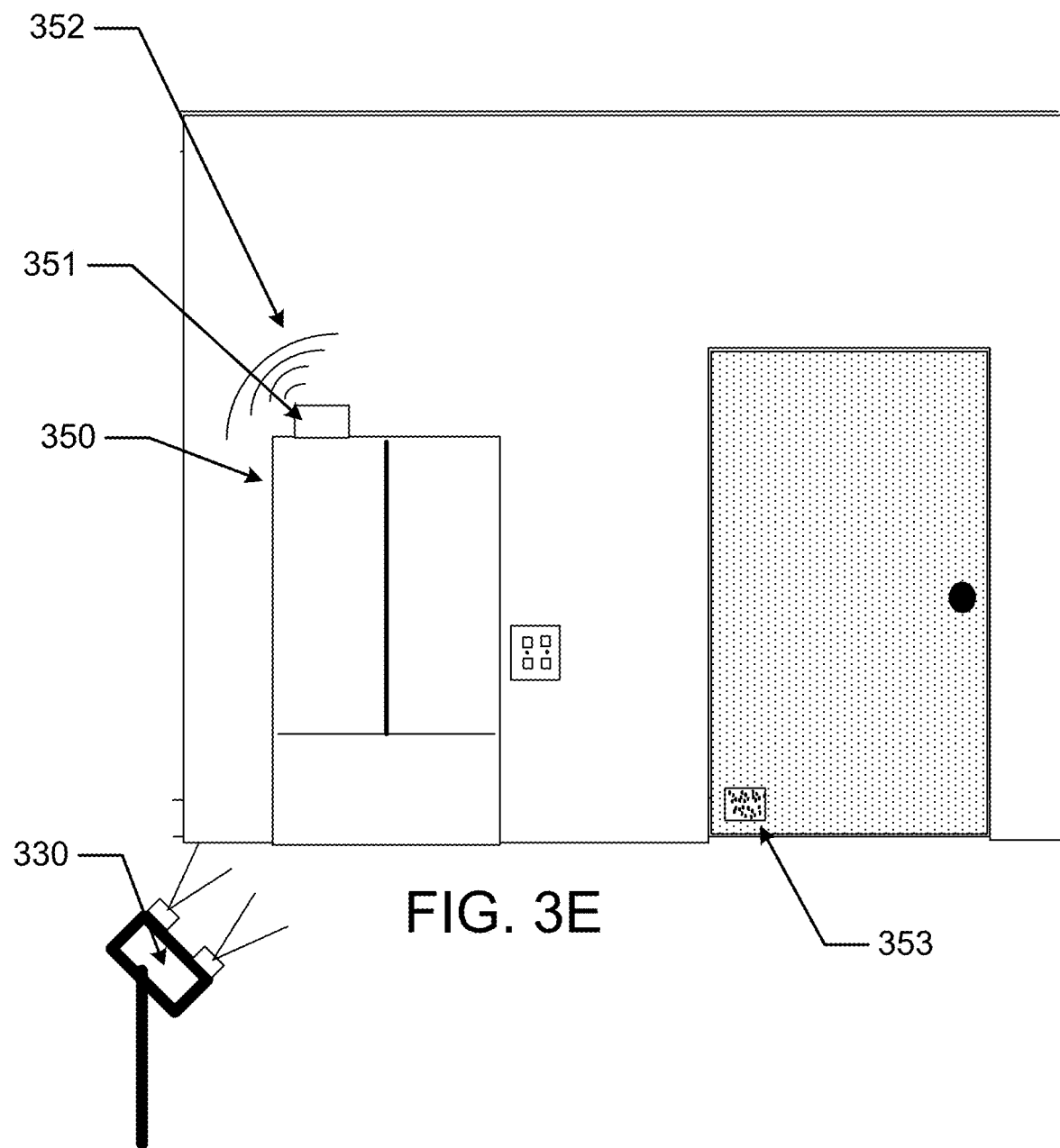

Referring to FIG. 3E internal components such as machinery may be installed. As a non-limiting example, a machine 350 may be installed and the resulting 3D profiles may be scanned by a scanning element 330. In some examples, an operational monitor 351 may be attached to the machinery. In some examples, an operational monitor may be part of the machinery. The operational monitor 351 may have the ability to communicate 352 data to various receivers that may be connected to the model system of the residence. In some examples, key structural components, such as doors, may have identifying devices such as a QR label 353. The label may be visible or painted into the Structure with non-visible paint. The identifying devices may provide information related to the device itself and warrantees of the device as non-limiting examples.

Figure 3F:
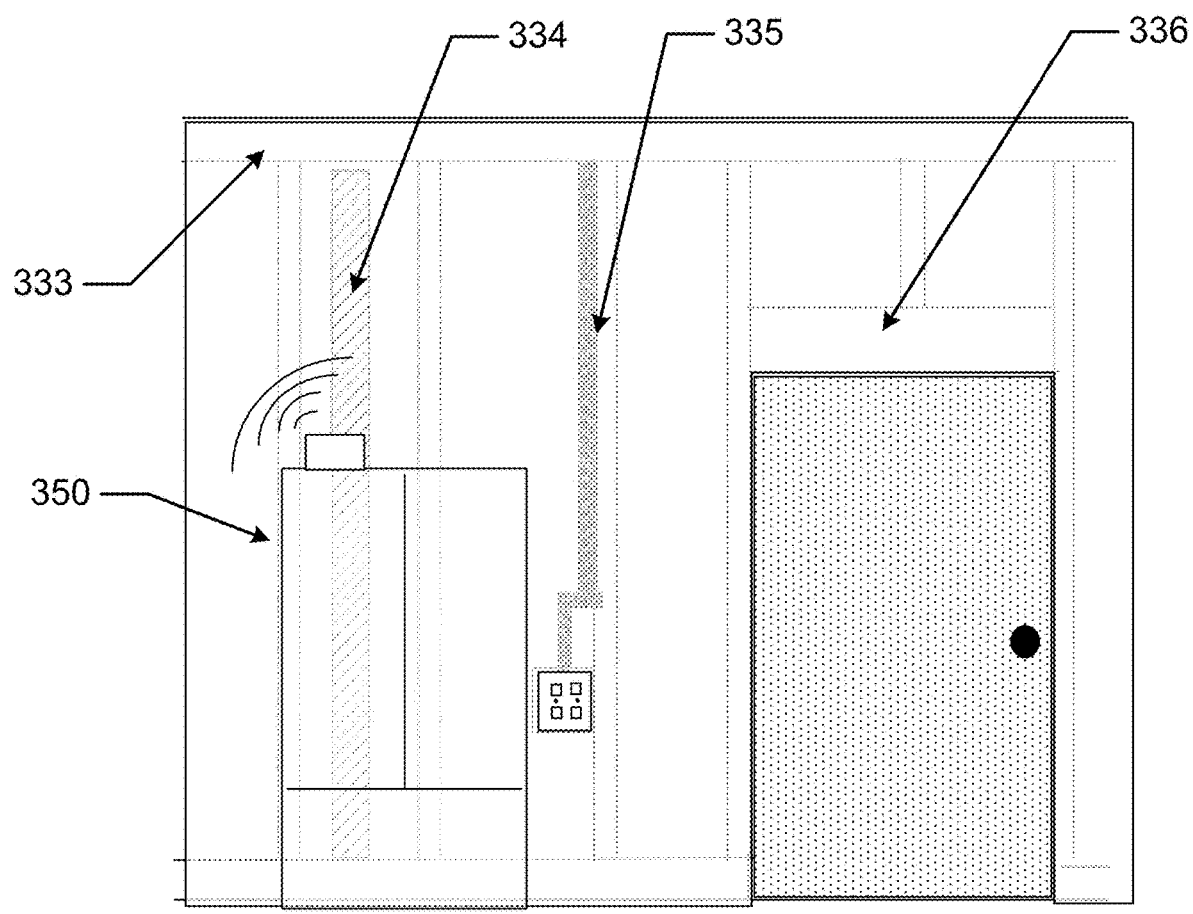

The model may include the various Structure elements hidden and visible and may be used to create output to a display system of a user. Referring to FIG. 3F an example display is illustrated. The various non-visible layers may be shown by rendering the covering layers with a transparency. Thus, the display shows the profile of machine 350 and top plate 333, as well as the internal features that may be concealed like pipes 334, electrical conduits with wires 335, and headers 336 as examples.

Figure 3G:
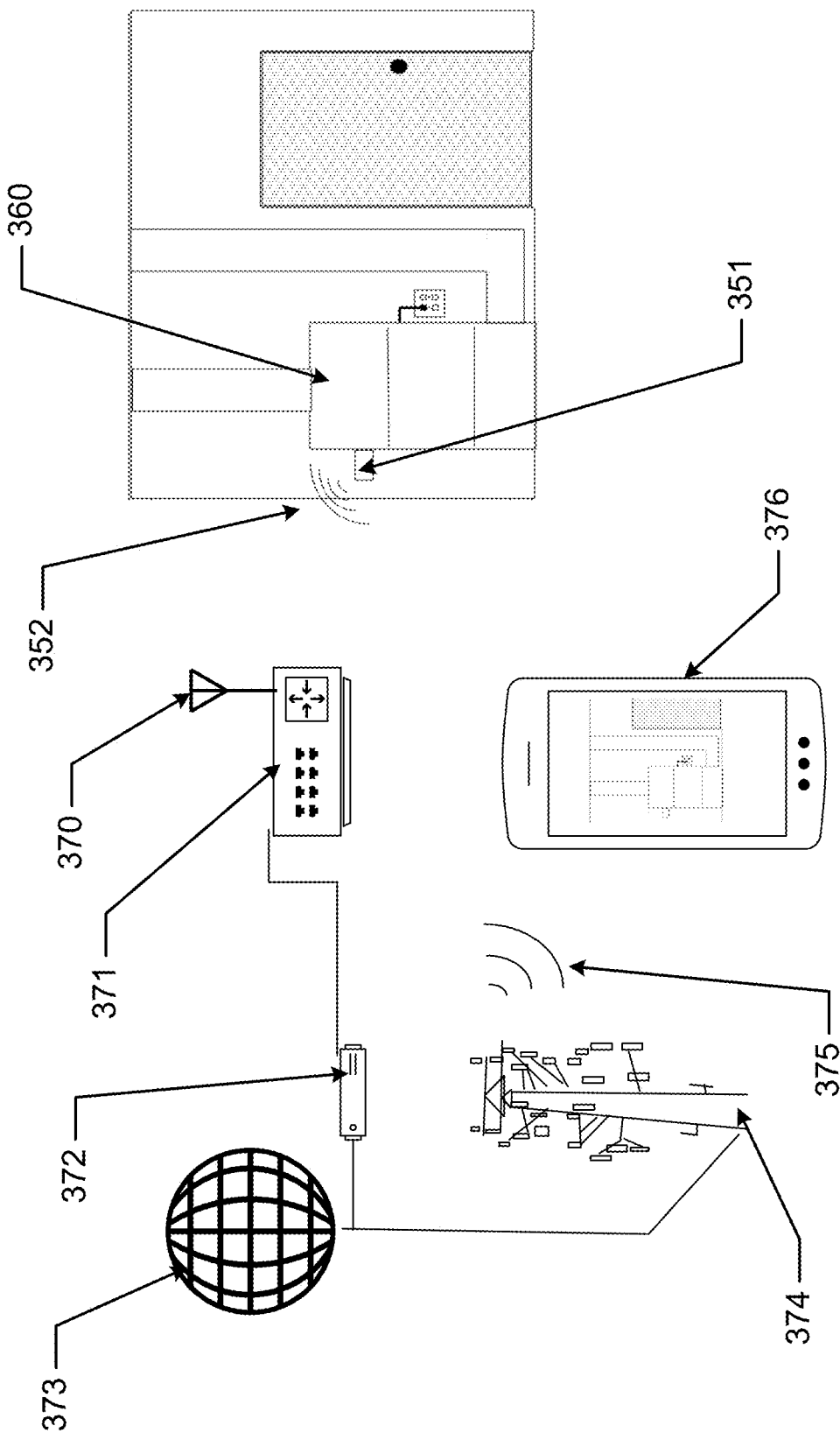
FIG. 3G illustrates an exemplary key component of the model system, with a Performance monitor providing data via a communication system to the model system.

Referring to FIG. 3G, an illustration of feedback of the model system is illustrated. A wall that has been scanned with an HVAC unit 360 may include an operational monitor 351 which may wirelessly communicate 352 various information. The communication may be received at an antenna 370 of a router 371 within the facility. The facility may be interconnected through the internet 372 to a web located server 373 which processes the communication. The web located server 373 also can include the various model data about the facility and it can provide composite displays that can summarize the Structure as well as the operational Performance of the HVAC unit 360. It may aggregate the various data into textual and graphic reports. In some examples it may communicate these reports back through internet connections. In other examples, wireless Smart Device communications may be sent to cellular towers 374 which may transmit 375 to a Smart Device 376 of a user associated with the facility.

Figure 3H:
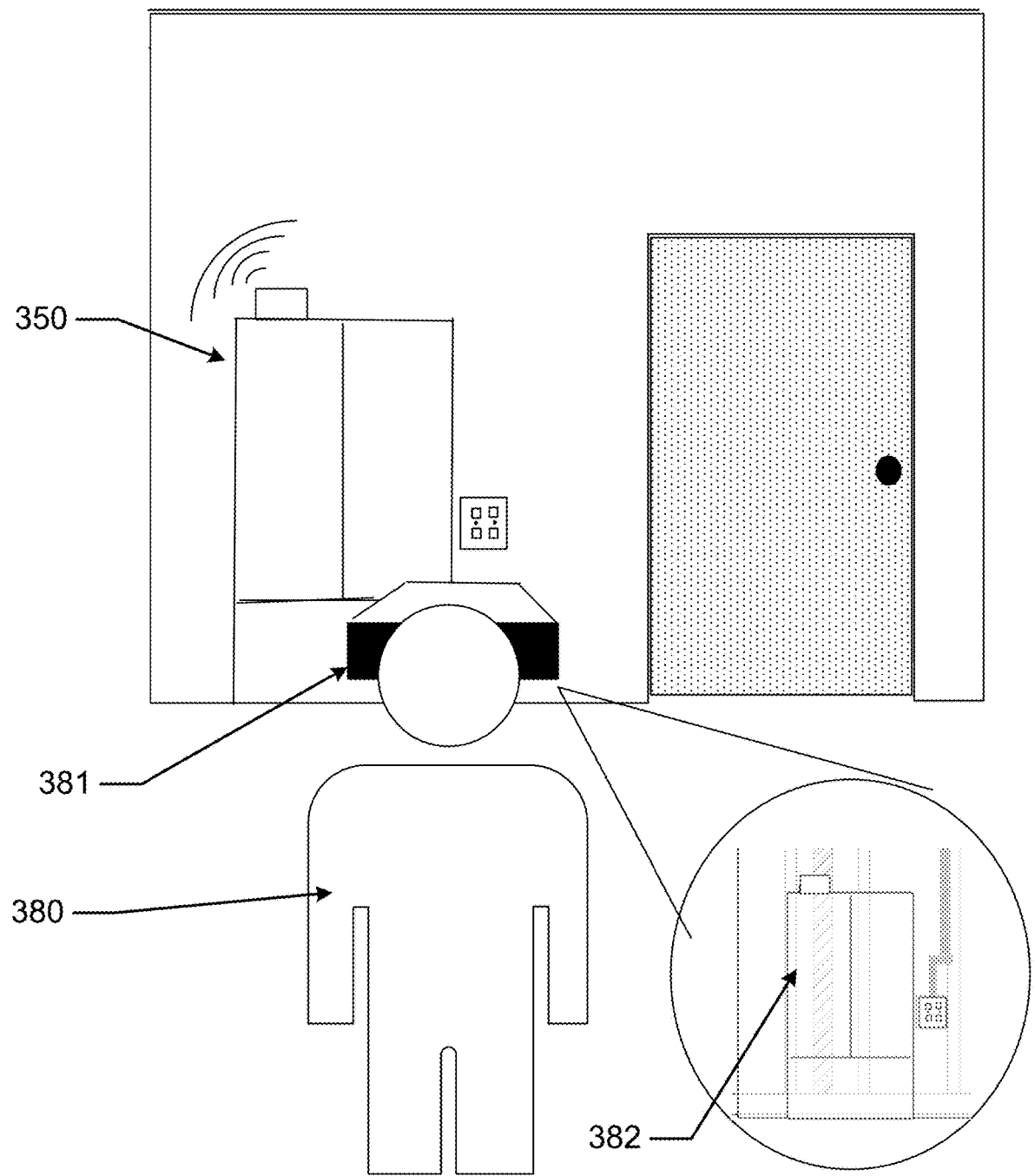
FIG. 3H illustrates an exemplary virtual reality display in concert with the present invention.

Referring to FIG. 3H an illustration of a virtual reality display in concert with the present invention is illustrated. A machine 350 of the facility may communicate information to the model server. A user 380 may receive may an integrated communication from the server. The resulting communication may be provided to a virtual reality headset 381. The virtual reality headset may provide a display 382 to the user that provides a three-dimensional view of the physical data as well as simulated imagery that may allow views through objects to hidden elements behind the object. As well, a heads up type display of information about an object may be superimposed.

Referring now to FIG. 4A, method steps that may be implemented in some embodiments of the present invention are illustrated. At step 401, Deployment aspects may be specified for a Structure and incorporated into a virtual model, such as an AVM discussed above. Deployment aspects may include for example, a purpose for an As Built Structure that is built based off the AVM. The purpose may include, by way of non-limiting example, one or more of: manufacturing, processing, data processing, health care, research, assembly, shipping and receiving, prototyping and the like.

Deployment aspects may also include a level of use, such continual, shift schedule or periodic. A climate in which the Structure will be placed may also be considered in the Deployment aspects. Climate may include one or more of: four seasons; primarily winter; tropical, desert; exposed to salt air; and other environmental factors.

At step 402, a virtual model, such as an AVM is digitally created according to the Deployment aspects of the model. The AVM may include improvements to a real estate parcel and a Structure that will be placed on the real estate parcel, as well as where a Structure may be located upon the parcel.

At step 403, Performance aspects of machinery that may be included in the AVM may be digitally modeled and may include a level of use of the machinery and an expected satisfaction of the machinery as deployed according to the Deployment aspects. Maintenance expectations, including a number of repair calls and a preventive maintenance schedule may also be modeled and associated costs.

At step 404, Performance aspects of equipment that may be included in the AVM may be digitally modeled and may include a level of use of the equipment and an expected satisfaction of the machinery as deployed according to the Deployment aspects. Maintenance expectations, including a number of repair calls and a preventive maintenance schedule may also be modeled and associated costs.

At step 405, As Built aspects of a Structure are recorded as discussed herein. Preferably, recordation of As Built aspects begins as construction begins and continues throughout the existence of the Structure.

At step 406, the physical Structure may be identified via a location. A physical location may include, for example, Cartesian Coordinates, such as Latitude and Longitude coordinates, GPS coordinates, or other verifiable set of location parameters. In addition, more exact location specifications may include survey designations.

At step 407, a position within or proximate to the Structure may be determined via positioning identifiers. The position within or proximate to the Structure may be determined.

At step 408, an AVM may be identified and accessed via the physical location. Once an appropriate AVM is accessed, a particular portion of the AVM may be presented via a GUI based upon the position within the Structure (or proximate to the Structure) and a direction, height and angle of view. The position may be determined relative to location identifiers. Height may be determined via electronic devices, such as a Smart Device, or via triangulation referencing the location identifiers (locations identifiers are discussed more fully above and below).

At step 409 an update may be made to a physical Structure and at step 410, the update to the physical Structure may be recorded and reflected in the AVM.

Figure 4B:
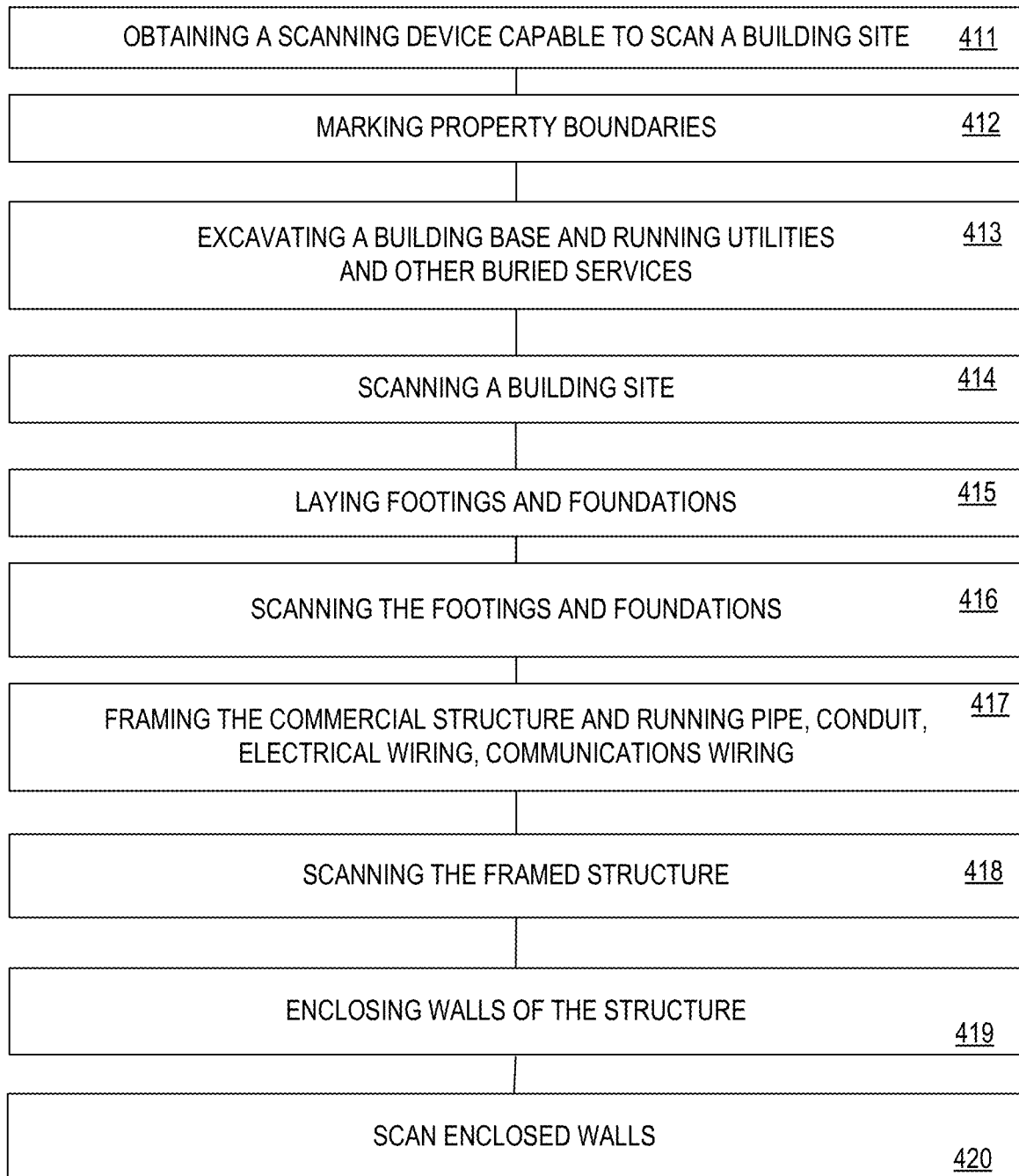

Referring to FIG. 4B, a method flow diagram for monitoring and maintenance is illustrated. At step 411 a user may obtain a scanning device or devices that may scan a building site. At step 412, the user or a service of the user may mark property boundaries of the site. At step 413, work on the site may continue with the excavation of a building base and the laying down of utilities and other buried services. At step 414, the scanning device is used to scan the location of the various aspects of the building site. At step 415, work may continue with the laying of footings and foundations and other such foundational building activities. At step 416, scanning of the footings and foundations may be accomplished. At step 417, a Structure may be framed and features such as pipe conduit, electrical wiring communications wiring and the like may be added. At step 418, before coverings are placed on walls, the framed Structure may again be scanned to locate the various elements. The framing of the residence may commence along with running of pipe, wiring, conduits, ducts and various other items that are located within wall Structures. Thereafter, the framed Structure may be enclosed with walls at step 419. The enclosed walls may then be scanned at step 420.

Referring to FIG. 4C, a method flow diagram for Structure monitoring and maintenance is illustrated. In this flow diagram, a Structure may already be built and may have various data layers already located in the model system. At step 421, machinery may be added to the Structure. At step 422, an ID tag, a QR tag, an RFID tag, or an IoT device may be associated with the machinery and may be programmed into the model system. At step 423, the model system may be interfaced to the machinery ID and into the Structure model. At step 424, a scanning step may be used to input three dimensional Structure data at the installed location into the model system. At step 425, an operational monitor function of the device may be added or activated. At step 426, operational data may be transferred from the operational monitor to the server containing the AVM.

At step 427, algorithms running on a server of the model system may determine an operational improvement opportunity based on calculations performed on the data from the operational monitor. At step 428 a user may query the operational data of the machinery for information on its warranty. At step 429, the model system may initiate an order for a service part and may schedule a service visit to make a repair based upon analysis of the operational data. The various steps outlined in the processing flow may be performed in different orders. In some examples additional steps may be performed. In some examples, some steps may not be performed.

In some embodiments, the present invention includes a method of tracking attainment of a stated Performance Level relating to a Structure, including: a) determining a geographic position of a Structure via a GPS device in a Smart Device proximate to the Structure; b) identifying a digital model of the Structure based upon the geographic position of the Structure, the digital model comprising virtual representation of structural components included in the Structure; c) referencing multiple positioning reference devices within the Structure; d) measuring a distance to at least three of the multiple positioning reference devices from a point of measurement; e) calculating a position within the Structure, the calculation based upon a relative distance of the at least three positioning reference devices to the point of measurement and a triangulation calculation; f) calculating an elevation of the point of measurement; g) measuring a first state within the Structure with a Sensor; h) specifying a location of the first state within the Structure via reference to the position of the point of measurement and the elevation of the point of measurement; i) recording a first time designation for the step of measuring a first state within the Structure with a Sensor; and j) correlating the first state within the Structure and the first time designation attainment of the stated Performance Level.

The geographic position may be calculated with a GPS reading from within the Structure. Measuring a distance to the at least three of the positioning reference devices may include, one or more of: relative signal strength received from wireless transmissions emanating from the at least three positioning reference devices; time of arrival of radio signals of wireless transmissions emanating from the at least three positioning reference devices measuring a distance to the at least three positioning reference devices comprises time difference of arrival of radio signals of wireless transmissions emanating from the at least three reference positioning devices.

The above steps may be repeated for at least a second state and a second time designation, and in preferred embodiments multiple more states and time designations.

A state may include, for example, one or more of: a vibration measured with an accelerometer; a temperature of at least a portion of the Structure; an electrical current measurement to equipment installed in the Structure, a number of cycles of operation of equipment installed in the Structure; a number of cycles of operation of an machinery installed in the Structure; an electrical current measurement to an machinery installed in the Structure; a vibration associated with movement of an occupant of the Structure.

A vibration pattern may be associated with a specific occupant and tracking the movement of the specific occupant through the Structure may be based upon measured vibration patterns. Similarly, a vibration pattern may be associated with a particular activity of a specific occupant and the activity of the specific occupant may be tracked within the Structure based upon measured vibration patterns.

A Performance Level may include one or more of: operating the Structure for a term of years within a threshold use of energy; operating the Structure for a term of years within a threshold number of repairs; and operating the Structure for a term of years within a threshold budgetary cost.

Figure 5:
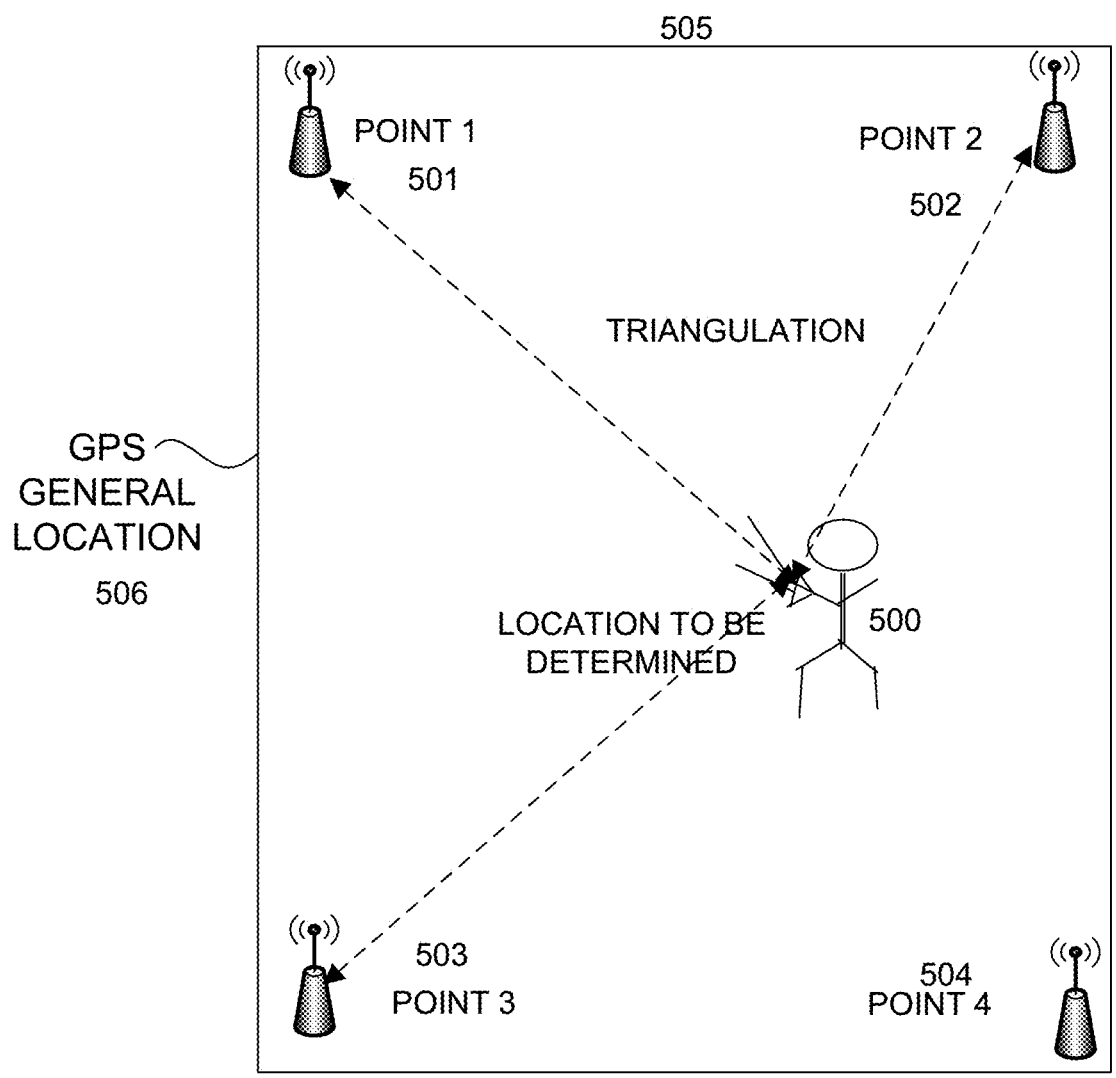
FIG. 5 illustrates location and positioning devices associated within a Structure.

FIG. 5 illustrates location and positioning identifiers 501-504 that may be deployed in a Structure according to some embodiments of the present invention to determine a user position 500 within or proximate to the Structure 505.

Positioning identifiers may include a device that is fixed in a certain location and may be used to determine via calculation a position of a user with a tablet, smart phone or other network access device able to recognize the position identifiers. The position identifiers 501-504 may include devices, such as, for example, a radio transmitter, a light beacon, or an image recognizable device. A radio transmitter may include a router or other WiFi device. In some embodiments, a position identifier may include a WiFi router that additionally provides access to a distributed network, such as the Internet. Cartesian Coordinates, such as a GPS position 506, may be utilized to locate and identify the Structure 505.

A precise location may be determined via triangulation based upon a measured distance from three 501-503 or more position identifiers 501-504. For example a radio transmission or light signal may be measured and compared from the three reference position identifiers 501-503. Other embodiments may include a device recognizable via image analysis and a camera or other Image Capture Device, such as a CCD device, which may capture an image of three or more position identifiers 501-504. Image analysis may recognize the identification of each of three or more of the position identifiers 501-504 and a size ratio of the respective image captured position identifiers 501-504 may be utilized to calculate a precise position. Similarly, a height designation may be made via triangulation using the position identifiers as reference to a known height or a reference height.

Figure 6:
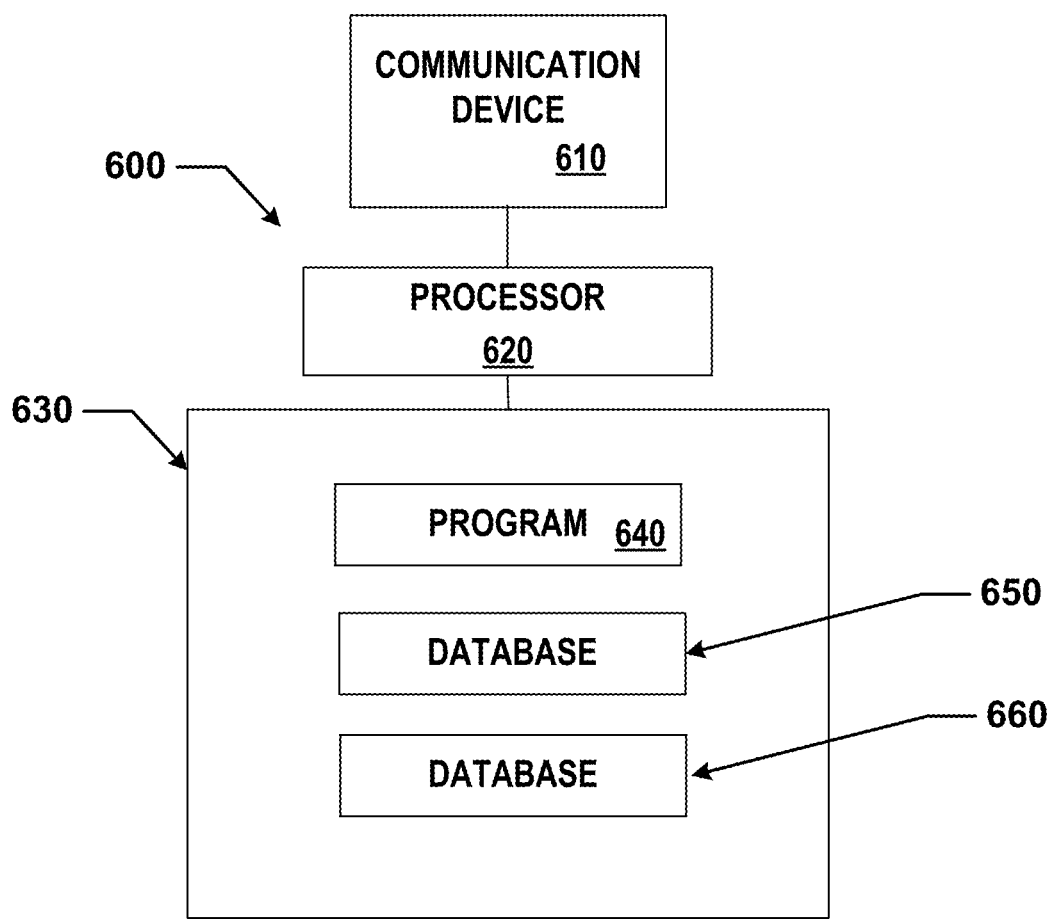
FIG. 6 illustrates apparatus that may be used to implement aspects of the present invention including executable software.

Referring now to FIG. 6 an automated controller is illustrated that may be used to implement various aspects of the present invention, in various embodiments, and for various aspects of the present invention. Controller 600 may be included in one or more of: a wireless tablet or handheld device, a server, or a rack mounted processor unit. The controller may be included in one or more of the apparatus described above, such as a Server, and a Network Access Device. The controller 600 includes a processor 620, such as one or more semiconductor-based processors, coupled to a communication device 610 configured to communicate via a communication network (not shown in FIG. 6). The communication device 610 may be used to communicate, for example, with one or more online devices, such as a personal computer, laptop, or a handheld device.

The processor 620 is also in communication with a storage device 630. The storage device 630 may comprise any appropriate information storage device, including combinations of magnetic storage devices (e.g., magnetic tape and hard disk drives), optical storage devices, and/or semiconductor memory devices such as Random Access Memory (RAM) devices and Read Only Memory (ROM) devices.

The storage device 630 can store a software program 640 with executable logic for controlling the processor 620. The processor 620 performs instructions of the software program 640, and thereby operates in accordance with the present invention. The processor 620 may also cause the communication device 610 to transmit information, including, in some instances, control commands to operate apparatus to implement the processes described above. The storage device 630 can additionally store related data in a database 650 and database 660, as needed.

Figure 7:
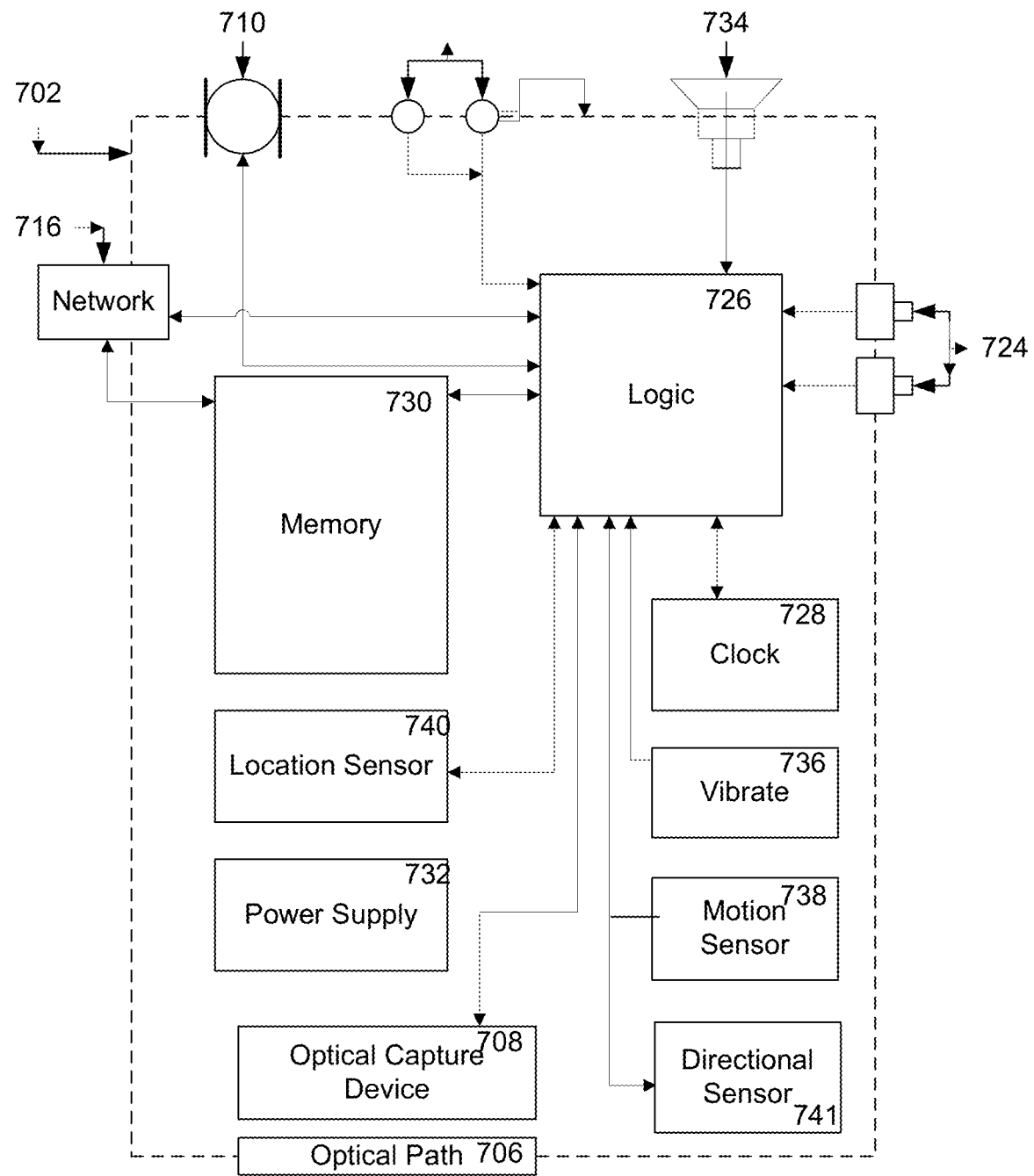
FIG. 7 illustrates an exemplary handheld device that may be used to implement aspects of the present invention including executable software.

Referring now to FIG. 7, a block diagram of an exemplary mobile device 702 is shown. The mobile device 702 comprises an optical capture device 708 to capture an image and convert it to machine-compatible data, and an optical path 706, typically a lens, an aperture or an image conduit to convey the image from the rendered document to the optical capture device 708. The optical capture device 708 may incorporate a CCD, a Complementary Metal Oxide Semiconductor (known in the art as a "CMOS") imaging device, or an optical Sensor 724 of another type.

A microphone 710 and associated circuitry may convert the sound of the environment, including spoken words, into machine-compatible signals. Input facilities may exist in the form of buttons, scroll wheels, or other tactile Sensors such as touch-pads. In some embodiments, input facilities may include a touchscreen display.

Visual feedback to the user is possible through a visual display, touchscreen display, or indicator lights. Audible feedback 734 may come from a loudspeaker or other audio transducer. Tactile feedback may come from a vibrate module 736.

A motion Sensor 738 and associated circuitry convert the motion of the mobile device 702 into machine-compatible signals. The motion Sensor 738 may comprise an accelerometer that may be used to sense measurable physical acceleration, orientation, vibration, and other movements. In some embodiments, motion Sensor 738 may include a gyroscope or other device to sense different motions.

A location Sensor 740 and associated circuitry may be used to determine the location of the device. The location Sensor 740 may detect GPS radio signals from satellites or may also use assisted GPS where the mobile device may use a cellular network to decrease the time necessary to determine location. In some embodiments, the location Sensor 740 may use radio waves to determine the distance from known radio sources such as cellular towers to determine the location of the mobile device 702. In some embodiments these radio signals may be used in addition to GPS.

The mobile device 702 comprises logic 726 to interact with the various other components, possibly processing the received signals into different formats and/or interpretations. Logic 726 may be operable to read and write data and program instructions stored in associated storage or memory 730 such as RAM, ROM, flash, or other suitable memory. It may read a time signal from the clock unit 728. In some embodiments, the mobile device 702 may have an on-board power supply 732. In other embodiments, the mobile device 702 may be powered from a tethered connection to another device, such as a Universal Serial Bus (USB) connection.

The mobile device 702 also includes a network interface 716 to communicate data to a network and/or an associated computing device. Network interface 716 may provide two-way data communication. For example, network interface 716 may operate according to the internet protocol. As another example, network interface 716 may be a local area network (LAN) card allowing a data communication connection to a compatible LAN. As another example, network interface 716 may be a cellular antenna and associated circuitry which may allow the mobile device to communicate over standard wireless data communication networks. In some implementations, network interface 716 may include a Universal Serial Bus (USB) to supply power or transmit data. In some embodiments other wireless links may also be implemented.

As an example of one use of mobile device 702, a reader may scan some coded information from a location marker in a facility with the mobile device 702. The coded information may include for example a hash code, bar code, RFID or other data storage device. In some embodiments, the scan may include a bit-mapped image via the optical capture device 708. Logic 726 causes the bit-mapped image to be stored in memory 730 with an associated time-stamp read from the clock unit 728. Logic 726 may also perform optical character recognition (known in the art as "OCR") or other post-scan processing on the bit-mapped image to convert it to text. Logic 726 may optionally extract a signature from the image, for example by performing a convolution-like process to locate repeating occurrences of characters, symbols or objects, and determine the distance or number of other characters, symbols, or objects between these repeated elements. The reader may then upload the bit-mapped image (or text or other signature, if post-scan processing has been performed by logic 726) to an associated computer via network interface 716.

As an example of another use of mobile device 702, a reader may capture some text from an article as an audio file by using microphone 710 as an acoustic capture port. Logic 726 causes audio file to be stored in memory 730. Logic 726 may also perform voice recognition or other post-scan processing on the audio file to convert it to text. As above, the reader may then upload the audio file (or text produced by post-scan processing performed by logic 726) to an associated computer via network interface 716.

A directional Sensor 741 may also be incorporated into the mobile device 702. The directional device may be a compass and be based upon a magnetic reading, or based upon network settings.

Referring now to FIG. 8, exemplary steps that may be performed in some aspects of the present invention are illustrated. At step 801, a processor may generate an AVM model of a Structure. The AVM model may be based upon a physical layout of the Structure and include a layout of each item of machinery, equipment as well as facility features, as described above. At step 802, the AVM may receive data indicative of one or more Performance metrics. Data may include data generated via a Sensor and/or input by a user. In some examples, data may include performance metrics, utility cost, maintenance cost and replacement cost.

At step 803, a data connection between a deployed facility and an AVM may be automated to generate and transmit data to the model on an automated basis without human intervention or artificial delay. All or some data may be stored in a storage. At step 804, the AVM may access received and/or historical data from the same or other AVM models. At step 805. Artificial intelligence routines or other logic may integrate relevant indices, including one or more of: geographic location, labor organization, market conditions, labor costs, physical conditions, property status, or data descriptive of other variables.

At step 806, an AVM may generate a value for build and deployment cost, and at step 807 the AVM may include utility and consumables cost. At step 808, an AVM may generate one or more of: predicted and actual quantifications from the Structure; energy consumption and process throughput.

Figure 9A:
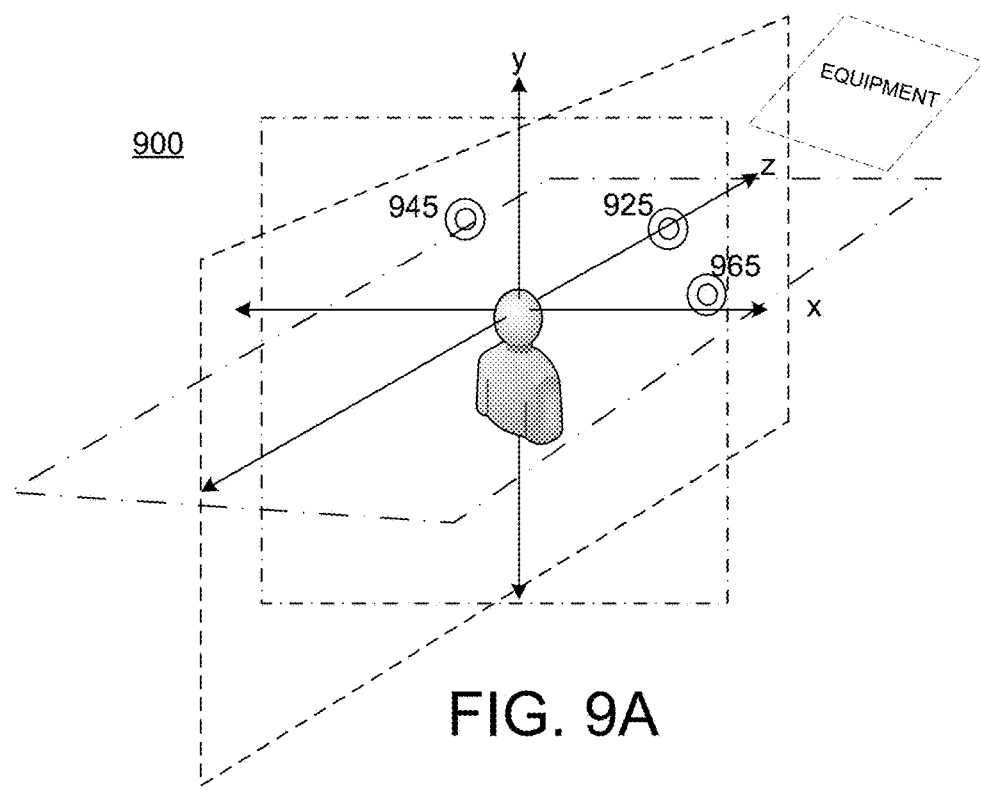
FIGS. 9A-D illustrates views of an AVM via a wearable eye display according to some aspects of the present invention.
Figure 9B:
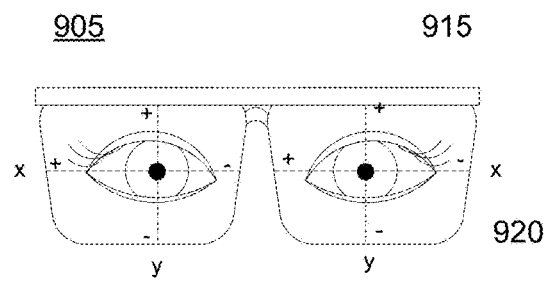
Figure 9C:
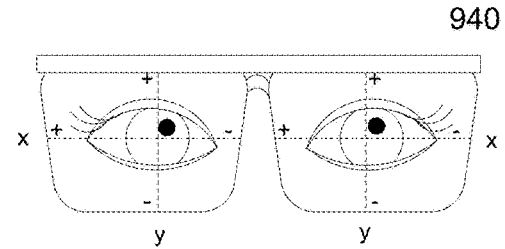
Figure 9D:
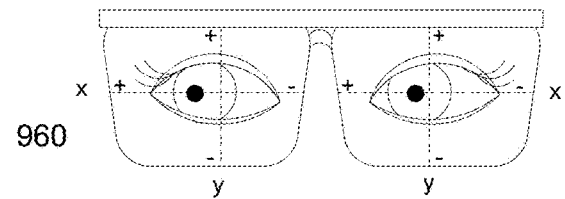

Referring now to FIG. 9A, an exemplary perspective graph 900 comprising three separate perspective points 925, 945, 965 is illustrated. In some aspects, as illustrated in FIG. 9B, a wearable display 905 may be configured to detect eye movement of the wearer 915, which may be calibrated. For example, such as illustrated in FIG. 9B, a neutral, forward-looking eye position 920 may be established as the center point of the axes 910 (0, 0), which may establish a view along the positive z-axis. As a further illustrative example in FIG. 9C, once calibrated, a shift in eye position 940 to look up and left may change a view from the vantage point and be transmitted to the AVM to access another portion of the AVM. As an illustrative example, as shown in FIG. 9D, a user may look right, and the eye position 960 may shift along the positive x-axis.

In some aspects, the wearable display 905 may comprise a set of goggles or glasses, wherein the goggles or glasses may comprise one or more lenses. For example, a single wrapped lens may allow a user to experience panoramic views. Alternately, dual lenses may provide different image data, wherein the combined images may allow the user to have stereoscopic perception of the performance event. In still further embodiments, the wearable display 905 may comprise a helmet, which may allow for more detailed immersion. For example, a helmet may allow for temperature control, audio isolation, broader perspectives, or combinations thereof.

Referring now to FIGS. 10A-10C, exemplary horizontal changes in viewing areas are illustrated. In some embodiments, the wearable display may comprise an accelerometer configured to detect head movement. Similarly to the eye position detection, the accelerometer may be calibrated to the natural head movements of a user 1000. In some embodiments, the calibration may allow the user to tailor the range to the desired viewing area. For example, a user may be able to move their head 110° comfortably, and the calibration may allow the user to view the entire 180° relative to the natural 110° movement.

As illustrated in FIG. 10A, a neutral head position 1020 of the wearable display may allow the user 1000 to view a forward-looking perspective 1025. As illustrated in FIG. 10B, a right head position 1040 of the wearable display may allow the user 1000 to view a rightward-looking perspective 1045. As illustrated in FIG. 10C, a left head position 1060 of the wearable display may allow the user 1000 to view a leftward-looking perspective 1065.

Referring now to FIGS. 11A-11C, exemplary vertical changes in viewing areas are illustrated. Similarly to FIGS. 10A-10C, in some embodiments, the wearable display may be configured to detect vertical motions. In some aspects, a user may look up to shift the viewing area to a range in the positive y axis grids, and user may look down to shift the viewing area to a range in the negative y axis grids. In some embodiments, the wearable display may be configured to detect both horizontal and vertical head motion, wherein the user may be able to have almost a 270° viewing range.

As illustrated in FIG. 11A, a neutral head position 1120 of the wearable display may allow the user 1100 to view a forward-looking perspective 1125. As illustrated in FIG. 11B, an up head position 1140 of the wearable display may allow the user 1100 to view an upward-looking perspective 1145. As illustrated in FIG. 11C, a down head position 1160 of the wearable display may allow the user 1100 to view a downward-looking perspective 1165.

In still further embodiments, the wearable display may be able to detect 360° of horizontal movement, wherein the user may completely turn around and change the neutral viewing range by 180°. In some aspects, the wearable display may be configured to detect whether the user may be sitting or standing, which may shift the perspective and viewing area. In some implementations, a user may be allowed to activate or deactivate the motion detection levels, based on preference and need. For example, a user may want to shift between sitting and standing throughout the experience without a shift in perspective. In some implementations, the wearable display may further comprise speakers, wherein audio data may be directed to the user.

In some embodiments, the wearable display may allow for immersion level control, wherein a user may adjust the level of light and transparency of the wearable display and/or frames. In some aspects, the lenses of the wearable display may comprise an electrically active layer, wherein the level of energy may control the opacity. For example, the electrically active layer may comprise liquid crystal, wherein the energy level may control the alignment of the liquid crystal. Where a user may prefer a fully immersive viewing experience, the lenses may be blacked out, wherein the user may see the video with minimal external visibility. Where a user may still prefer to have awareness or interactions beyond the video, the lenses and/or frames may allow for some light to penetrate or may allow for some transparency of the video.

Additional examples may include Sensor arrays, audio capture arrays and camera arrays with multiple data collection angles that may be complete 360 degree camera arrays or directional arrays, for example, in some examples, a Sensor array (including image capture Sensors) may include at least 120 degrees of data capture, additional examples include a Sensor array with at least 180 degrees of image capture; and still other examples include a Sensor array with at least 270 degrees of image capture. In various examples, data capture may include Sensors arranged to capture image data in directions that are planar or oblique in relation to one another.

Figure 12:
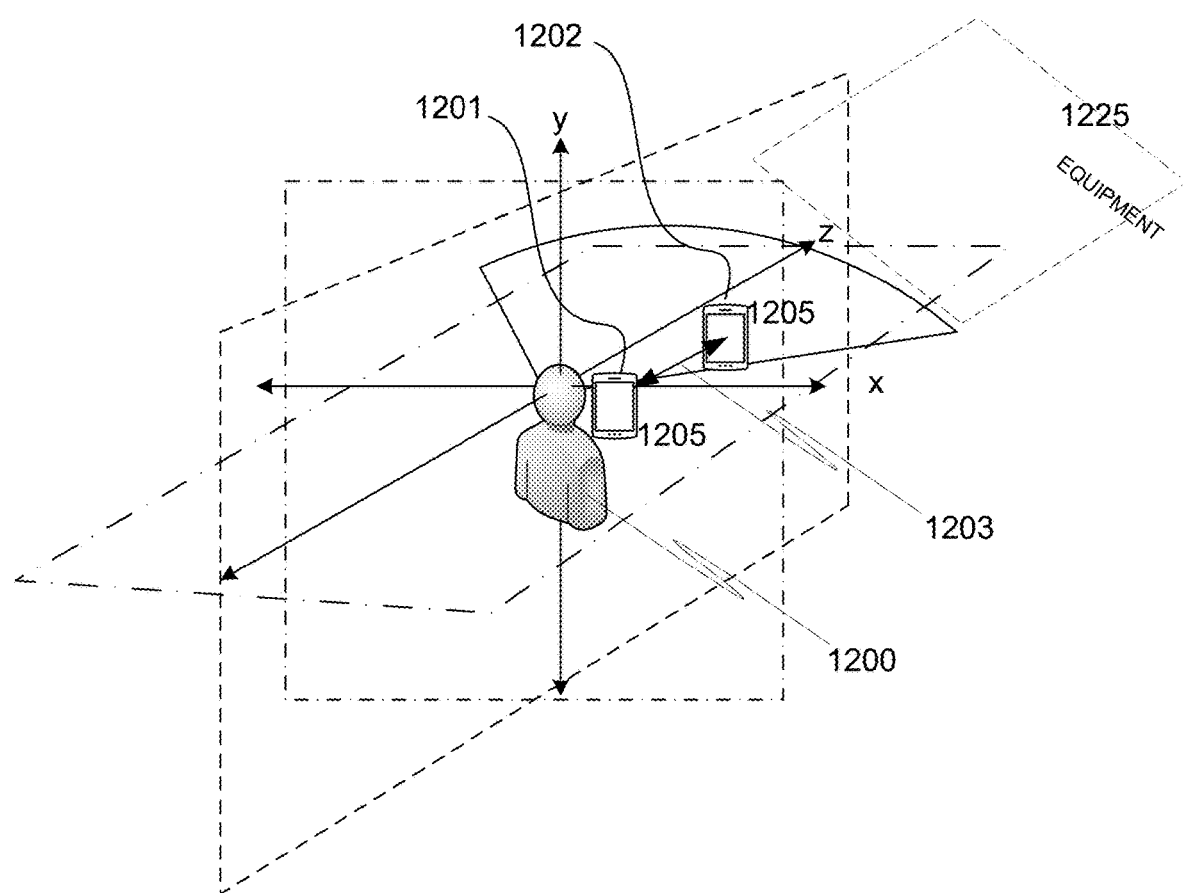
FIG. 12 illustrates designation of a direction according to some aspects of the present invention.

Referring now to FIG. 12, methods and devices for determining a direction that may be referenced for one or both of data capture and AVM presentation of a particular portion of the virtual representation of the modeled Structure. A User 1200 may position a Smart Device 1205 in a first position 1201 proximate to a portion of a Structure for which a representation in the AVM the User 1200 wishes to retrieve and display. The first position 1201 of the Smart Device 1205 may be determined (as discussed herein via GPS and/or triangulation) and recorded. The User 1200 may then relocate the Smart Device 1205 to a second position 1202 in a general direction of the portion of a Structure (illustrated as the Z direction) for which a representation in the AVM the User 1200 wishes to retrieve and display. In this manner, the AVM system (not shown in FIG. 12) and/or the Smart Device 1205 may generate one or both of a ray and a vector towards the portion of a Structure for which a representation in the AVM the User 1200 wishes to retrieve and display.

In some embodiments, the vector may have a length determined by the AVM that is based upon a length of a next Feature in the AVM located in the direction of the generated vector. The vector will represent a distance 1203 from the second position 1202 to an item 1225 along the Z axis defined by a line between the first position 1201 and the second position 1202. A ray will include a starting point and a direction.

As illustrated, the change in the Z direction is associated with a zero change in the X and Y directions. The process may also include a second position 1202 that has a change in the X and/or Y directions.

In other embodiments, a User 1200 may deploy a laser, accelerometer, sound generator or other device to determine a distance from the Smart Device 1205 to the feature, such as a piece of equipment. Such unique methods of determining a location and direction of data capture may be utilized to gather data during construction of modeled buildings or other Structures and during Deployment of the Structures during the Operational Stage. An additional non-limiting example may include direction based identification; with a fixed location, or in tandem with a location means, a device may have capabilities to deduce orientation based information of the device. This orientation information may be used to deduce a direction that the device is pointing in. This direction based information may be used to indicate that the device is pointing to a specific item 1225 that may be identified in the AVM.

In still other embodiments, a device with a controller and an accelerometer, such as mobile Smart Device 1205, may include a user display that allows a direction to be indicated by movement of the device from a determined location acting as a base position towards an As Built feature in an extended position. In some implementations, the Smart Device determines a first position 1201 based upon triangulation with the reference points. The process of determination of a position based upon triangulation with the reference points may be accomplished, for example via executable software interacting with the controller in the Smart Device, such as, for example by running an app on the Smart Devices 1205.

In combination with, or in place of directional movement of a Smart Device 1205 in order to quantify a direction of interest to a user, some embodiments may include an electronic and/or magnetic directional indicator that may be aligned by a user in a direction of interest. Alignment may include, for example, pointing a specified side of a device, or pointing an arrow or other symbol displayed upon a user interface on the device towards a direction of interest.

In a similar fashion, triangulation may be utilized to determine a relative elevation of the Smart Device as compared to a reference elevation of the reference points.

Other techniques for position determination, such as a fingerprint technique that utilizes a relative strength of a radio signal within a Structure to determine a geospatial position are also within the scope of the present invention.

It should be noted that although a Smart Device is generally operated by a human user, some embodiments of the present invention include a controller, accelerometer, and data storage medium, Image Capture Device, such as a CCD capture device and/or an infrared capture device being available in a handheld or unmanned vehicle.

An unmanned vehicle may include for example, an unmanned aerial vehicle ("UAV") or ground level unit, such as a unit with wheels or tracks for mobility and a radio control unit for communication.

In still other embodiments, captured data may be compared to a library of stored data using recognition software to ascertain and/or confirm a specific location, elevation and direction of an image capture location and proper alignment with the virtual model. Still other aspects may include the use of a compass incorporated into a Smart Device.

By way of non-limiting example, functions of the methods and apparatus presented herein may include one or more of the following factors that may be modeled and/or tracked over a defined period of time, such as, for example, an expected life of a build (such as, 10 years or 20 years).

Figure 13:
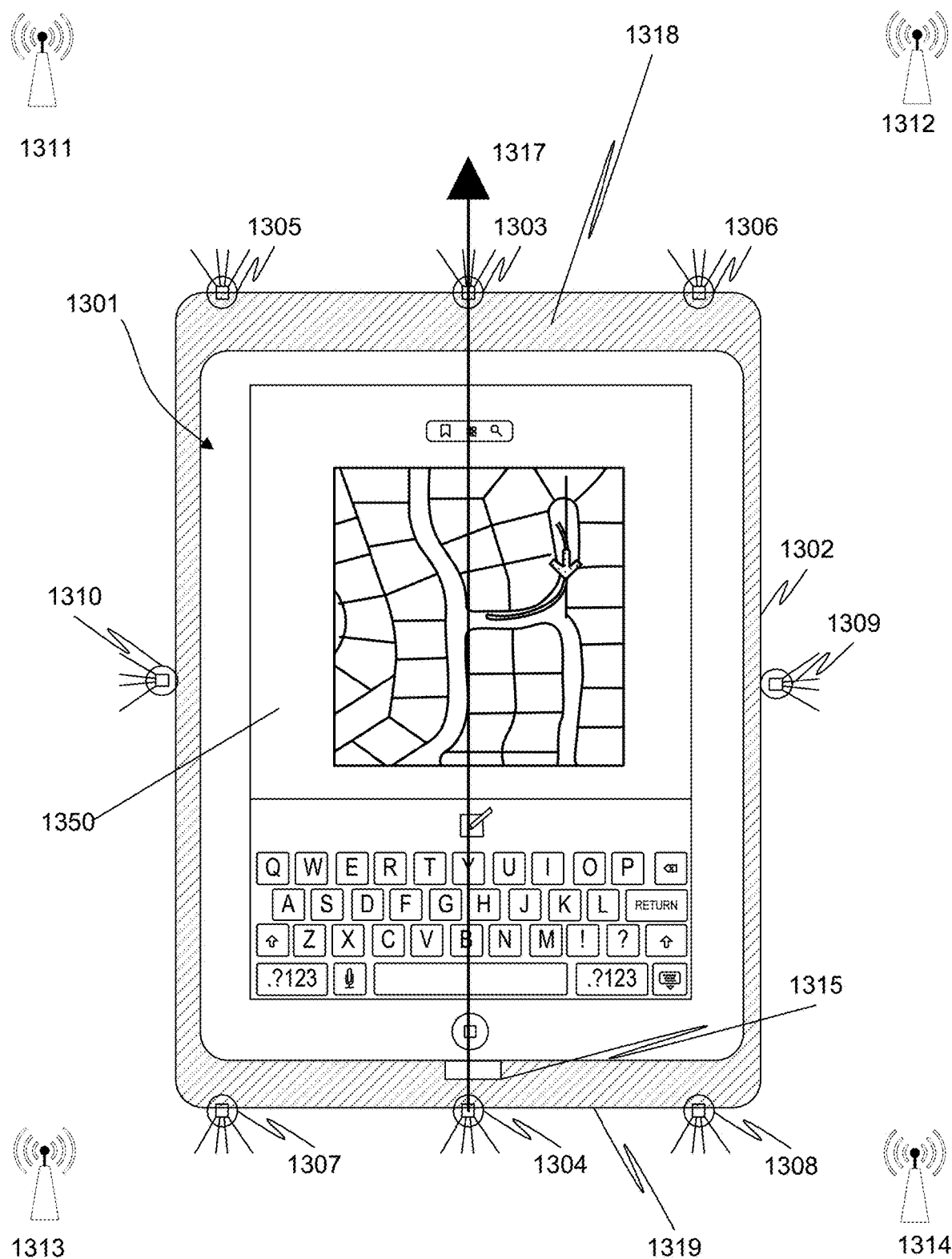
FIGS. 13-13C illustrate a device and vectors according to various embodiments of the present invention.

Referring now to FIG. 13, additional apparatus and methods for determining a geospatial location and determination of a direction of interest may include one or both of an enhanced Smart Device and a Smart Device in logical communication with wireless position devices 1303-1310. The importance of geospatial location and determination of a direction of interest is discussed in considerable detail above. As illustrated, a Smart Device 1301 may be in logical communication with one or more wireless position devices 1303-1310 strategically located in relation to the physical dimensions of the Smart Device. For example, the Smart Device 1301 may include a smart phone or tablet device with a user interface surface 1350 that is generally planar. The user interface surface 1350 will include an upper edge 1318 and a lower edge 1319. In some preferred embodiments, the Smart Device will be fixedly attached to a smart receptacle 1302. The smart receptacle 1302 may include an appearance of a passive case, such as the type typically used to protect the Smart Device 1301 from a damaging impact. However, according to the present invention, the smart receptacle 1302 will include digital and/or analog logical components, such as wireless position devices 1303-1310. The wireless position devices 1303-1310 include circuitry capable of receiving wireless transmissions from multiple reference transceivers 1311-1314. The wireless transmissions will include one or both of analog and digital data suitable for calculating a distance from each respective reference transceiver 1311-1314.

In some embodiments, the smart receptacle 1302 will include a connector 1315 for creating an electrical path for carrying one or both of electrical power and logic signals between the Smart Device 1301 and the smart receptacle 1302. For example, the connector 1315 may include a Mini-USB connector or a lightening connector. Additional embodiments may include an inductive coil arrangement for transferring power.

Embodiments may also include wireless transmitters and receivers to provide logical communication between the wireless position devices 1303-1310 and the Smart Device 1301. Logical communication may be accomplished, for example, via one or more of: Bluetooth, ANT, and infrared mediums.

Reference transceivers 1311-1314 provide wireless transmissions of data that may be received by wireless position devices 1303-1310. The wireless transmissions are utilized to generate a position of the respective wireless position devices 1303-1310 in relation to the According to the present invention, reference transceivers 1311-1314 providing the wireless transmissions to the wireless position devices 1303-1310 are associated with one or more of: a position in a virtual model; a geographic position; a geospatial position in a defined area, such as Structure; and a geospatial position within a defined area (such as, for example a real property).

According to the present invention, a Smart Device may be placed into a case, such as a smart receptacle 1302 that includes two or more wireless position devices 1303-1310. The wireless position devices 1303-1310 may include, for example, one or both of: a receiver and a transmitter, in logical communication with an antenna configured to communicate with reference transceivers 1311-1314. Communications relevant to location determination may include, for example, one or more of: timing signals; SIM information; received signal strength; GPS data; raw radio measurements; Cell-ID; round trip time of a signal; phase; and angle of received/transmitted signal; time of arrival of a signal; a time difference of arrival; and other data useful in determining a location.

The wireless position devices 1303-1310 may be located strategically in the smart receptacle 1302 to provide intuitive direction to a user holding the smart receptacle 1302, and also to provide a most accurate determination of direction. Accordingly, a forward wireless position device 1303 may be placed at a top of a smart receptacle 1302 and a rear wireless position device 1304 may be placed at a bottom of a smart receptacle 1302. Some embodiments each of four corners of a smart receptacle 1302 may include a wireless position device 1305, 1306, 1307, 1308. Still other embodiments may include a wireless position device 1309 and 1310 on each lateral side.

The present invention provides for determination of a location of two or more wireless positioning devices 1303-1310 and generation of one or more directional vectors 1317 and/or rays based upon the relative position of the wireless positioning devices 1303-1310. For the sake of convenience in this specification, when discussing a vector that does not include specific limitations as to a length of the vector and is primarily concerned with a direction, a ray of unlimited length may also be utilized. In some embodiments, multiple directional vectors 1317 are generated and a direction of one or more edges, such as a forward edge, is determined based upon the multiple directional vectors 1317.

According to the present invention a geospatial location relative to one or more known reference points is generated. The geospatial location in space may be referred to as having an XY position indicating a planar designation (e.g. a position on a flat floor), and a Z position (e.g. a level within a Structure, such as a second floor) may be generated based upon indicators of distance from reference points. Indicators of distance may include a comparison of timing signals received from wireless references. A geospatial location may be generated relative to the reference points. In some embodiments, a geospatial location with reference to a larger geographic area is associated with the reference points, however, in many embodiments, the controller will generate a geospatial location relative to the reference point(s) and it is not relevant where the position is located in relation to a greater geospatial area.

In some embodiments, a position of a Smart Device may be ascertained via one or more of: triangulation; trilateration; and multilateration (sometimes referred to in the art as "MLT") techniques.

A geospatial location based upon triangulation may be generated based upon a controller receiving a measurement of angles between the position and known points at either end of a fixed baseline. A point of a geospatial location may be determined based upon generation of a triangle with one known side and two known angles.

A geospatial location based upon trilateration may be generated based upon a controller receiving wireless indicators of distance and geometry of geometric shapes, such as circles, spheres, triangles and the like.

A geospatial location based upon multilateration may be generated based controller receiving measurement of a difference in distance to two reference positions, each reference position being associated with a known location. Wireless signals may be available at one or more of: periodically, within determined timespans and continually. The determination of the difference in distance between two reference positions provides multiple potential locations at the determined distance. A controller may be used to generate a plot of potential locations. In some embodiments, the potential determinations generally form a curve. Specific embodiments will generate a hyperbolic curve.

The controller may be programmed to execute code to locate an exact position along a generated curve, which is used to generate a geospatial location. The multilateration thereby receives as input multiple measurements of distance to reference points, wherein a second measurement taken to a second set of stations (which may include one station of a first set of stations) is used to generate a second curve. A point of intersection of the first curve and the second curve is used to indicate a specific location.

In combination with, or in place of directional movement of a Smart Device 1301 in order to quantify a direction of interest to a user, some embodiments may include an electronic and/or magnetic directional indicator that may be aligned by a user in a direction of interest. Alignment may include, for example, pointing a specified side of a device, or pointing an arrow or other symbol displayed upon a user interface on the device towards a direction of interest.

In a similar fashion, triangulation may be utilized to determine a relative elevation of the Smart Device as compared to a reference elevation of the reference points.

It should be noted that although a Smart Device is generally operated by a human user, some embodiments of the present invention include a controller, accelerometer, and data storage medium, Image Capture Device, such as a CCD capture device and/or an infrared capture device being available in a handheld or unmanned vehicle, such as a UAV or UGV as described above. A radio control unit may be used to transmit control signals to a UAV and/or a UGV. A radio control unit may also receive wireless communications from the unmanned vehicle.

In some embodiments, multiple unmanned vehicles may capture data in a synchronized fashion to add depth to the image capture and/or a three dimensional and 4 dimensional (over time) aspect to the captured data. In some implementations, a UAV position will be contained within a perimeter and the perimeter will have multiple reference points to help each UAV (or other unmanned vehicle) determine a position in relation to static features of a building within which it is operating and also in relation to other unmanned vehicles. Still other aspects include unmanned vehicles that may not only capture data but also function to perform a task, such as paint a wall, drill a hole, cut along a defined path, or other function. As stated throughout this disclosure, the captured data may be incorporated into an AVM.

In still other embodiments, captured data may be compared to a library of stored data using recognition software to ascertain and/or affirm a specific location, elevation and direction of an image capture location and proper alignment with the virtual model. Still other aspects may include the use of a compass incorporated into a Smart Device.

By way of non-limiting example, functions of the methods and apparatus presented herein may include one or more of the following factors that may be modeled and/or tracked over a defined period of time, such as, for example, an expected life of a build (such as, 10 years or 20 years).

Figure 13A:
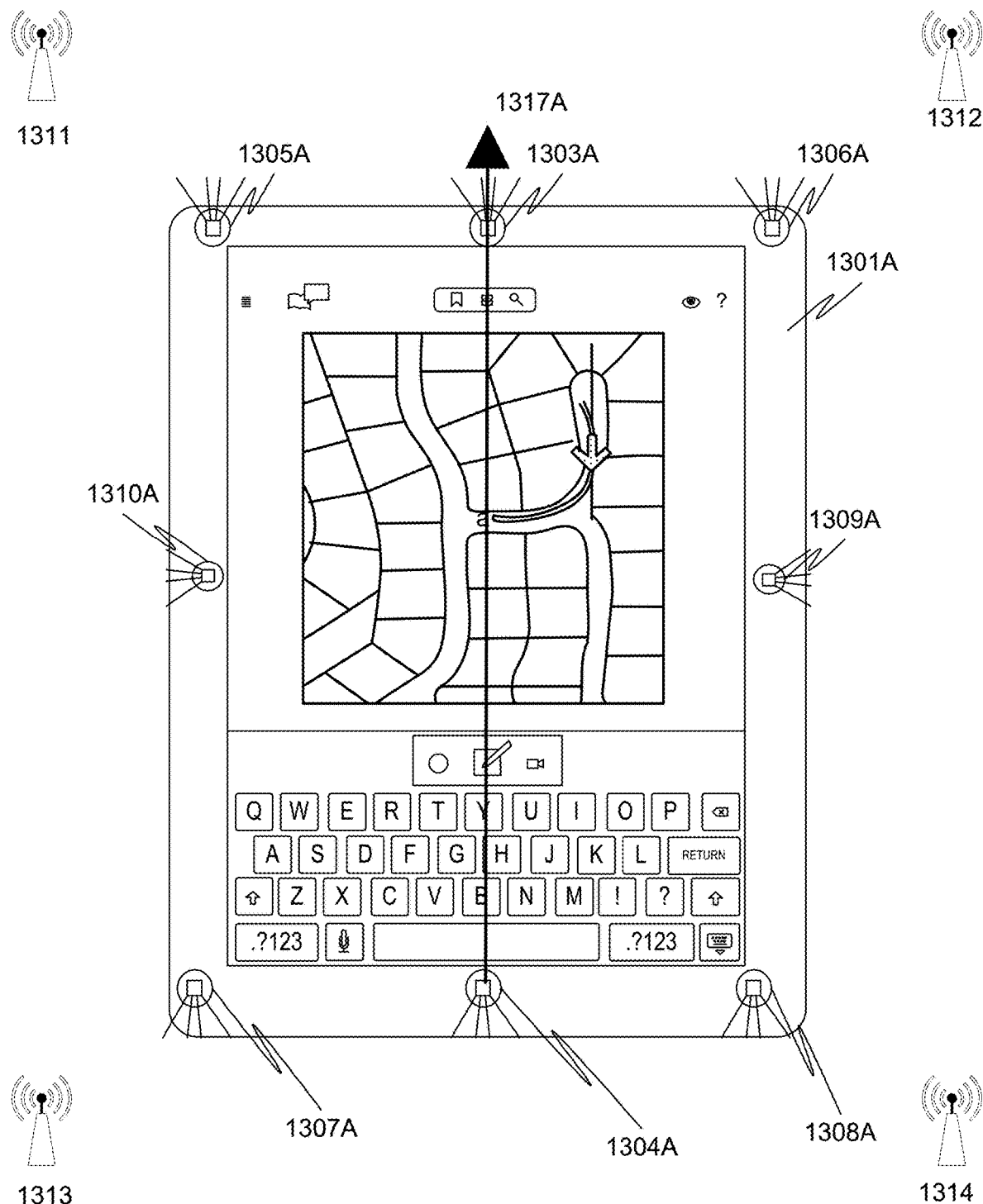

Referring now to FIG. 13A, in some embodiments, wireless position devices 1303A-1310A may be incorporated into a Smart Device 1301A and not require a smart receptacle to house wireless position devices 1303-1310. Wireless position devices 1303A-1310A that are incorporated into a Smart Device, such as a smart phone or smart tablet, will include internal power and logic connections and therefore not require wireless communication between the controller in the Smart Device 1301A and the reference transceivers 1311-1314.

A person of ordinary skill in the arts will understand that a Smart Device 1301A with integrated wireless position devices 1303-1310 and a Smart Device 1301 with wireless position devices 1303-1310 in a smart receptacle 1302 may provide a directional indication, such as a directional vector 1317 1317A, without needing to move the Smart Device from a first position to a second position since a directional vector may be determined from a relative position of a first wireless position devices 1303-1310 and a second wireless positional device wireless position devices 1303-1310.

In exemplary embodiments, as described herein, the distances may be triangulated based on measurements of WiFi signal strength or timing signals at two or more points. WiFi signal propagates outward as a wave, ideally according to an inverse square law. Some embodiments therefore include measuring relative distances at two points. In light of the speed of wireless communication, such as Ultra-Wideband, Infrared, WiFi waves and the like, it is beneficial for such real-time computations involved in orienteering, these computations to be as computationally simple as possible. Thus, depending upon the specific application and means for taking the measurements, various coordinate systems may be desirable. In particular, if the Smart Device moves only in a planar direction while the elevation is constant, or only at an angle relative to the ground, the computation will be simpler.

Accordingly, an exemplary coordinate system is a polar coordinate system. One example of a three-dimensional polar coordinate system is a spherical coordinate system. A spherical coordinate system typically comprises three coordinates: a radial coordinate, a polar angle, and an azimuthal angle (r, $\theta$, and $\varphi$, respectively, though a person of ordinary skill in the art will understand that $\theta$ and $\varphi$ are occasionally swapped).

By way of non-limiting example, suppose Point 1 is considered the origin for a spherical coordinate system (i.e., the point (0, 0, 0)). Each WiFi emitter $e_1$, $e_2$, $e_3$ can be described as points $(r_1, \theta_1, \varphi_1)$, $(r_2, \theta_2, \varphi_2)$, and $(r_3, \theta_3, \varphi_3)$, respectively. Each of the $r_i$'s ($1 \leq i \leq 3$) represent the distance between the WiFi emitter and the WiFi receiver on the Smart Device.

In some embodiments, the orienteering occurs in a multistory building, in which WiFi emitters may be located above and/or below the technician. In these embodiments, a cylindrical coordinate system may be more appropriate. A cylindrical coordinate system typically comprises three coordinates: a radial coordinate, an angular coordinate, and an elevation (r, $\theta$, and z, respectively). A cylindrical coordinate system may be desirable where, for example, all WiFi emitters have the same elevation.

Figure 13B:
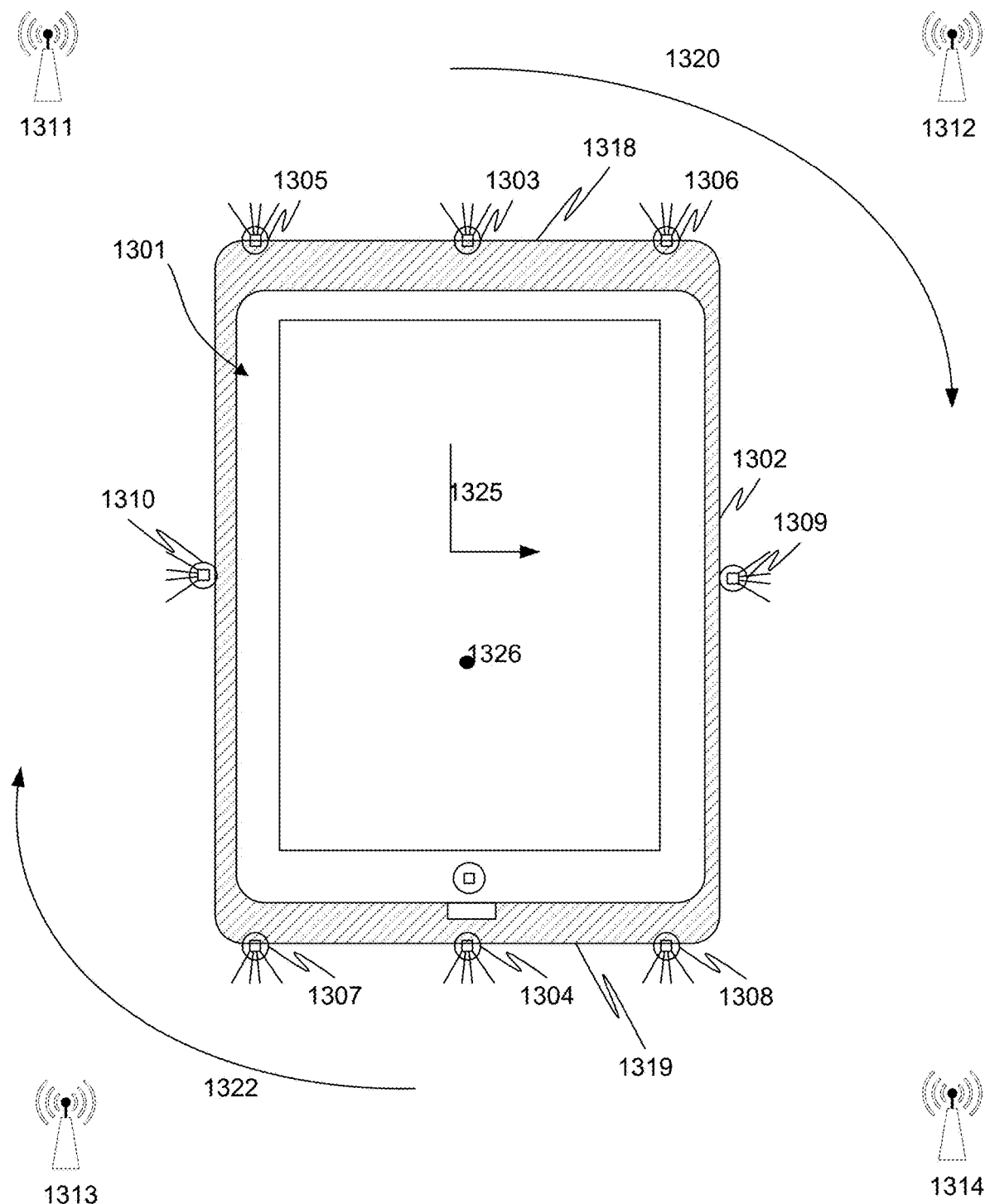

Referring now to FIG. 13B, in some embodiments, one or both of a Smart Device 1301 and a smart receptacle 1302 may be rotated in a manner (such as, for example in a clockwise or counterclockwise movement 1320 1322 relative to a display screen) that repositions one or more wireless position devices 1303-1310 from a first position to a second position. A vector 1326 may be generated at an angle that is perpendicular 1325 or some other designated angle in relation to the Smart Device 1301. In some embodiments, an angle in relation to the Smart Device is perpendicular 1325 and thereby viewable via a forward looking camera on the Smart Device.

A user may position the Smart Device 1301 such that an object in a direction of interest is within in the camera view. The Smart Device may then be moved to reposition one or more of the wireless position devices 1303-1310 from a first position to a second position and thereby capture the direction of interest via a generation of a vector in the direction of interest. As in FIG. 13A, this method obviates reliance on reference transceivers 1311-1314 required by the embodiment shown in FIG. 13. In some embodiments, the reference transceivers may be located on or adjacent to an upper edge 1318 and lower edge 1319 of the Smart Device 1301.

Figure 13C:
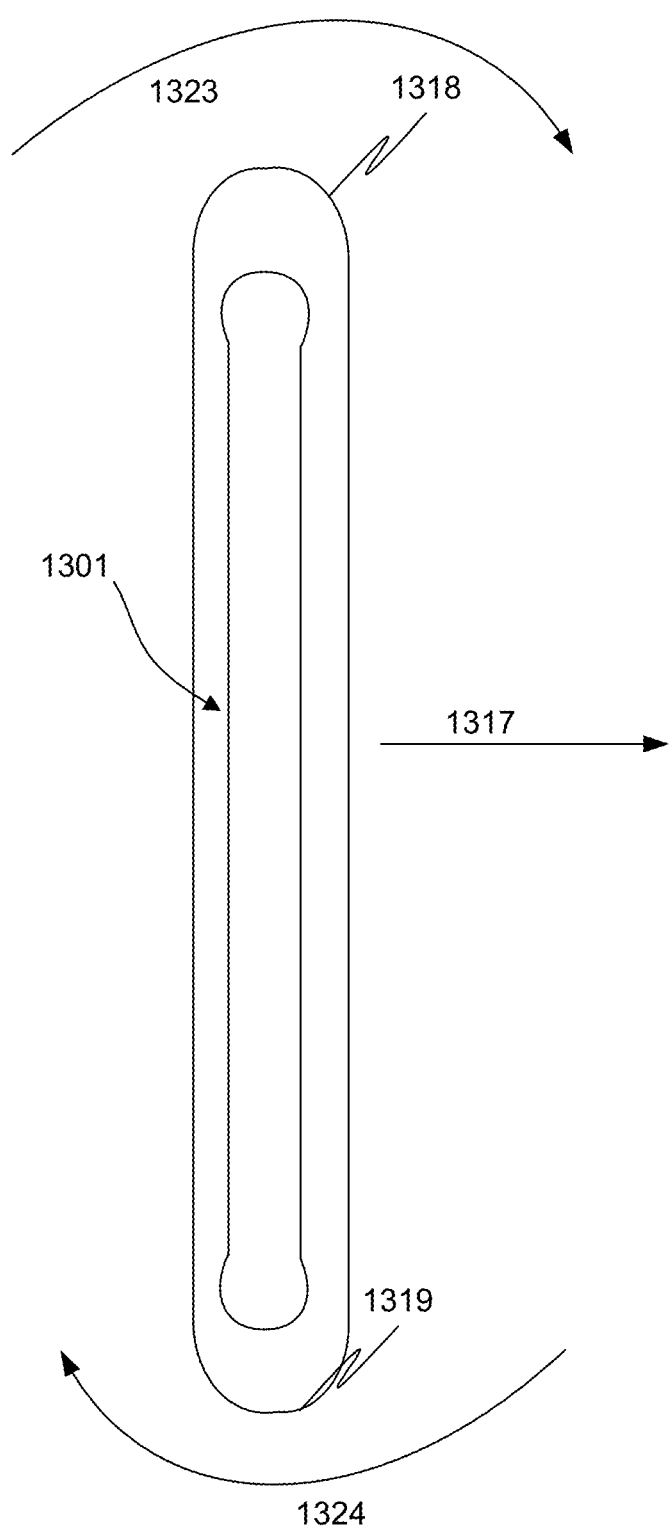

Referring now to FIG. 13C, as illustrated, a vector in a direction of interest 1385 may be based upon a rocking motion 1323-1324 of the Smart Device 1301, such as a movement of an upper edge 1318 in a forward arcuate movement 1323. The lower edge 1319 may also be moved in a complementary arcuate movement 1324 or remain stationary. The movement of one or both the upper edge 1318 and lower edge 1319 also results in movement of one or more wireless position devices 1303-1310. The movement of the wireless position devices 1303-1310 will be a sufficient distance to register to geospatial positions based upon wireless transmissions. A required distance will be contingent upon a type of wireless transmission referenced to calculate the movement; for example, an infrared beam may require less distance than a WiFi signal, and a WiFi transmission may require less distance than a cell tower transmission which in turn may require less distance than a GPS signal.

Figure 14:
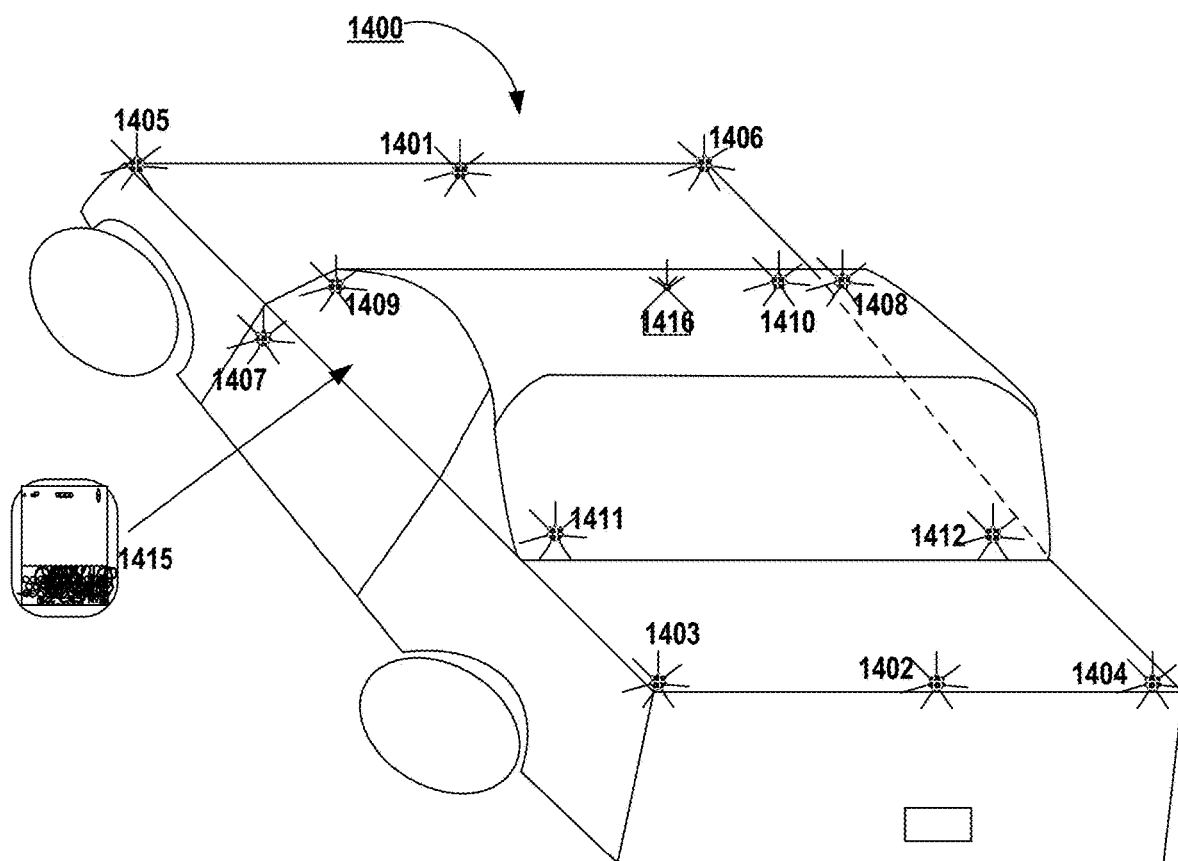
FIG. 14 illustrates a vehicle acting as a larger platform 1400 for supporting wireless position devices.

Referring now to FIG. 14, in still other embodiments, a Smart Device 1415 may be logically associated with a larger platform 1400 for supporting wireless position devices 1401-1412. The larger platform 1400 may include a vehicle, such as an automobile, a truck, a ship, an aircraft, a motorcycle or other motorized vehicle. As illustrated the larger platform 1400 includes an automobile. The larger platform 1400 may include almost any combination of two or more wireless position devices 1401-1412 that may provide respective positional data sufficient to generate a directional vector. Accordingly, by way of non-limiting example, a front and center wireless position device 1401 may be paired with a rear center wireless position device 1402; each corner of the vehicle may include a wireless position device 1403-1406; interior corners may include a respective wireless position device 1409-1412; and exterior locations, such as on rear view mirrors may contain wireless position devices 1407-1408.

Utilizing multiple on-board wireless position devices 1401-1412, it is possible to ascertain a direction that a vehicle is pointing without movement of the vehicle. This is useful since unlike traditional methods utilized by navigational systems that relied on a first geographic location of the vehicle and a second geographic position of the vehicle, which in turn required motion, the present invention provides for directional orientation without movement of the vehicle.

In another aspect, a controller may be included in a Smart Device paired to the vehicle and/or a transmitter 1416 may transmit data received from the multiple wireless position devices 1401-1412 to a remote processor which may determine a directional orientation. The remote processor and/or a Smart Device may also transmit the directional orientation back to a display viewable by an operator of the vehicle.

Figure 15A:
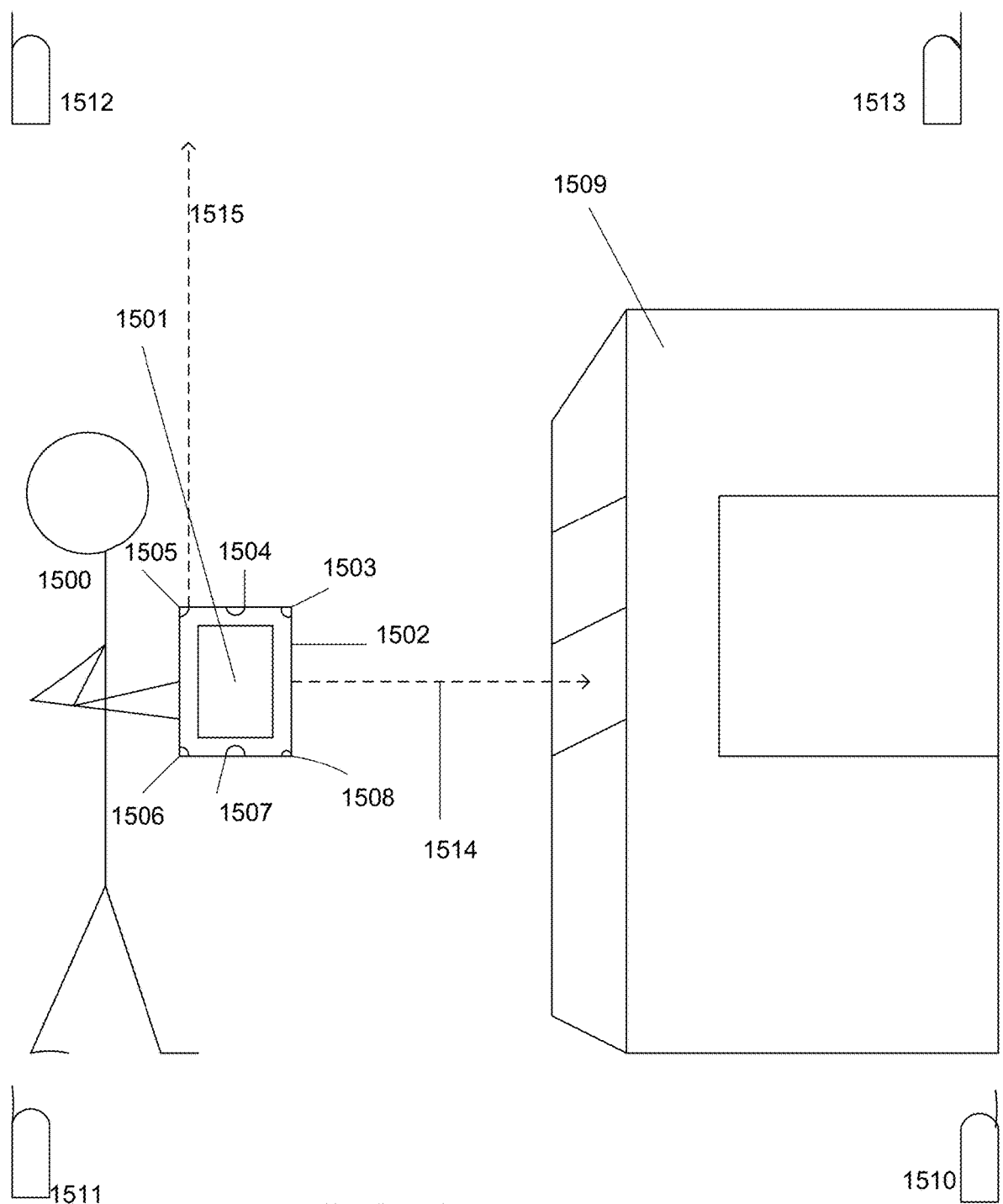
FIGS. 15A-15C illustrate movement of a Smart Device to generate a vector and/or a ray.
Figure 15B:
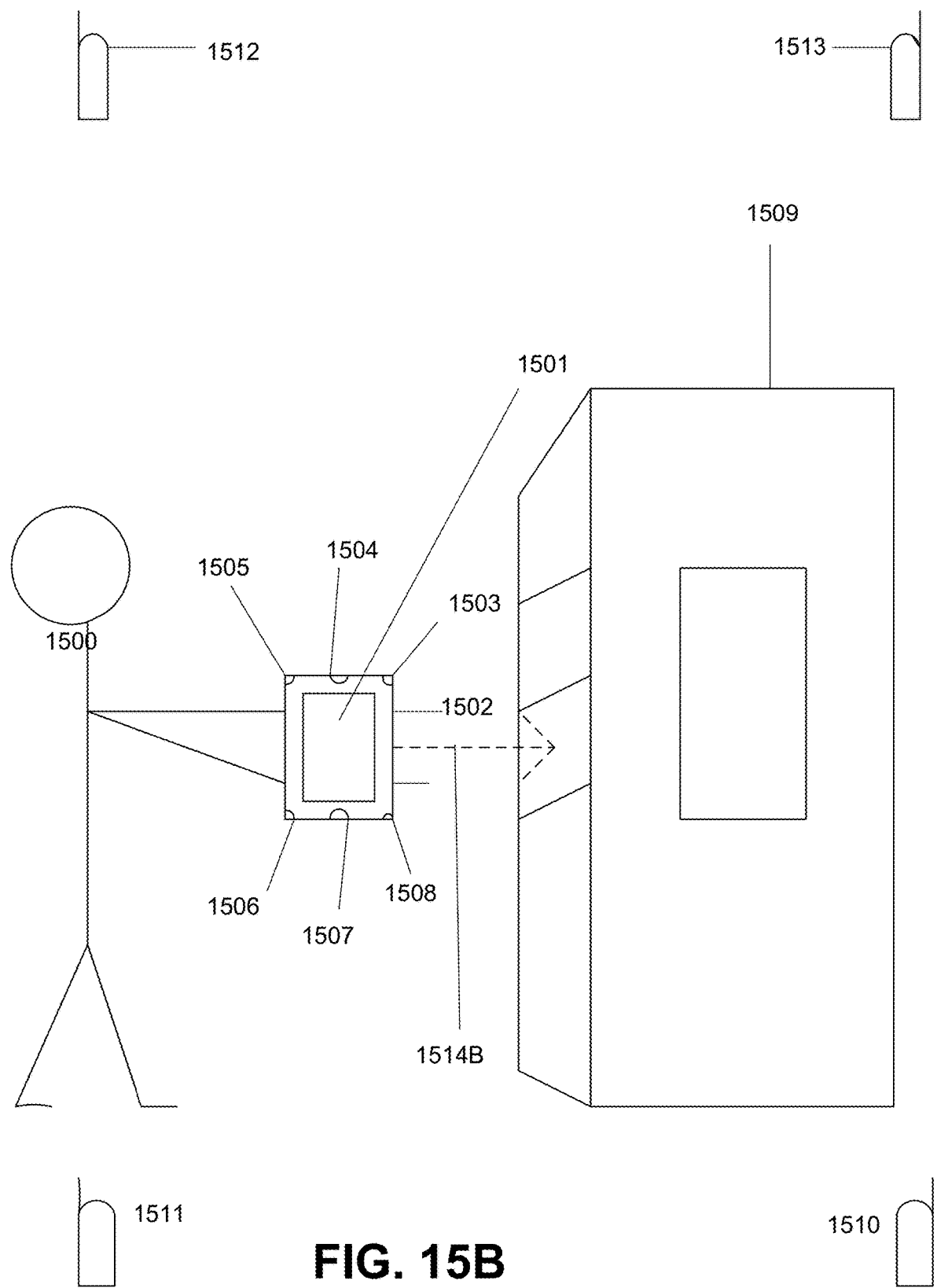
Figure 15C:
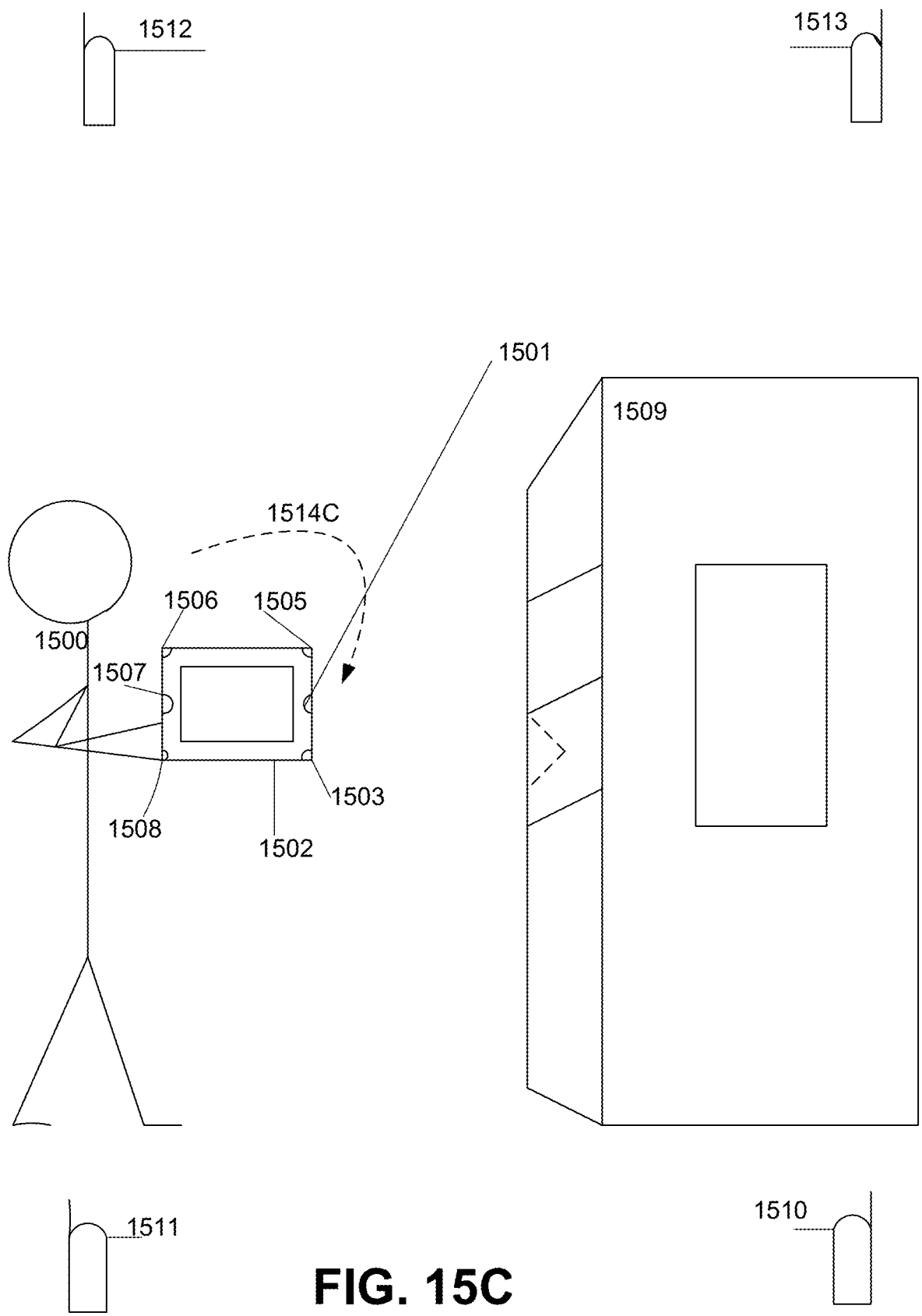

Referring now to FIGS. 15A-15C, a support 1500 for a Smart Device 1501 is illustrated. The support remains stationary in relation to a ground plane. One or more position devices 1503-1508 are shown located within, on or proximate to the Smart Device 1501 and/or Smart Device case 1502. In FIG. 15A, generally linear movement from a first position to a second position is illustrated. This movement may be along vector 1514, and may be approximately stationary with respect to one axis 1515. In some embodiments, a cessation of movement in a general direction is determined via an accelerometer included in or operated by the Smart Device 1501. In other embodiments (shown here as the support 1500), a user interactive device, such as a button on a touch screen or a switch, may be activated to indicate one or both of the first position and the second position.

The position devices 1503-1508 enter into logical communication with multiple wireless positional reference transceivers 1510-1513.

In some embodiments, a direction of interest will include an item of interest 1509, such as an apparatus or other piece of equipment. The direction of interest may be indicated by one or more vectors 1514 pointing towards the item of interest 1509 (a vector, as is well-known to those schooled in the art, comprises a length and a direction). The vector length will be sufficient to reach the item of interest 1509.

In some embodiments, a vector 1514 indicating a direction of interest may be used to reference an AVM and the AVM may provide a selection mechanism, such as a drop down menu that includes potential items of interest 1509 along the vector direction. A selection of an item of interest may then be used to determine a length of the vector 1514. A second exemplary vector 1514B is shown in FIG. 15B.

Referring now to FIG. 15C, a movement 1514C of a Smart Device 1501 may be arcuate in nature, so long as movement 1514C results in sufficient distance of movement of one or more position devices 1503, 1505-1508.

Referring now to FIG. 16, methods steps that may be executed in some embodiments of the present invention are presented. At step 1601, as discussed in detail herein, Transceivers may be affixed to reference positions within or proximate to a Structure. In some preferred embodiments, Transceivers are positioned at the perimeter of the Structure and are capable of wireless communication form any point within the Structure.

At step 1602, multiple Sensors are deployed at positions within, or proximate to, the Structure in a manner conducive for the Sensor to operate and generate data descriptive of a condition that is one or both of: within the Structure or proximate to the Structure. The Sensor will also generate a digital signal descriptive of the condition monitored by the Sensor. Deployed may include affixing the Sensor in a fashion that enables Sensor to function in an intended manner. For example, an accelerometer may be fixedly attached to a beam or other structural component in order to accurately experience vibrations emanating from the structural component. A temperature probe may need to be properly positioned to be exposed to ambient temperature conditions. An ammeter may be installed in a position enabling the ammeter to accurately determine an electrical current being conducted by an electrical wire. Other Sensors will likewise be installed within the Structure in a place and manner conducive to generating accurate readings of conditions within the Structure.

At step 1603, positional coordinates may be generated for some or all of the Sensors deployed. As discussed herein, positional coordinates may be based upon triangulation between the Sensor or a Smart Device proximate to the Sensor in wireless communication with two, three or more transceivers generating wireless transmissions from reference points. A physical position of the Sensor may also be determined based upon wireless communication of the Sensor with two or more of the wireless transceivers at the reference positions. As discussed herein the physical position may include an X coordinate and a Y coordinate on an X, Y plane and an elevation based upon a Z coordinate relative to a ground plane or other designated plane of origin.

At step 1604, the Sensor is activated to an operational state and generates the digital data and transmits the data. In some preferred embodiments, the Sensor will transmit the data via a wireless transmission. In other embodiments, the Sensor may transmit the data via an electrical or optical connector.

At step 1605, a first table is generated that includes conditions that would preferably precede deployment of the Structure. For example for a residential Structure, such as a single family home, a multi-family home, a condominium or a townhome; a first table may include building codes. For other Structures, ANSI codes, engineering specifications and other desired attributes may be included. Engineering specifications may include, by way of non-limiting example, an amount of pressure (or weight) a load bearing wall or other Structure may be exposed to. Other specifications may include an amount of vibration (such as vibration caused by wind or physical activity within the Structure may be safely handled by the Structure without causing damage and/or making the Structure unsafe.

At step 1606, the deployed Sensors are operational to measure multiple conditions within the Structure. The measurements are made, for example, via physical operation of the Sensors, which may include applying an operating electrical current to active components within the Sensor. Operation may be based upon a schedule of periodic readings, via remote control, or resulting from manual manipulation of a control on the Sensor.

At step 1607, a time registration indicating when values of one or more conditions were measured is recorded. In some embodiments, the time registrations may be utilized as an index to synchronize multiple Sensor readings. An index may be chosen based upon a time at which a Sensor was activated. The index may be used to create a chronological sequence of Sensor readings. The index may also be used to synchronize multiple Sensor readings and thereby capture a holistic picture of a Structure during a given time period.

At step 1608, a physical location of the Sensor may be determined. A direction of the Sensor from a home position may also be determined via the processes described herein. A distance of Sensor to an item of equipment or an area of interest may be determined. The distance may be determined via methods, such as LIDAR, echo, User entry or other method.

At step 1609 a digital signal is transmitted descriptive of the condition of the Structure. The condition of the Structure may be based upon Vital Conditions of the Structure assessed via the Sensor readings. The transmission may include a logical communication with wireless communications via an industrial scientific and medical (ISM) band wavelength which may include wavelengths between 6.765 MHz and 246 GHz. WiFi is one protocol that may be implemented for wireless communication, as is Bluetooth, ANT, infrared or other protocol. At step 1610, a physical state of the building at the physical position of the Sensor, or an area of the Structure within range of the Sensor, may be correlated with the digital signal descriptive of a condition of the Structure. A condition present in the Structure at an indexed time may be correlated with a physical state of the Structure or a condition present in the Structure at the correlated time.

At step 1611, preferably the location is quantified via an X, Y, and Z coordinate. The Sensor locations and/or areas of the Structure within range of the Sensor, and/or for which the Sensor may take a reading, are associated with location coordinates, such as X, Y and Z coordinates.

At step 1612, a controller may compare measured values of conditions present in the Structure with the conditions precedent to Deployment of the Structure. For example the conditions precedent to deployment may include metrics of safety factors. Metrics of safety factors may include building codes, stress indicators, load capacity (weight), electrical current drawn, water pressure minimum and maximums, humidity, particulate levels in air, presence of mold or spore forms, presences of insects or rodents, etc.

At step 1613, a determination may be made as whether conditions precedent to Deployment of a Structure are present within the Structure at a given point in time. In some embodiments, this determination may be made based upon the measured values of Sensors indicating conditions within the Structure and the time registration.

At step 1614, a transmission may be made that indicates that a Structure has not met a condition precedent to deployment. The transmission may include an alert that the Structure is somehow deficient and that a remedial action may be one or both of necessary and appropriate.

In some embodiments, a condition precedent may be indicative of a value of a Property for use as collateral to an obligation. For example, a property that includes a Structure that is not up to code may not be as valuable as a property that meets all codes and/or engineering specifications. In another non-limiting example, a value designated for a Property that includes a Structure may be monitored in real time, or at least in near real time (with no artificial delay introduced by any aspects of the system and the only delay resulting from timing considerations entailed in normal operation of the system (e.g. transmitting times, processing times; storage times, communication speed and the like).

Referring now to FIG. 16A, additional steps that may be implemented in some embodiments are illustrated within a controller or other apparatus, including for example a computer server. At step 1615, a first table may be generated that includes at least one possible alphanumeric scaled rating to assign to the Structure based upon values pertaining to conditions within the Structure. The alphanumeric rating may be scaled into ranges that apply to a Structure type. At step 1616, a second table may be generated that include measured values of the conditions within the Structure.

At step 1617, an alphanumeric scaled rating from the first table may be associated with each respective measured value. Whereas the first table sets forth a range of values that are associated with a rating, a second table includes actual measured values. At step 1618, in some embodiments, an additional scaled rating that is an aggregate scaled rating may be generated that is based upon an a combination, summation, midpoint, average or aggregation of some or all of the values measured by the Sensors in or proximate to the Structure.

At step 1619, a collateral value may be generated based upon one or an aggregate of multiple alphanumeric values and/or scaled rating.

At step 1620, a value that is translated into an amount to be insured, or an amount to be included in an insurance claim, may be generated based upon values and/or scaled ratings of one or more, or an aggregate of multiple alphanumeric values and/or scaled ratings.

At step 1621 in some embodiments, it may be advantageous to group multiple Structures into a securitized pool based upon one, or an aggregate of multiple scaled ratings.

Referring now to FIGS. 16B and 16C, method steps are specified for measuring initial conditions within a Structure and using the initial conditions measured and subsequent conditions. At step 1622, an initial status of a condition of a Structure is measured with Sensors at locations specified via X, Y, and Z coordinates.

At step 1623, a base condition for a property that includes the Structure may be generated, based, at least in part, upon Sensor measurements. For example, the Sensor ratings may be used to value a property within a range of values applicable to the property.

At step 1624, a value of the property may generate, or a range of values, based at least in part upon the measurements made with the Sensors in or proximate to the Structure. The range of values may be based upon a size, type and location of a property; and a specific value chosen within a range may be attributed to a condition of the property as supported by measurements made by the Sensors in the Structure.

At step 1625, a collateral obligation may be entered or generated based upon a value of the Property that is based upon the Sensor measurements. Unlike previous property appraisal methodologies that may have been based upon a significant amount of subjective value, the present invention provides for automated generation of objective data that is used to generate a valuation of a property. Objective data generated by the present invention may include a size of a property as measured with laser based or other electronic instruments, a location of the property as determined via GPS or other location technology and a condition of a Structure as determined via Sensor measurements of conditions within the Structure at a quantified time and date.

At step 1626, a contractual obligation may also be based upon a value of the property based upon location-specific Sensor measurements. A contractual obligation may include, by way of non-limiting example, a mortgage; a posting of collateral; a value of individual worth or other contract term.

At step 1627, continuing monitoring of a Property and related Structure may be ongoing and based upon objective Sensor measurements.

At step 1628, in some embodiments, one or more threshold status conditions may be generated. For example, a Structure may need to be occupied by humans; a Structure may need to maintain structural integrity of major components; a Structure may need to be maintained within specified humidity ranges to prevent mold; or other condition.

At step 1629, an alert may be generated based upon a condition determined via a measurement subsequent to a measurement used to determine a base condition. Typically, the measurement subsequent to a measurement used to determine a base condition will be performed on a predetermined schedule. The alert may indicate that one or more measurements are outside of a range correlating with a last-determined condition of the Structure. For example, damage to the Structure may have caused a subsequent Sensor measurement to change considerably. Similarly, a remedial action upon some aspect of the Structure may cause a Sensor reading to indicate that a Structure is in better condition following the remedial action.

At step 1630, a transmission via a communications network, such as a cellular network, internet protocol network, radio frequency communication or other broadband-type communication may be used to notify a user of a change in condition that exceeds a predetermined threshold. In some embodiments, an alert may notify a User that conditions have remained the same and act as an affirmation that the Structure is in a same condition as previously transmitted.

At step 1631, in some embodiments, a collateral obligation may change based upon the Sensor measurement. For example, Sensor measurements indicating damage to a Structure, or other deleterious change to the Structure, may lower an amount of credit available based upon the Property (including the Structure being used as collateral). Alternatively, Sensor measurements indicating an improvement in condition of the Structure may increase a value attributed to the collateral and result in an increased line of credit, cancellation of mortgage insurance or other change in obligation.

Referring now to FIG. 16C, method steps for a process similar to the process discussed for collateral are illustrated in steps 1632-1641. However, in step 1636, an insurance obligation is generated instead of a collateral obligation, and in step 1641, a change in the insurance obligation is made based upon measurements made by the Sensors. Insurance may now be based upon ongoing objective data of a condition of a Structure and Property.

Figure 17:
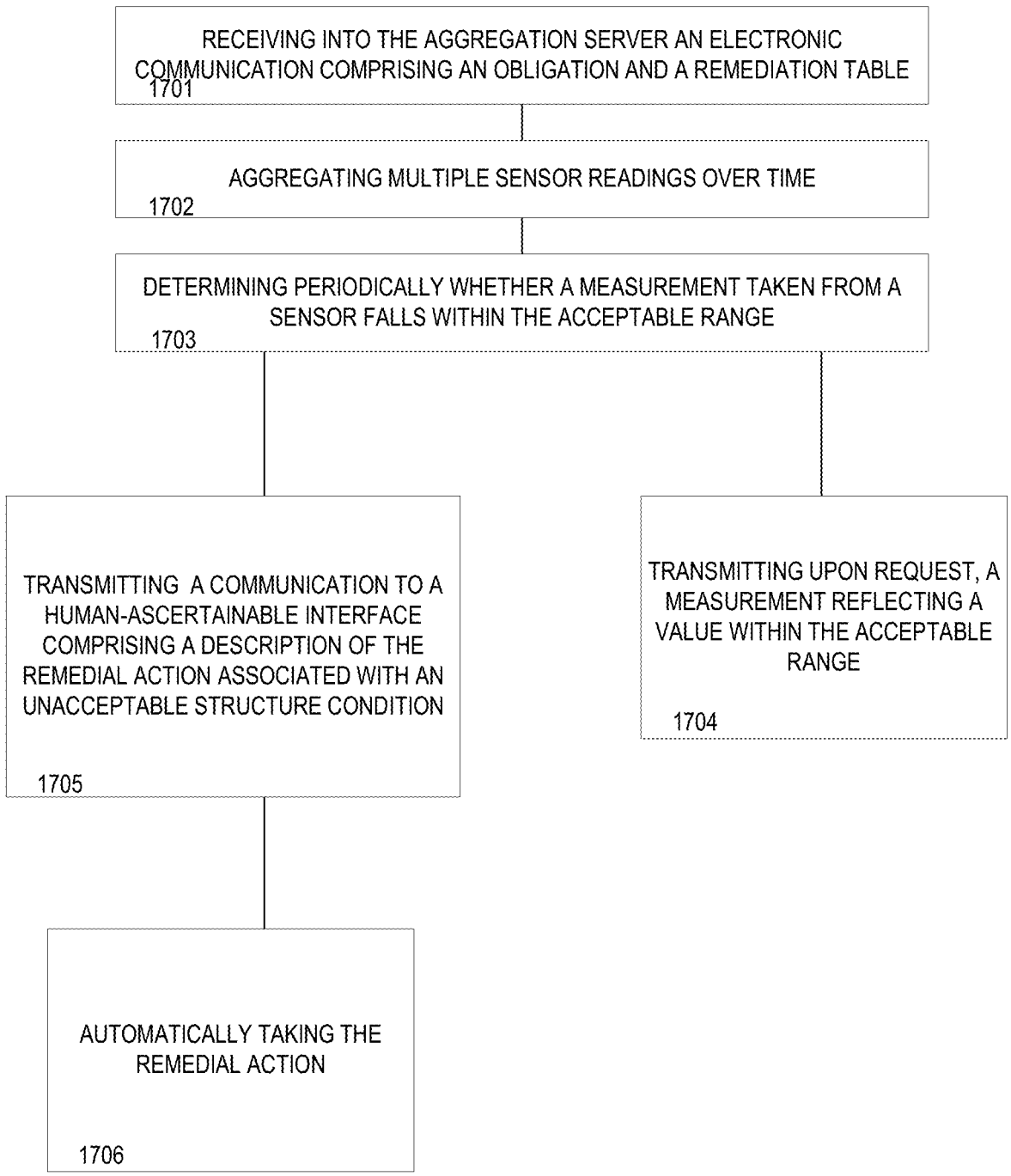
FIG. 17 illustrates an exemplary embodiment of a method for using the SVCM to comply with a given obligation.

Referring now to FIG. 17, an exemplary method for hierarchical actions based upon structural conditions is shown. At 1701, the aggregation server receives an electronic communication comprising an obligation and a remediation table. An obligation could be based off a contract (traditional contract or smart contract) and reflect any obligation surrounding the Property, such as one or more of: maintain a certain loan-to-value ratio; maintain habitable living conditions by reference to pre-defined Vital Conditions; maintain a certain occupancy level; or achieve any objective. One or more Sensors are associated with each obligation. For example, if the obligation is to maintain habitable living conditions, associated Sensors may include one or more of: thermometer, humidity meter, particulate concentration detector (e.g., smoke detector), or a vibration detector. Additionally, the remediation table may include one or more ranges for each Sensor. For example, in some embodiments, if the obligation is to maintain habitable living conditions, then the acceptable range of temperatures as measured from the thermometer Sensor might be 65-80° F. The remediation table also includes one or more prescribed remedial actions to take if the Sensor reading falls outside an acceptable range. For example, if the temperature of the Structure reaches 85° F., then the remedial action may be one or more of: increase the power of the air conditioning unit, shut a door, or shut a window. There may be one or more sets of acceptable ranges, each with its own respective remedial action. For example, if the acceptable temperature range is 65-80° F., a second temperature range may be 50-90° F. Within this temperature range, the Structure may still be able to comply with the obligation if specific steps are taken. Here, closing a door might not restore the temperature to the acceptable range, but replacing the roof might be sufficient. An additional possible Sensor range might reflect that the Structure is incapable of ever complying with its obligations. Continuing with the thermometer example, a third temperature range may be 0-1100° F. (the latter being the average temperature of a house fire). In this case, the Structure may be deemed permanently non-compliant with the obligation.

By way of a second non-limiting example, the obligation may include maintaining a designated loan-to-value ratio for a Structure that is subject to a loan, such as a mortgage. The loan is a given parameter—the lender may be presumed to know at all times how much money is outstanding on the loan. However, the AVM, using the SVCM, provides a unique means for knowing the value of the Structure at any given time. Additionally, an objective may comprise maintaining the Structure at a certain quality rating under a certain objective quality standard. For example, the Uniform Appraisal Dataset assigns a condition rating to a Structure from C1 to C6 (the UAD Condition Ratings), and a quality rating from Q1 to Q6. See, e.g., FANNIE MAE, SELLING GUIDE § B4-1.3-06 (Oct. 2, 2018), https://www.fanniemae.com/content/guide/selling/b4/1.3/06.html. The UAD Condition Ratings are as follows (listed without their accompanying Notes):

C1: The improvements have been very recently constructed and have not previously been occupied. The entire structure and all components are new and the swelling features no physical depreciation.

C2: The improvements feature virtually no deferred maintenance, little or no physical depreciation, and require no repairs. Virtually all building components are new or have been recently repaired, refinished, or rehabilitated. All outdated components and finishes have been updated and/or replaced with components that meet current standards. Dwellings in this category either are almost new or have been recently completely renovated and are similar in condition to new construction.

C3: The improvements are well-maintained and feature limited physical depreciation due to normal wear and tear. Some components, but not every major building component, may be updated or recently rehabilitated. The structure has been well-maintained.

C4: The improvements feature some minor deferred maintenance and physical deterioration due to normal wear and tear. The dwelling has been adequately maintained and requires only minimal repairs to building components/mechanical systems and cosmetic repairs. All major building components have been adequately maintained and are functionally adequate.

C5: The improvements feature obvious deferred maintenance and are in need of some significant repairs. Some building components need repairs, rehabilitation, or updating. The functional utility and overall livability are somewhat diminished due to condition, but the dwelling remains useable and functional as a residence.

C6: The improvements have substantial damage or deferred maintenance with deficiencies or defects that are severe enough to affect the safety, soundness, or structural integrity of the improvements. The improvements are in need of substantial repairs and rehabilitations, including many or most major components.

A contractually imposed obligation may include, for example, that a given Structure always be at a C3 level or higher. A Structure's UAD Condition Rating is, in part, a function of the frequency and necessity of repair of major components. A Structure reaches C4 when it has improvements that feature some "minor deferred maintenance" and requires "only minimal repairs to components/mechanical systems." Id. Accordingly, the AVM, supplemented with SVCM, is a desirable way to ensure a Structure does not reach C4, in at least two ways. First, in some embodiments, the AVM tracks maintenance history of various components. In some embodiments, the AVM may be pre-loaded with a desired repair schedule. For example, experts recommend that the HVAC system be serviced at least once per year. Each of these services may be documented in the AVM through the successful completion of a service call. Conversely, if the AVM does not have a record of maintenance of the HVAC system for three years (as an example), then this lack of maintenance may constitute deferred maintenance sufficient to change the rating of the Structure from C3 to C4.

Second, Sensors may be placed to monitor components, mechanical systems, and electrical systems in accordance with SVCM. For example, Sensors may include voltmeters positioned throughout the Structure's electrical systems. If a voltmeter detects an unexpected, prolonged voltage drop across the voltmeter, the Structure may also be downgraded to C4.

Other factors affecting the appraisal value of a Structure or its UAD Condition Rating that may be reflected in the AVM include, without limitation: heat and air throughout the Structure, structural construction materials and updates, neighborhood value (where other Structures in a neighborhood are also covered by an AVM and SVCM), structural soundness and sealing, and appliance maintenance.

At step 1702, multiple Sensor readings are aggregated at the aggregation server over time. These may be multiple readings from one Sensor, a single reading from multiple Sensors, or multiple readings from multiple Sensors. This may serve to establish a pattern of measurements pertaining to the objective. Additionally, in some embodiments, an entity may have access to aggregation data for a plurality of Structures. Such data can be additionally combined to usefully evaluate parameters and desired ranges. For example, upon the purchase of a Structure, an appraisal or a construction of an AVM may indicate that the optimal temperature for the Structure is 74° F. However, if 99 other similar Structures maintain an average temperature of 71° F., then the acceptable range may be modified accordingly.

At step 1703, periodically the aggregation server may determine whether a measurement taken from a Sensor falls within the acceptable range. Periodically may mean daily, weekly, monthly, yearly, or any other interval. As discussed at step 1701, multiple Sensor ranges may be considered. At steps 1704 and 1705, these determinations may be sent to a human-ascertainable interface. At step 1704, a determination may be requested from the human-ascertainable interface, and if the Sensor readings fall within an acceptable range, the aggregation server may provide confirmation of same.

At step 1705, however, if the determination is that the measurements do not fall within an acceptable range, the remediation table is consulted to determine the appropriate remediation action. As discussed at step 1701, the remediation action may comprise changing the conditions of the Structure. In some embodiments, the AVM may be consulted to determine the most effective remediation measure. In some embodiments, the effectiveness of a remediation measure is determined with reference to one or more of: the speed of the remediation, the cost of the remediation, or the long-term effect of the remediation.

At step 1706, in some embodiments, the aggregation server is in logical connection with the AVM, home automation tools, or other automated apparatuses that can implement the associated remedial action. For example, if the temperature measurement falls outside the acceptable range, in these embodiments the aggregation server can communicate with an automated thermostat to adjust the temperature accordingly (e.g., by increasing power to the air condition or heater). In some embodiments, the remediation table comprises a hierarchical listing of actions to take to fall into compliance with an obligation. For example, the contract or other communication specifying the obligation may enumerate 20 conditions to monitor, such as yearly HVAC maintenance, airflow throughout the Structure, and insulation quality in each room of the Structure. If the AVM indicates that a predetermined threshold number of these conditions are not met, then the aggregation server may take remedial actions in accordance with a set of predefined rules. These rules may be prioritized by, for example, price or efficacy in remediating the undesired condition. Based on the previous example, the aggregation server may determine that the HVAC has not been serviced within the last three years; a crack in the wall exists in the living room; and the kitchen is absorbing outside heat at a greater rate than anticipated upon appraisal or at the time of the obligation. If the remedial action rules are prioritized by price, then the aggregation server may determine that the least expensive remedial action is requesting service to the HVAC—and the aggregation server may automatically order such service.

Particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order show, or sequential order, to achieve desirable results. In certain implementations, multitasking and parallel processing may be advantageous. Nevertheless, it will be understood that various modifications may be made without departing from the spirit and scope of the claimed invention.

What is claimed is:

1. A method of monitoring a stated condition of a structure, the method comprising the steps of:
   a) affixing two or more wireless transceivers to reference positions within the structure;
   b) securing at least a first sensor to a first sensor position within the structure, said first sensor capable of wireless communication with the two or more wireless transceivers, said first sensor selected from a group consisting of a thermal sensor, a vibration sensor, a pressure sensor and a humidity sensor;
   c) wirelessly communicating between the two or more wireless transceivers and the first sensor to generate a data set;
   d) generating a set of positional coordinates for the first sensor based upon the data set, the positional coordinates comprising X, Y and Z coordinates;
   e) generating a first table comprising conditions present in the structure precedent to deployment of the structure;
   f) with the first sensor[s], transducing a physical condition in the structure to a digital representation;
   g) recording a time registration in a controller, the time registration indicating when the physical condition within the structure was transduced into a digital representation;
   h) operating the controller to compare the digital representation of the physical conditions within the structure with a condition present in the structure precedent to deployment of the structure; and
   i) operating the controller to determine that the condition precedent to deployment of the structure is present within the structure at a given point in time, based upon the transducing of the physical condition in the structure to a digital representation of the physical and the time registration;
   j) associating the X, Y and Z positional coordinates with a feature in a virtual model of the structure, wherein the positional coordinates designate a position relative to an agent supporting a wireless position device,
   k) receiving into a controller respective transmissions from the first sensor and from multiple disparate sensors each transmission comprising a digital value of a respective physical condition transduced by the first sensor and the multiple disparate sensors;
   l) determining whether conditions precedent to deployment are present in the structure based upon a comparison of the values of the multiple conditions measured within the structure and the conditions present in the structure precedent to deployment of the structure; and
   m) transmitting location coordinates of any of the first sensor and the multiple disparate sensors measuring a condition within the structure that has not met a condition precedent to deployment included in the first table.

2. The method of claim 1 additionally comprising generating a second table comprising a remedial action that may be taken to address a condition within the structure.

3. The method of claim 2 additionally comprising the step of transmitting why the condition within the structure compares with a condition precedent to deployment included in the table.

4. The method of claim 2 wherein the first Table comprises building codes.

5. The method of claim 2 wherein the first Table comprises ANSI standards.

6. The method of claim 2 wherein the first Table comprises engineering specifications comprising an amount of pressure.

7. The method of claim 2 wherein the first Table comprises engineering specifications comprising an amount of heat.

8. The method of claim 2 wherein the first Table comprises engineering specifications comprising an amount of vibration.

9. The method of claim 2 wherein the first Table comprises engineering specifications comprising an amount of movement.

10. The method of claim 2 wherein the first Table comprises variables of an appraisal report.

11. A method of determining a physical state of a structure, the method comprising the steps of:
    a) generating with a controller a first table comprising values pertaining to conditions within the structure and an alphanumeric scaled rating for different ranges of the values pertaining to conditions within the structure;
    b) generating in the controller a second table comprising measured values of the conditions within the structure, wherein the measured values are generated via the steps of:
    i) affixing multiple wireless transceivers to reference positions within the structure;
    ii) securing at least a first sensor to a position within the structure, said first sensor selected from a group consisting of a thermal sensor, a vibration sensor, a pressure sensor and a humidity sensor;
    iii) wirelessly communicating between the first sensor and the multiple wireless transceivers to generate a data set;
    iii) with the controller, generating a set of positional coordinates for the first sensor based upon the data set;
    iv) with the first sensor, generating measured values of a condition within the structure via transducing of a first sensor state to a digital value;
    v) recording a time registration in the controller indicating when each of the measured values of the condition within the structure was measured;
    c) with the controller, associating a respective alphanumeric scaled rating from the first table with each of the measured values of the condition within the structure; and
    d) with the controller, generating an aggregate alphanumeric scaled rating for the structure based upon a weighted combining of the respective alphanumeric scaled ratings associated with each measured value.

12. The method of claim 11 additionally comprising the step of generating a collateral value based upon the aggregate alphanumeric scaled rating.

13. The method of claim 11 additionally comprising the step of generating a value of an insurance amount based upon the aggregate alphanumeric scaled rating.

14. The method of claim 11 additionally comprising the step of including the structure in a securitized pool based upon the aggregate alphanumeric scaled rating.

* * * * *